United States Patent
Hanaki et al.

(10) Patent No.: US 6,452,312 B1
(45) Date of Patent: Sep. 17, 2002

(54) PIEZOELECTRIC LAMINATE BODY

(75) Inventors: Kenichi Hanaki; Eturo Yasuda; Naochika Nunogaki, all of Nishio (JP)

(73) Assignees: Denso Corporation, Kariya; Nippon Soken, Inc., Nishio, both of (JP)

( * ) Notice: Subject to any disclaimer, the term of this patent is extended or adjusted under 35 U.S.C. 154(b) by 0 days.

(21) Appl. No.: 09/641,265

(22) Filed: Aug. 17, 2000

Related U.S. Application Data

(63) Continuation of application No. PCT/JP99/07122, filed on Dec. 17, 1999.

(30) Foreign Application Priority Data

Dec. 18, 1998 (JP) .......................................... 10-361338

(51) Int. Cl.⁷ .............................................. H01L 41/04
(52) U.S. Cl. ........................ 310/364; 310/328; 310/366
(58) Field of Search ................................. 310/364, 358, 310/366, 328; H03H 41/083

(56) References Cited

U.S. PATENT DOCUMENTS

| | | | |
|---|---|---|---|
| 4,523,121 A | | 6/1985 | Takahashi et al. |
| 4,845,399 A | * | 7/1989 | Yasuda ...................... 310/358 |
| 5,089,739 A | * | 2/1992 | Takahashi et al. .......... 310/328 |
| 5,607,535 A | | 3/1997 | Tsukada et al. |
| 5,645,753 A | | 7/1997 | Fukuoka et al. |

FOREIGN PATENT DOCUMENTS

| | | | | |
|---|---|---|---|---|
| JP | 58-196075 | | 11/1983 | |
| JP | 0208977 A | * | 7/1988 | ......... H03H/41/083 |
| JP | 2-028977 | | 1/1990 | |
| JP | 2-203579 | | 8/1990 | |
| JP | 07135348 | * | 6/1993 | ......... H03H/41/083 |
| JP | 7-131084 | | 5/1995 | |
| JP | 7-135348 | | 5/1995 | |
| JP | 8-167746 | | 6/1996 | |
| JP | 9-148639 | | 6/1997 | |
| JP | 9-148640 | | 6/1997 | |
| JP | 9-331685 | | 12/1997 | |
| JP | 10-284763 | | 10/1998 | |

OTHER PUBLICATIONS

Patent Abstracts of Japan, Jun. 1997, JP 9153649.
Takahashi, S. et al., "Micro Piezoelectric Ceramic Actuator", published on May 17, 1983.

* cited by examiner

*Primary Examiner*—Nestor Ramirez
*Assistant Examiner*—Karen Addison
(74) *Attorney, Agent, or Firm*—Pillsbury Winthrop LLP

(57) ABSTRACT

This invention provides a piezoelectric laminate body that limits, to a minimum, the difference of the quantity of displacement occurring in the boundary between an electrode center portion of a unit laminate body and its alternate electrode portions upon the application of an electric field, by improving a laminate structure of alternate electrode structure type unit laminate bodies. Each piezoelectric device sheet 11a of the unit laminate bodies 10a constituting this piezoelectric laminate body integrally includes a device sheet portion 11c and each lug portion 11d, 11f, and is made of a piezoelectric ceramic material. An electrode layer 11b is so formed as to extend to the surface of the device sheet portion 11c and the surface of the lug portion 11e. Among the laminate sheets 11, the electrode layer 11b of a lower laminate sheet 11 overlaps with the back of an upper laminate sheet 11. Each unit laminate body 10a is laminated serially in such a fashion that the positions of the uppermost unit laminate body to the lowermost unit laminate body 10a are deviated at 90 degrees in a direction orthogonal to the laminating direction (FIG. 3).

4 Claims, 42 Drawing Sheets

Fig.10
(a)
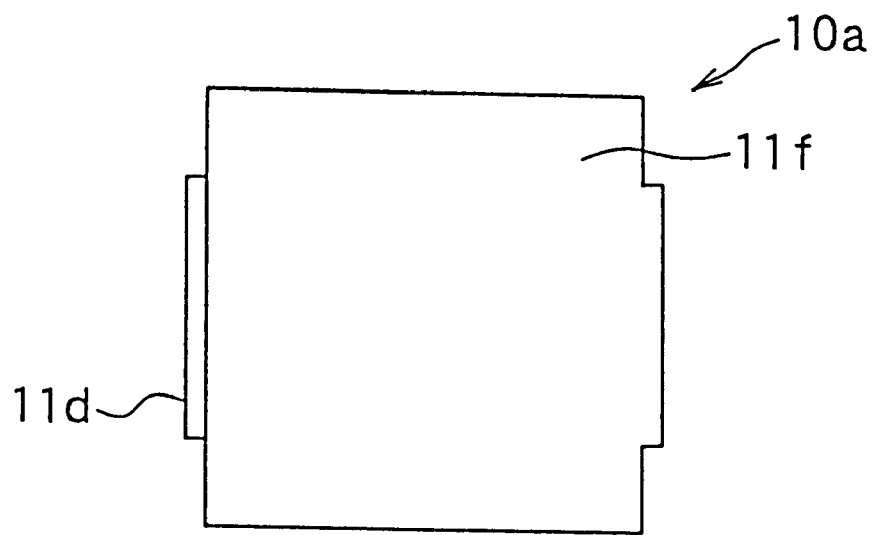
(b)
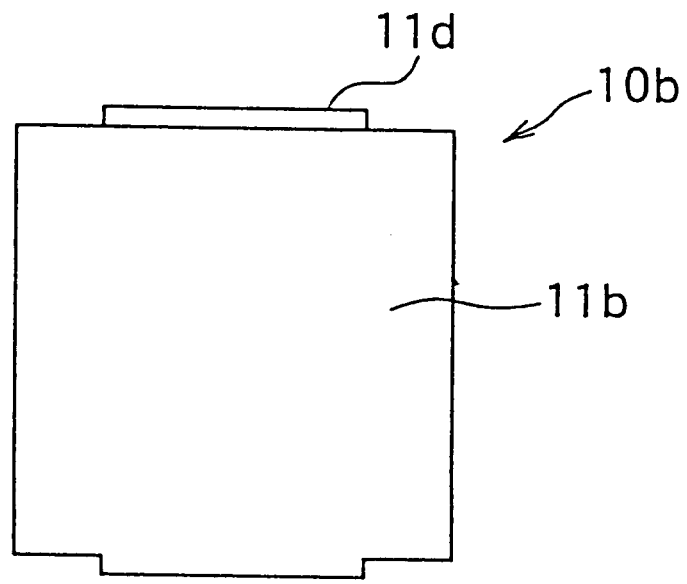

Fig.13
(a)
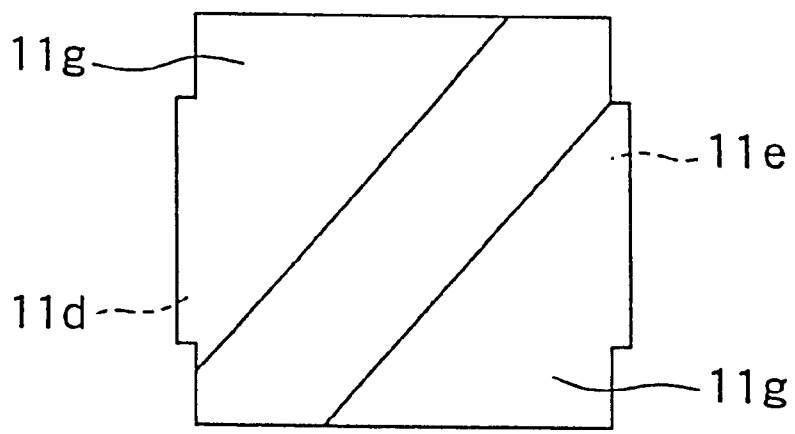
(b)
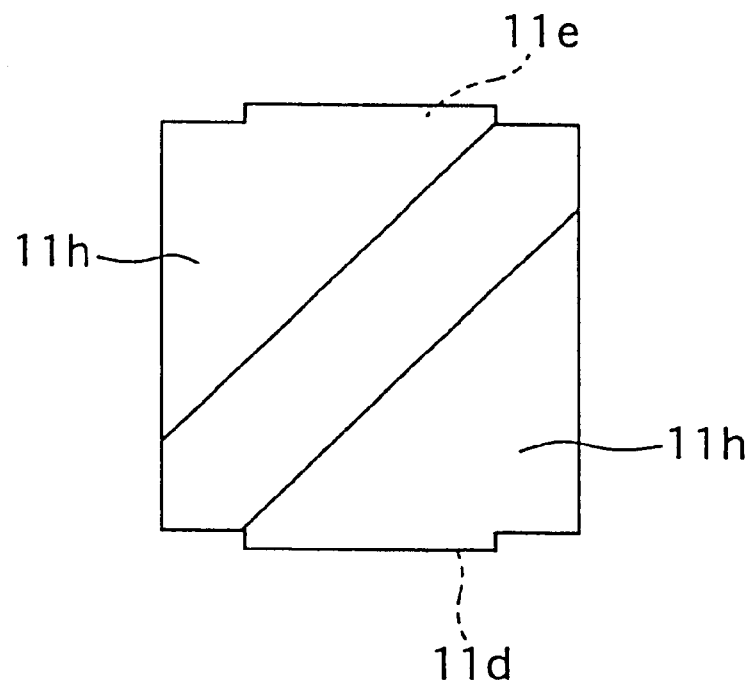

Fig. 26
(a) (b)
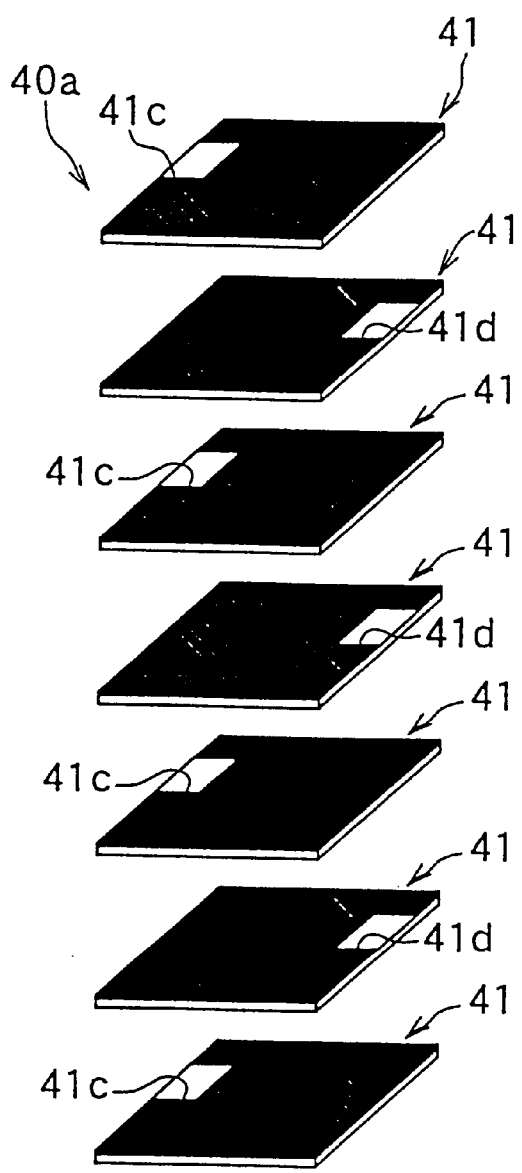
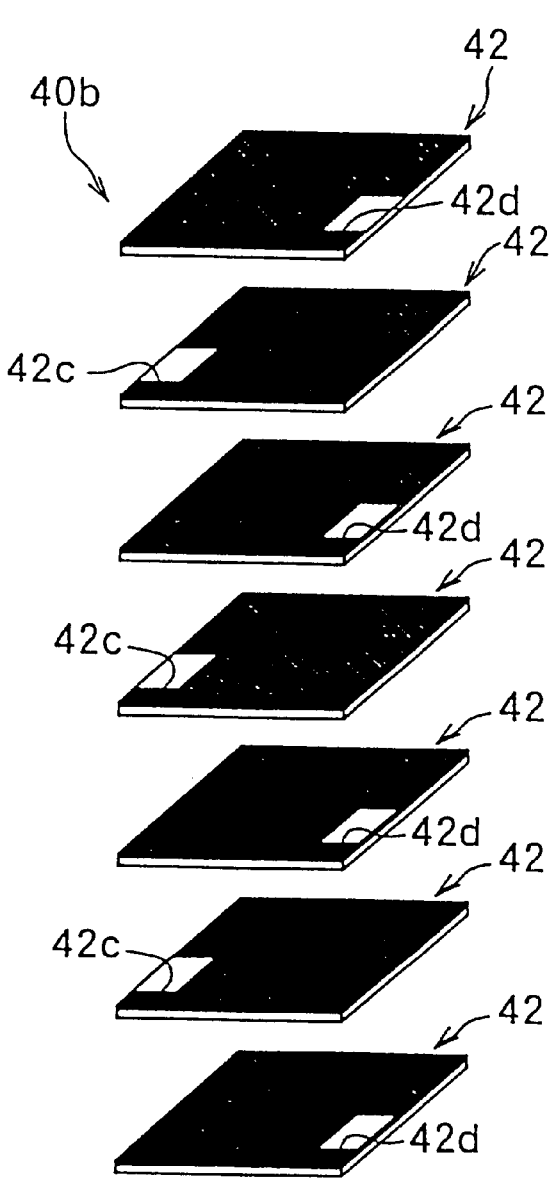

Fig. 29
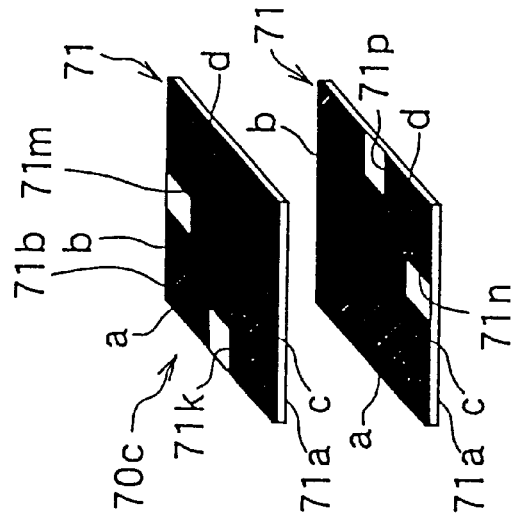
(c)
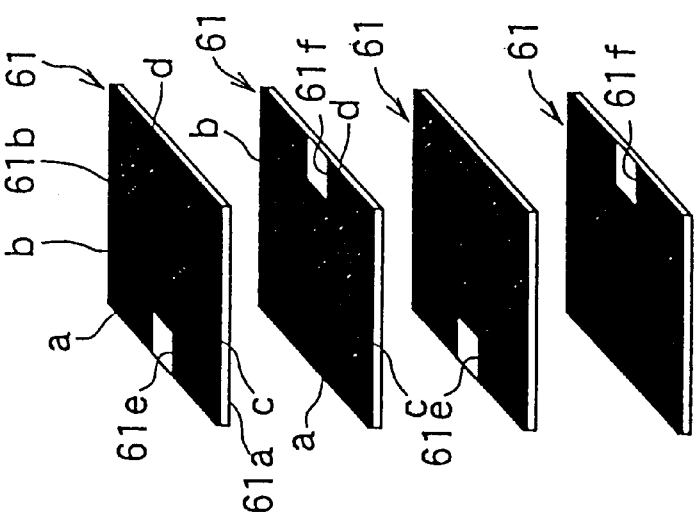
(b)
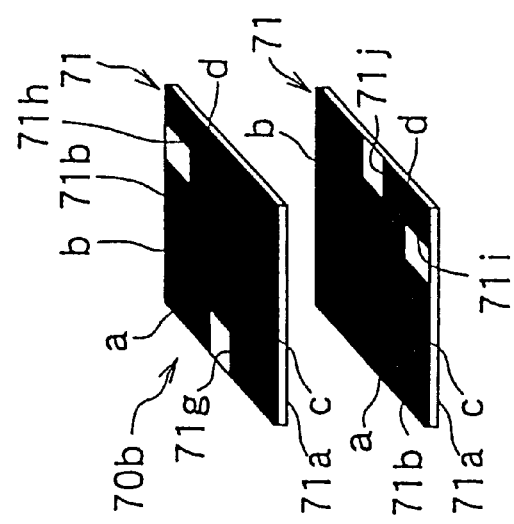
(a)

Prior Art

PIEZOELECTRIC LAMINATE BODY

RELATED APPLICATION

This is a continuation application of International application No. PCT/JP99/07122 filed on Dec. 17, 1999 for PIEZOELECTRIC LAMINATE BODY.

TECHNICAL FIELD

This invention relates to a piezoelectric laminate body. More particularly, this invention relates to a piezoelectric laminate body that is produced by laminating unit laminate bodies each comprising piezoelectric ceramic, or the like, and is suitable for a piezoelectric actuator for driving a fuel injection valve of an engine, a controlling valve of a mass flow controller, and so forth.

BACKGROUND ART

Piezoelectric devices have gained a wide application in various fields in recent years. When an electric field is applied to the piezoelectric device, a distortion proportional to the electric field develops in the piezoelectric device, generating thereby a strain (displacement). When a force is applied and the piezoelectric device is caused to undergo distortion, on the contrary, the electric properties of the piezoelectric device change in proportion to the displacement. Sheet-like piezoelectric devices having such properties are laminated to give a piezoelectric laminate body, which can be utilized as an actuator in various applications.

As described above, various displacements occur when the electric field is applied to the piezoelectric laminate body as described above. However, the quantity of displacement varies structurally depending on position, and cracks are therefore likely to occur in the piezoelectric laminate body. To prevent such cracks in the piezoelectric laminate body, various structures have been proposed in the past. A typical piezoelectric laminate body of this kind is described in, for example, Takahashi Sadayuki et al. "Micro Piezoelectric Ceramic Actuator", the transaction of the Society of Electronic Communication, pp. 55–59, May 17, 1983. The problems of the prior art technologies will be described later.

DISCLOSURE OF THE INVENTION

It is an object of the present invention to provide a piezoelectric laminate body that restricts to a minimum the difference in the quantity of displacement of a boundary between an electrode center portion of a unit laminate body and alternate electrode portions upon the application of an electric field, by improving a laminate structure of a piezoelectric laminate body.

According to the first aspect of the present invention, there is provided a piezoelectric laminate body produced by serially laminating a plurality of alternate electrode structure type laminate bodies each including a center electrode portion as a driving portion and alternate electrode portions as non-driving portions disposed on both sides of the center electrode portion, wherein the unit laminate body on the upper side, among a plurality of unit laminate bodies, is disposed at the both-side alternate electrode portions thereof in the spaced-apart relation with the both-side alternate electrode portions of the unit laminate body just below the upper unit laminate body.

According to the second aspect of the present invention, there is provided a piezoelectric laminate body produced by serially laminating a plurality of unit laminate bodies, wherein each of the unit laminate bodies is constituted as an alternate, electrode structure type unit laminate body including a center electrode portion as a driving unit and alternate electrode portions as non-driving portions disposed on both sides of the center electrode portion; and the unit laminate body on the upper side, among a plurality of unit laminate bodies, is serially laminated at the center electrode portion thereof in such a fashion that it is deviated, at both-side alternate electrode portions thereof, by a predetermined angle with respect to both-side alternate electrode portions of both-side alternate electrode portions of the unit laminate body just below the upper unit laminate body in a laminating direction while it is separated from both-side alternate electrode portions of the lower unit laminate body.

According to the third aspect of the present invention, there is provided a piezoelectric laminate body produced by serially laminating a plurality of unit laminate bodies, wherein each of the unit laminate bodies is constituted as an alternate electrode structure type unit laminate body having a center electrode portion as a driving portion and alternate electrode portions as non-driving portions, disposed on the outer peripheral side of the center electrode portion; and each of a plurality of unit laminate bodies on the upper side is laminated in such a fashion as to deviate at the alternate electrode portion thereof from the alternate electrode portion of the unit laminate body just below the upper unit laminate body in a laminating direction.

According to the fourth aspect of the present invention, there is provided a piezoelectric laminate body produced by serially and alternately laminating unit laminate bodies and inter-connection laminate bodies, wherein each of the unit laminate bodies includes alternate electrode portions as non-driving portions on an outer peripheral side of a center electrode portion, as a driving portion, and constituted, with the inter-connection laminate body adjacent thereto, as an alternate electrode structure type unit laminate body, and the unit laminate body on the upper side and the adjacent inter-connection laminate body thereof are laminated in such a fashion as to separate and deviate at the alternate electrode portion thereof from the alternate electrode portion of the unit laminate body and the adjacent inter-connection laminate body just below the upper unit laminate body in a laminating direction.

BRIEF DESCRIPTION OF DRAWINGS

FIG. 10(a) is a bottom view showing the state where an electrode layer is printed onto the lowermost laminate sheet the upper unit laminate body in the second embodiment, and FIG. 10(*b*) is a top view showing the state where the electrode layer is printed onto the uppermost laminate sheet of the unit laminate body just below the upper unit laminate body.

FIG. 13(*a*) is a bottom view showing the state where both electrode layers are formed into a triangular shape on the back of the lowermost laminate sheet of the upper unit laminate body in the third embodiment, and FIG. 13(*b*) is a top view showing the state where both electrode layers are formed into a triangular shape on the surface of the uppermost laminate sheet of the lower unit laminate body in the third embodiment.

FIGS. 26(*a*) and 26(*b*) are exploded perspective views of both unit laminate bodies in the ninth embodiment.

FIGS. 29(*a*), 29(*b*) and 29(*c*) are exploded perspective views showing the inter-connection laminate body, the unit laminate body and the inter-connection laminate body in the tenth embodiment.

BEST MODE FOR CARRYING OUT THE INVENTION

Figure 1:
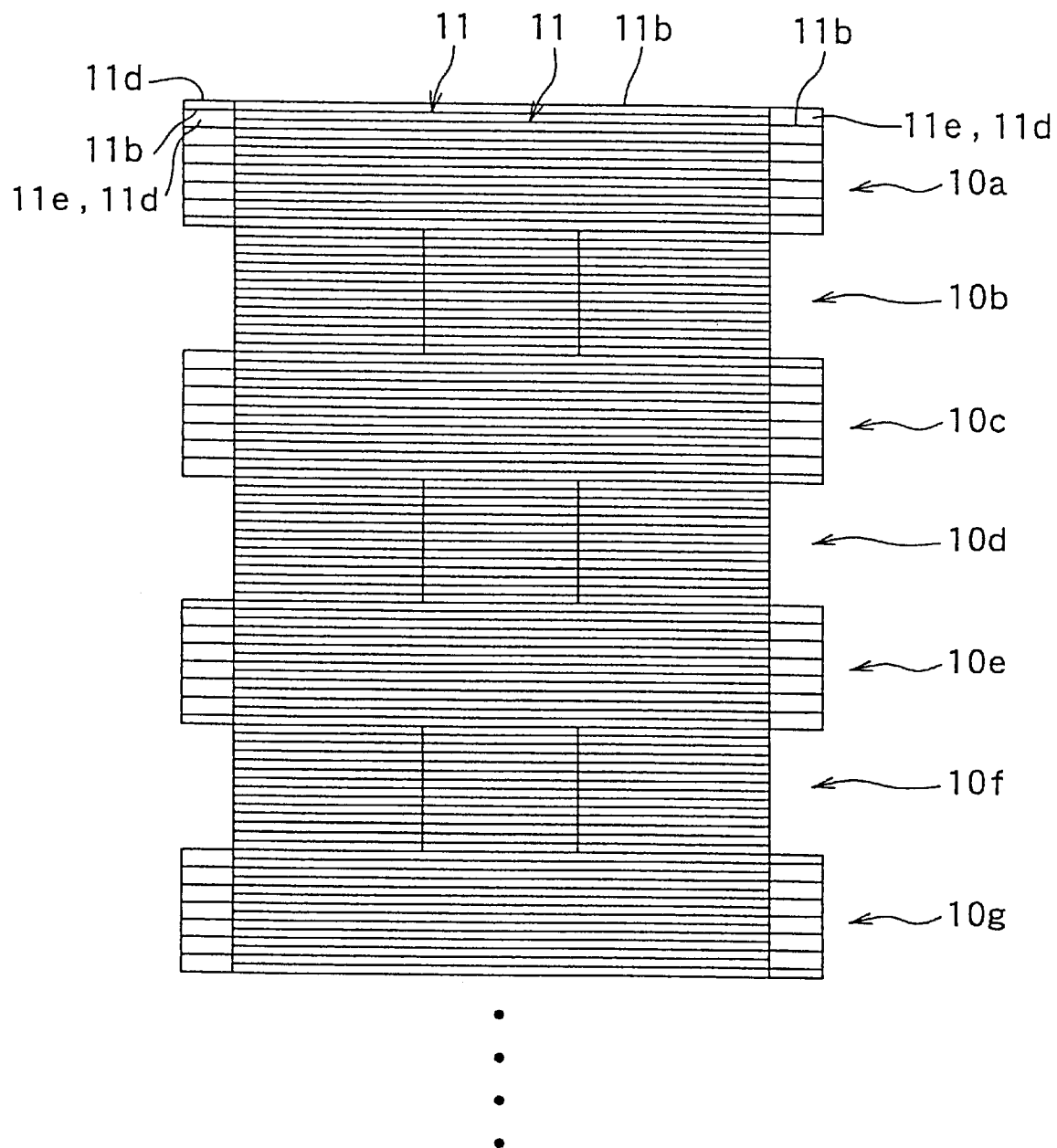
FIG. 1 is a side view showing a piezoelectric laminate body according to the first embodiment of the present invention.
Figure 2:
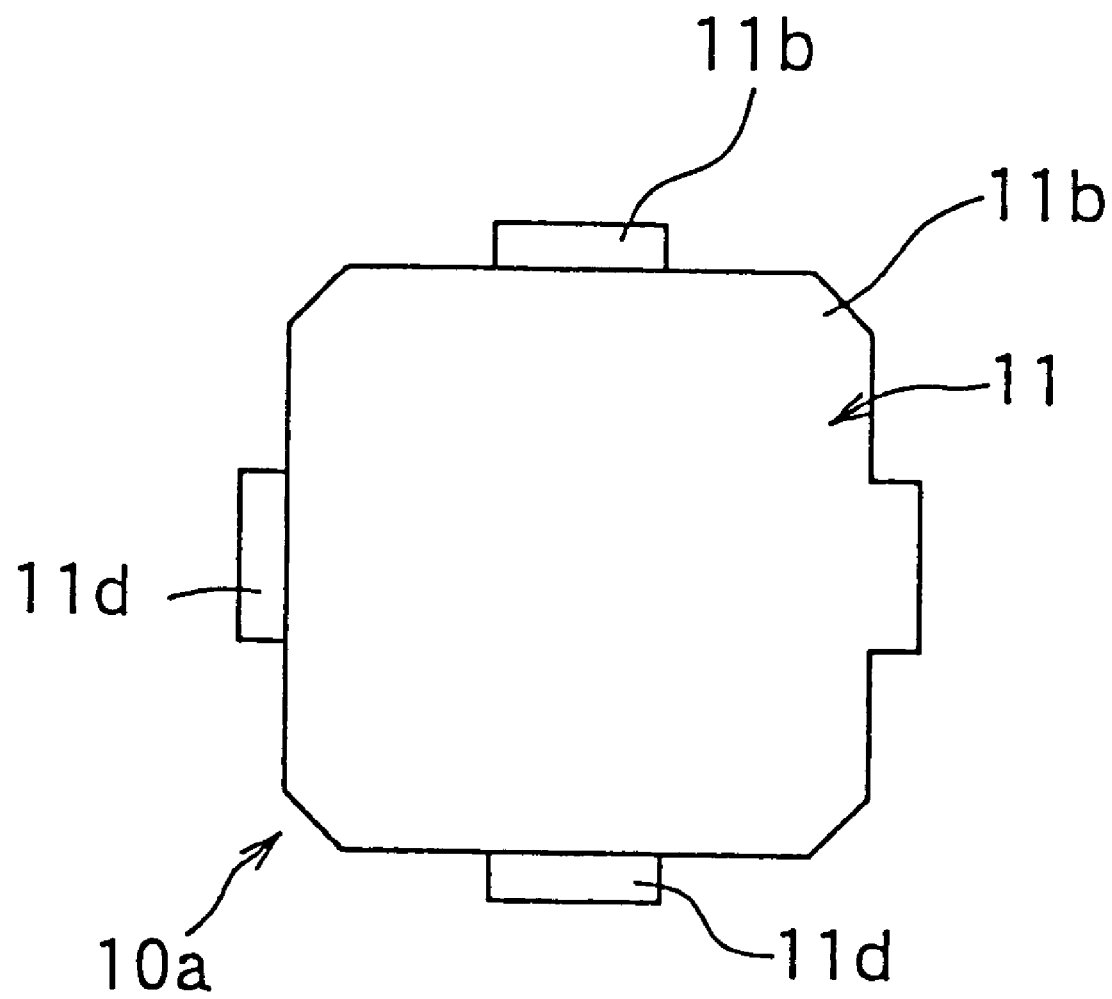
FIG. 2 is a plan view of the piezoelectric laminate body shown in FIG. 1.

The construction and the problems of the article by Takahashi Sadayuki et al., "Micro Piezoelectric Ceramic Actuator", pp 55–59 of the transactions of the Society of Electronic Communications, May 17, 1983 will be described as an example of the piezoelectric laminate body of the prior art, with reference to the drawing, before preferred embodiments of the present invention are explained.

Figure 44:
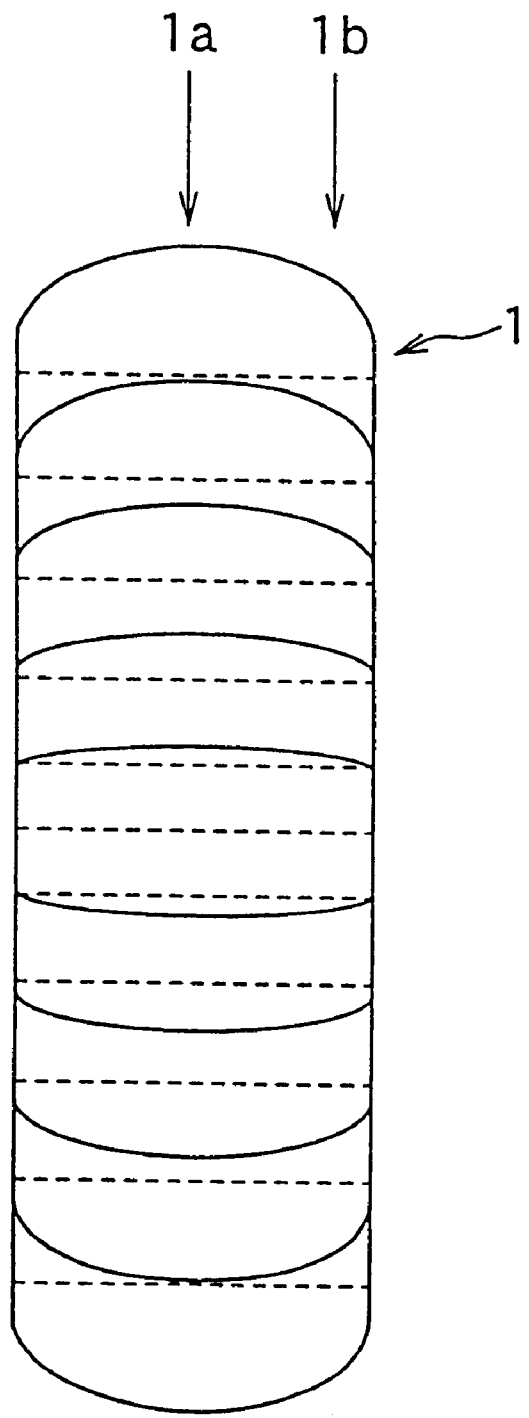
FIG. 44 is a side view showing a piezoelectric laminate body according to the prior art.
Figure 45:
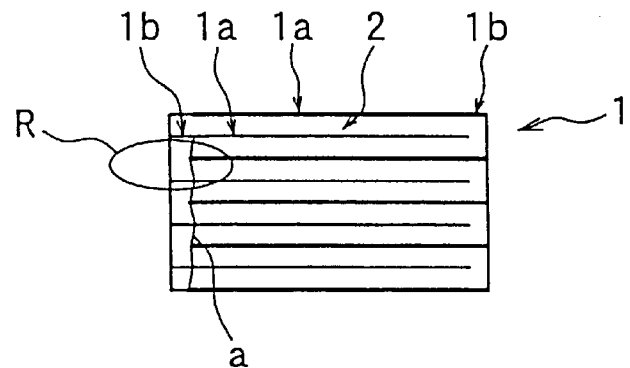
FIG. 45 is a side view showing one unit laminate body of the piezoelectric laminate body shown in FIG. 44.
Figure 46:
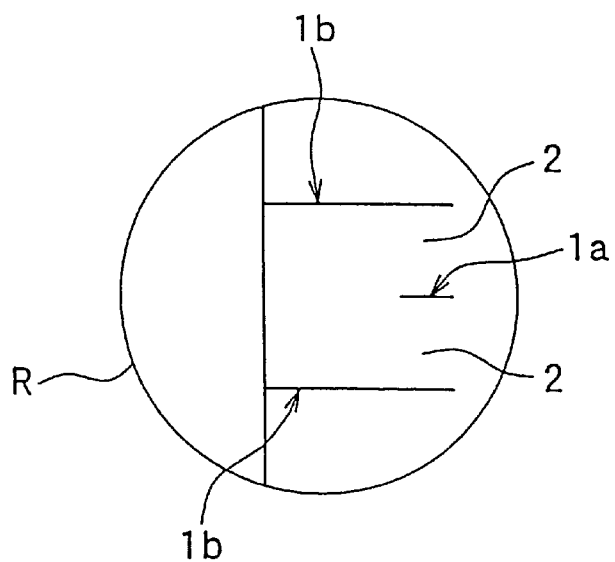
FIG. 46 is an enlarged side view of the portion encompassed by an enveloping line represented by symbol R in FIG. 45.

FIG. 44 is a side view of a piezoelectric laminate body according to the prior art. FIG. 45 is a side view of one unit laminate body in the piezoelectric laminate body shown in FIG. 44. FIG. 46 is an enlarged side view of the portion encompassed by an enveloping line represented by symbol R in FIG. 45.

The piezoelectric laminate body shown in FIG. 44 is constituted as a plurality of unit laminate bodies 1 shown in FIG. 45 are laminated.

In the piezoelectric laminate body described above, the unit laminate body 1 is an alternate electrode structure type unit laminate body that is formed by laminating a plurality of sheet-like piezoelectric elements 2 made of piezoelectric ceramic, as shown in FIG. 45. Therefore, a center electrode portion 1a of the unit laminate body is formed in the center region of each piezoelectric element 2. On the other hand, alternate electrode portions 1b of the unit laminate body 1 are formed for every other piezoelectric elements 2 in the right and left outer peripheral edge regions of each piezoelectric element 2 (see FIGS. 45 and 46).

When an electric field is applied to the piezoelectric laminate body from both end portions in the vertical direction in FIG. 44, each unit laminate body 1 undergoes displacement from the state represented by broken lines in FIG. 44 to the state represented by solid lines in the same drawing. In this case, the electric field is uniformly applied to the center electrode portion 1a but is not applied to the alternate electrode portion 1b.

Since the quantity of displacement of the center electrode portion 1a becomes greater than that of the alternate electrode portion 1b, the difference of the quantity of displacement becomes greater at the boundary portions between the center electrode portion 1a and the alternate electrode portion 1b with the result that cracks (represented by symbol a in FIG. 45) develop continuously in each piezoelectric device 2. Such a problem is all the more remarkable when the number of the unit laminate bodies that are laminated becomes greater.

To cope with the problems, it may be possible to employ a full face electrode structure type unit laminate body in place of the alternate electrode type unit laminate body as introduced on the corresponding pages of the transactions of the Society of Electronic Communications described above. When the full-face electrode structure type unit laminate bodies are laminated, an insulating material must be applied to every other electrode end portion of each piezoelectric element of these unit laminate bodies.

Consequently, the increase in the number of process steps invites an increase in the production cost. Moreover, since the adhesion strength of the insulating material to the electrode end portion of the piezoelectric element is likely to become insufficient, the reliability of the insulation characteristic drops.

Furthermore, the sheet thickness of the piezoelectric element must be decreased with an increase of the number of laminations of the unit laminate bodies. Therefore, the adhesion area of the insulating material to the electrode end portion of the piezoelectric element decreases, and the insulating material cannot be applied easily to every other electrode end portion of each piezoelectric element.

In order to solve such problems, it is therefore an object of the present invention to provide a piezoelectric laminate body that restricts to a minimum the difference of the quantity of displacement occurring at the boundary between an electrode center portion and alternate electrode portions of a unit electrode body upon the application of an electric field, by contriving the laminate structure of alternate electrode structure type unit laminate bodies.

To solve the problems described above, a piezoelectric laminate body according to an embodiment of the invention is constituted as a plurality of alternate electrode structure type unit laminate bodies (10a to 10g, 10A, 10B) each including a center electrode portion (A) as a driving portion and alternate electrode portions (B) as a non-driving portion disposed on both sides of the center electrode portion (A) are serially laminated with one another.

In this piezoelectric laminate body, an upper unit laminate body among a plurality of unit laminate bodies is positioned at both-side electrode portions thereof in the spaced-apart relation with both-side alternate electrode portions of the unit laminate body just below the upper unit laminate body.

Therefore, both-side alternate electrode portions are not positioned continuously in the laminating direction from the uppermost unit laminate body to the lowermost unit laminate body among a plurality of unit laminate bodies.

When the electric field is applied to this piezoelectric laminate body, a difference in the quantity of displacement may occur at the boundary between the alternate electrode portions and the center electrode portion of each unit laminate body, but this difference of the quantity of displacement remains at a sufficiently small value that is the value inherent to each unit laminate body. As a result, cracks do not develop in the boundary between the alternate electrode portions and the center electrode portion in each unit laminate body.

In the first-mentioned embodiment of the invention, one may provide a piezoelectric laminate body wherein a partition member (20) is disposed between an upper unit laminate body and a unit laminate body just below the upper unit laminate body in such a fashion that both-side electrode portion of the upper unit laminate body are positioned in the spaced-apart relation with both-side alternate electrode portions of the lower unit laminate body just below the upper laminate body. This embodiment of the invention, too, can accomplish the same mode of operation as that of the first-mentioned embodiment of the invention.

Incidentally, the construction in which the upper unit laminate body is positioned at both-side alternate electrode portion thereof in the spaced apart relation with both-side alternate electrode portion of the unit laminate body just below need not be limited to the partition member, but may be accomplished by other suitable means such as the formation of notches between the lowermost portion of both-alternate electrode portions of the upper unit laminate body and the uppermost portion of both-side electrode portions of the unit laminate body just below the upper unit laminate body.

According to a second embodiment of the invention, the piezoelectric laminate body is produced when a plurality of unit laminate bodies (10a to 10g, 10A, 10B) is serially laminated.

In this piezoelectric laminate body, each unit laminate body is constituted as an alternate electrode structure type unit laminate body equipped with a center electrode portion (A) as a driving portion and alternate electrode portions (B) as a non-driving portion on both sides of the center electrode portion. Each upper unit laminate body among a plurality of unit laminate bodies is laminated at its center electrode portion in such a fashion that it is positioned at its both-side alternate electrode portions in the spaced-apart relation from both-side alternate electrode portions of a unit laminate body just below it, and is deviated by a predetermined angle from both-side alternate electrode portions of the lower unit laminate body in the laminating direction.

Consequently, both-side alternate electrode portions of each unit laminate body are not positioned continuously in the laminating direction from the unit laminate body at the uppermost position to the unit laminate body at the lowermost position among a plurality of unit laminate bodies. As a result, this construction can accomplish substantially the same mode of operation as that of the first-mentioned embodiment of the invention.

In the second embodiment of the invention, the predetermined angle may be 90 degrees.

In the second embodiment of the invention, an electrode layer (11f) may be interposed between the lowermost surface of the center electrode portion and one-side alternate electrode portion of an upper unit laminate body and the uppermost surface of the center electrode portion and other-side alternate electrode portion of the unit laminate body just below the upper unit laminate body in such a manner as to electrically connect both one-side and other-side alternate electrode portions to one another other through both center electrode portions.

In the piezoelectric laminate body described above, a one-side alternate electrode portion of an upper unit laminate body is electrically connected to the other-side alternate electrode portion of a unit laminate body below the upper unit laminate body. Therefore, the one-side and other-side alternate electrode portions can be taken out by using a common cable, and the number of wires can be reduced by one in comparison with the case where each of the one-side and other-side alternate electrode portions is taken out by each separate wire.

In the second embodiment of the invention, a one-side electrode layer (11h) may be interposed between the lowermost surface portion of both the center electrode portion of an upper unit laminate body in the proximity of one-side alternate electrode portion and the one-side electrode portion and the uppermost surfaces of both of the portion of the center electrode portion of a unit laminate body just below the upper unit laminate body in the proximity of the other-side alternate electrode portion and the other-side alternately-electrode portion, and an other-side electrode layer (11h) may be interposed between the lowermost surface of both of the portion of the center electrode portion of the upper unit laminate body in the proximity of the other-side alternate electrode portion and the other-side alternate electrode portion, and the uppermost surface of both of the portion of the center electrode portion of a unit laminate body just below the upper unit laminate body in the proximity of the one-side alternate electrode portion and this one-side alternately electrode portion.

In the piezoelectric laminate body, therefore, the one-side alternate electrode portion of the upper unit laminate body and the other-side alternate electrode portion of the unit laminate body just below this upper laminate body may be electrically connected to one another by the one-side electrode layer, and the other-side alternate electrode portion of the unit laminate body just below the upper unit laminate body and the one-side alternate electrode portion of the unit laminate body just below the former may be electrically connected to one another by the other-side electrode layer.

Therefore, the one-side alternate electrode portion of the upper unit laminate body and the other-side alternate electrode of the unit laminate body just below this upper unit laminate body can be taken outside by using a common wire, and the other-side alternate electrode portion of the unit laminate body just below the upper unit laminate body and the one-side alternate electrode portion of the unit laminate body just below the former can be taken outside by using a common wire.

As a result, the number of wires can be reduced by two in comparison with four wires that are necessary when the one-side and other-side alternate electrode portions of the upper unit laminate body and the one-side and other-side alternate electrode portions of the unit laminate body just below the upper unit laminate body are taken outside.

In a third embodiment of the invention, a piezoelectric laminate body may be produced by serially laminating a plurality of unit laminate bodies (40a, 40b, 50a, 60a to 60c, 80a to 80c, 100a, 100b, 110a, 120) wherein each unit laminate body is constituted into an alternate electrode structure type unit laminate body having a center electrode portion as a driving portion and alternate electrode portions (C, D, E, F, N, L, M, P, G, H, I, J, K, Q1, Q2) as a non-driving portion, disposed on the outer peripheral side of the center electrode portion, and each unit laminate body on the upper side is laminated in such a fashion as to deviate at its alternate electrode portions from the alternate electrode portions of the unit laminate body just below it in a laminating direction.

According to this construction, each alternate electrode portion is not positioned continuously in the laminating direction from the unit laminate body at the uppermost position to the unit laminate body at the lowermost position among a plurality of unit laminate bodies. As a result, this piezoelectric laminate body can accomplish substantially the same mode of operation as that of the first-mentioned embodiment of the invention.

In the third embodiment of the invention, each unit laminate body may have a rectangular transverse sectional shape, and the alternate electrode portions of the upper unit laminate body and the unit laminate body just below the upper unit laminate body are so positioned as to deviate from each other in a planar direction on the same surface side in the laminating direction.

According to this invention, each alternate electrode portion is not positioned continuously. Therefore, this invention can accomplish substantially the same mode of operation as that of the third embodiment of the invention.

In the piezoelectric laminate body according to the third embodiment of the invention, the piezoelectric laminate body may employ a construction in which each unit laminate body has a circular transverse sectional shape, and the alternate electrode portions of an upper unit laminate body and those of a unit laminate body just below this upper unit laminate body may be so positioned as to deviate from each other in the direction of the outer peripheral surfaces of both of the upper and lower unit laminate bodies.

Even when each unit laminate body has a circular transverse sectional shape as described above, this invention can accomplish substantially the same mode of operation as that of the third embodiment of the invention.

Both alternate electrode portions may be parallel to one another, or may be inclined in the laminating direction with respect to one another.

In an alternate embodiment of the invention, each of both alternate electrode portions may be two rows, or two parallel rows, of alternate electrode portions.

When electric conduction of both unit laminate bodies is established along each of the two rows of alternate electrode portions, the probability of compensating for disconnection can be improved.

In another embodiment of the invention, an external electrode may be formed on the side surface of a unit laminate body along the alternate electrode portion.

Therefore, a desired electrolysis can be applied easily to the unit laminate body.

In an alternate embodiment of the invention, the external electrode disposed on the side surface of an upper unit laminate body and the external electrode disposed on the side surface of a unit laminate body just below the upper unit laminate body may be connected by an electrically conductive wire to establish an electric connection.

Therefore, the external electrode disposed on the side surface of the upper unit laminate body and the external electrode disposed on the side surface of the unit laminate body disposed on the side surface of the unit laminate body just below the former can be reliably connected electrically.

According to another embodiment of the invention, the piezoelectric laminate body may be the one that is produced by laminating serially and alternately unit laminate bodies (40a, 40b, 50a, 60a to 60c, 80a to 80c, 100a, 100b, 110a, 120) and inter-connection laminate bodies (40c, 40f, 50b, 70a to 70f, 100c, 100f, 100g, 110b, 130). Each of the unit laminate bodies includes alternate electrode portions (C, D, E, F, N, L, M, P, G, H, I, J, K, Q1, Q2) as a non-driving portion on the outer peripheral side of a center electrode portion as a driving portion, and is constituted with the inter-connection laminate body adjacent thereto into an alternate electrode structure type unit laminate body, and a unit laminate body on the upper side and the adjacent inter-connection laminate body thereof are laminated in such a fashion as to separate and deviate at the alternate electrode portions thereof from the alternate electrode portions of the unit laminate body and the adjacent inter-connection laminate body just below the upper unit laminate body in a laminating direction.

According to this embodiment of the invention, the alternate electrode portions are not positioned continuously, in substantially the same way as in the third embodiment of the invention. As a result, this invention can accomplish substantially the same mode of operation as that of the third embodiment of the invention.

In an alternate embodiment of the invention, a piezoelectric laminate body wherein each of the unit laminate bodies and the inter-connection laminate bodies adjacent thereto may be provided with a rectangular sectional shape, and the alternate electrode portions of the unit laminate body on the upper side and its adjacent inter-connection laminate body may be positioned in such a fashion as to separate and deviate in a planar direction from the alternate electrode portions of the unit laminate body and its adjacent inter-connection laminate body just below the upper unit laminate body on the same surface side in the laminating direction of each of the unit laminate bodies and their adjacent inter-connection laminate bodies.

According to this embodiment of the invention, each alternate electrode portion may not be positioned continuously. Therefore, this embodiment of the invention can accomplish substantially the same mode operation as that of the previous embodiment.

In an alternate embodiment of the invention, a piezoelectric laminate body is provided wherein each of the unit laminate bodies and inter-connection laminate bodies may have a rectangular shape, and an upper unit laminate body and its adjacent inter-connection laminate body may have, as the alternate electrode portion thereof, an alternate electrode portion (hereinafter called the "first alternate electrode portion") disposed on each surface of the laminate body on the upper side and its adjacent inter-connection laminate body in the laminating direction, the unit laminate body just below the upper unit laminate body and its adjacent inter-connection laminate body may have, as the alternate electrode portion thereof, an alternate electrode portion (hereinafter called the "second alternate electrode portion") disposed on each surface of the unit laminate body just below the upper unit laminate body and its adjacent inter-connection laminate body in the laminating direction, and the first and second alternate electrode portions disposed on each surface in the laminating direction may be positioned in such a fashion as to separate and deviate from each other in the planar direction.

Since the first and second alternate electrode portions are separately positioned for each of the corresponding unit laminate body and its adjacent inter-connection laminate body, the difference of the quantity of displacement occurring in the boundary between the alternate electrode portions of each unit laminate body and its center electrode portion, when an electric field is applied to the piezoelectric laminate body from its uppermost unit laminate body to its lowermost unit laminate body, remains at a sufficiently small value that is the value for each unit laminate body.

Here, the alternate electrode portions of an upper unit laminate body and the unit laminate body just below this upper unit laminate body are not-positioned on the same surface but on different surfaces among the surfaces of the unit laminate bodies in the laminating direction. Therefore, the difference of the quantity of displacement is dispersed to the different surface sides of each unit laminate body and is mitigated. In consequence, the effect of preventing cracks in the boundary described above can be secured more reliably, and the mode of operation of the invention described in claim 16 can be further improved.

In another embodiment of the invention, a piezoelectric laminate body is provided wherein each of the unit laminate bodies and inter-connection laminate bodies may have a circular transverse sectional shape, and the alternate electrode portion of each of the upper unit laminate body and its adjacent inter-connection laminate body may be positioned in such a fashion as to separate and deviate from the alternate electrode body portion of the unit laminate body just below the upper unit laminate body and its inter-connection laminate body in the direction of the outer peripheral surface of the unit laminate body and its adjacent inter-connection laminate body.

Even when each unit laminate body and each inter-connection laminate body have a circular transverse sectional shape, this embodiment of the invention can accomplish substantially the same mode of operation as that of the previous embodiment.

Both alternate electrode portions may be parallel to each other, or may be inclined with respect to the laminating direction.

According to an alternate embodiment of the invention, each alternate electrode portion may comprise two rows of alternate electrode portions.

When electric conduction of both unit laminate bodies is secured along these two rows of alternate electrode portions, the probability of compensating for disconnection can be further improved.

In another embodiment of the invention, a piezoelectric laminate body is provided wherein each of the unit laminate bodies and the adjacent laminate bodies may have a circular transverse sectional shape; each alternate electrode portion of an upper unit laminate body and its adjacent inter-connection laminate body may be disposed as a first alternate electrode portion along the outer peripheral surface of the upper unit laminate body and its adjacent interconnection laminate body; each alternate electrode portion of the unit laminate body just below the upper unit laminate body and its adjacent inter-connection laminate body may be disposed as a second alternate electrode portion along the outer peripheral surface of the unit laminate body just below the upper unit laminate body and its adjacent interconnection laminate body; and the first and second alternate electrode portions may be positioned in such a fashion as to separate and deviate from each other in the direction of the outer peripheral surface.

Since the first and second alternate electrode portions are separately positioned for each unit laminate body and each adjacent inter-connection laminate body, the difference of the quantity of displacement, when the electric field is applied to the piezoelectric laminate body from the uppermost unit laminate body to the lowermost unit laminate body, remains at a sufficient small value that is the value for each unit laminate body.

Here, the alternate electrode portions of the upper unit body and the alternate electrode portions of the unit laminate body just below this upper unit laminate body exist at different positions on the outer peripheral surface of the unit laminate bodies. Therefore, the difference of the quantity of displacement described above is dispersed to a different position for each unit laminate body and is mitigated. As a result, the prevention effect of the cracks in the boundary can be further secured, and the mode of operation of the invention of claim 16 can be further improved.

Both alternate electrode portions may be parallel to each other, or may be inclined with respect to the laminating direction.

According to another embodiment of the invention, each of both alternate electrode portions may comprise two rows of alternate electrode portions.

When electric connection of both unit laminate bodies is established along these two rows of alternate electrode portions, the probability of compensating for disconnection can be further improved.

According to an alternate embodiment of the invention, an external electrode may be formed on the side surface of each unit laminate body along its alternate electrode portions.

Therefore, a desired electric field can be applied easily to the unit laminate body.

According to another embodiment of the invention, the external electrode disposed on the side surface of an upper unit laminate body and the external electrode disposed on the side surface of the unit laminate body just below the upper unit laminate body may be connected to each other by an electrically conductive wire.

According to this embodiment of the invention, the external electrode disposed on the side surface of the upper unit laminate body and the external electrode disposed on the side surface of the unit laminate body just below the upper unit electrode body can be reliably connected electrically.

According to another embodiment of the invention, the external electrode disposed on the side surface of the upper unit laminate body and the external electrode disposed on the side surface of the unit laminate body just below the upper unit laminate body may be electrically connected by the external electrode of the inter-connection laminate body. In this way, the external electrode disposed on the side surface of the upper unit laminate body and the external electrode disposed on the side surface of the unit laminate body just below the upper unit laminate body can be connected easily and reliably.

Incidentally, reference numeral of each means in the parenthesis represents the correspondence relation with concrete means described in the following embodiments.

Hereinafter, each embodiment of the present invention will be explained with reference to the drawings.

(First Embodiment)

FIG. 1 shows an example of a piezoelectric laminate body according to the present invention. This piezoelectric laminate body is adapted to an actuator for a fuel injection device for a car engine, for example.

Figure 3:
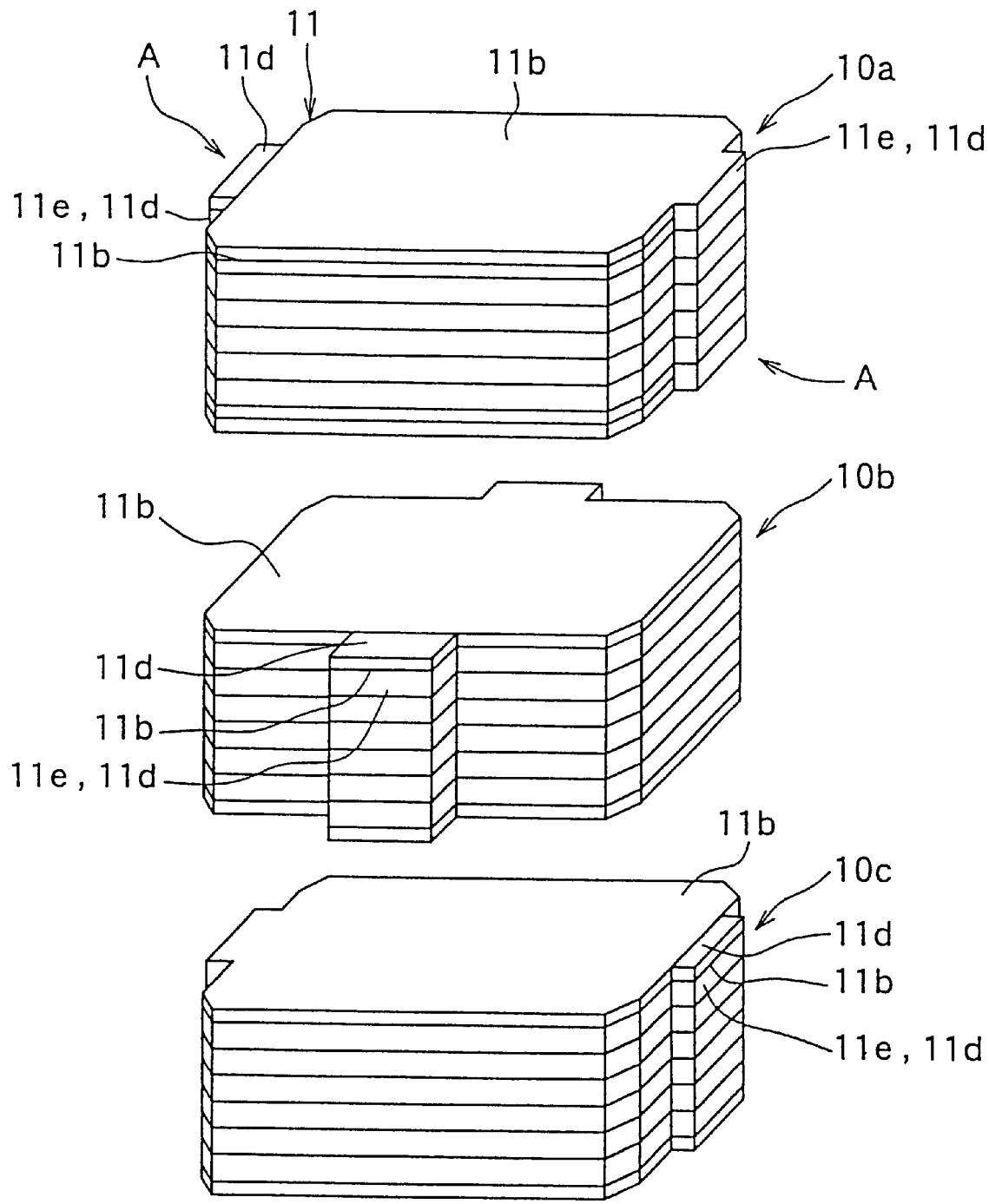
FIG. 3 is an exploded perspective view of the piezoelectric laminate body shown in FIG. 1.

The piezoelectric laminate body is constituted when a plurality of unit laminate bodies 10*a*, 10*b*, 10*c*, 10*d*, 10*e*, 10*f*, 10*g*, and so forth, are laminated as shown in FIGS. 1 and 3. Though FIG. 1 shows only seven unit laminate bodies, about fifteen unit laminate bodies, for example, are generally laminated to secure a sufficient quantity of displacement of the piezoelectric laminate body.

The construction of each of these unit laminate bodies 10*a* to 10*g* will be explained using unit laminate body 10*a* as an example.

A plurality of laminate sheets 11 are laminated to form the unit laminate body 10*a* as can be seen from FIGS. 1 to 5. Each laminate sheet 11 comprises a piezoelectric element sheet 11*a* and an electrode layer 11*b* (see FIG. 5).

The piezoelectric element sheet 11*a* exhibits its distortion piezoelectric conversion function when an electric field is applied between both of its surfaces. The piezoelectric element sheet 11*a* is molded from a piezoelectric ceramic material so that it integrally includes a substantially rectangular device sheet portion 11*c* and lug portions 11*d* and 11*e* protruding in mutually opposite direction from the center of both opposed edges of the device sheet portion 11*c* (see FIGS. 4 and 6). The electrode layer 11*b* is so formed as to spread on the surface of the element sheet portion 11*c* and on the surface of the lug portions 11*e* but is not formed on the lug portions 11*d* (see FIGS. 4 and 6). Incidentally, a known material such as a Pb(ZrTi)O$_3$ type is used for the piezoelectric ceramic material.

Figure 4:
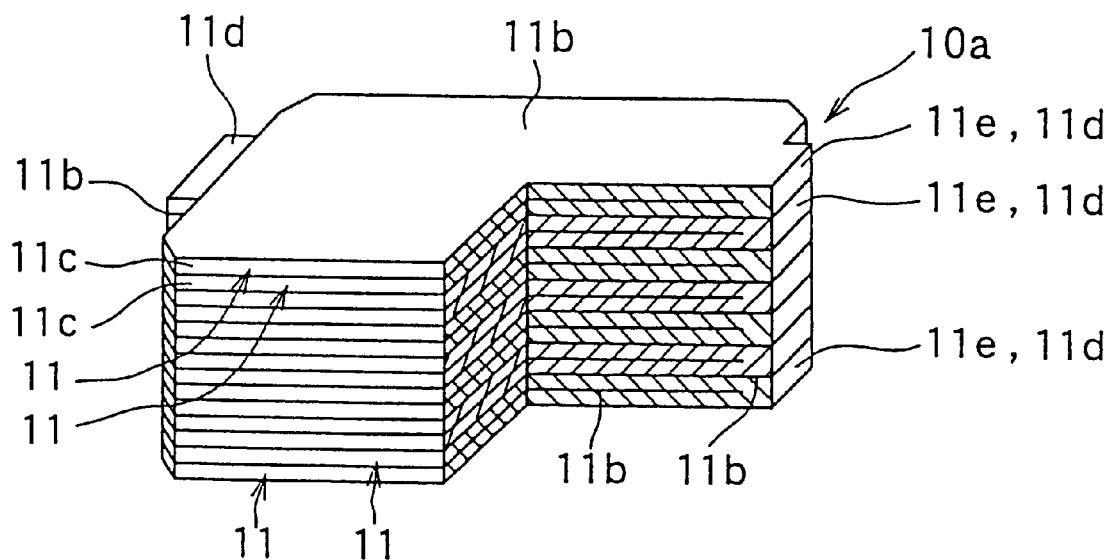
FIG. 4 is a partial cut-away view of a unit laminate body shown in FIG. 2.
Figure 5:
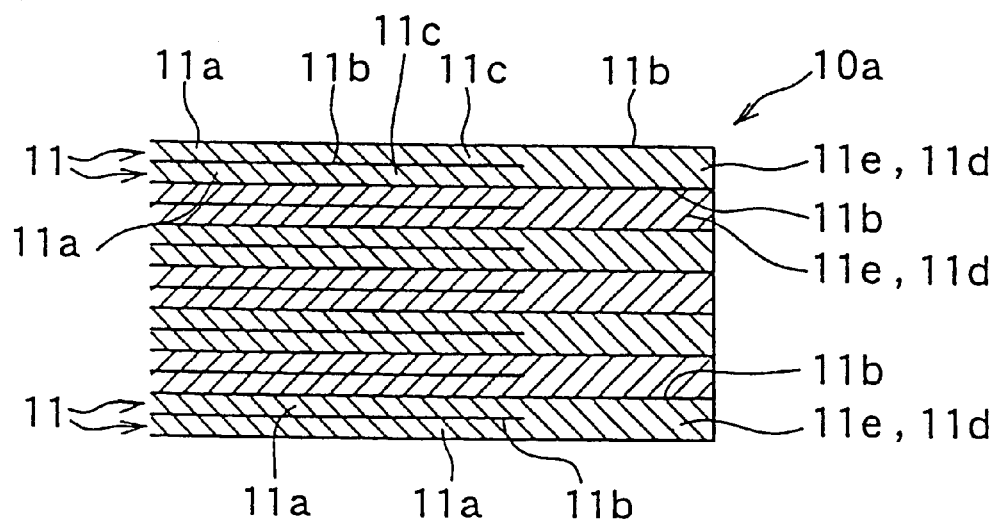
FIG. 5 is a partial enlarged sectional view of the unit laminate body before baking.

The electrode layer 11*b* of the second laminate sheet 11 below the uppermost laminate sheet 11 among the laminate sheets 11, is superposed with the portion of the back of the uppermost laminate sheet 11 with the exception of the lug portion 11*e* (see FIGS. 4 to 6). The electrode layer 11*b* of the third laminate sheet 11 is superposed with the back of the second laminate sheet with the exception of the lug portion 11*e*. Similarly, the back of laminate sheets on the upper side and the electrode layer 11*b* of the subsequent laminate sheets below the former are superposed serially onto the lowermost laminate sheet 11.

Figure 6:
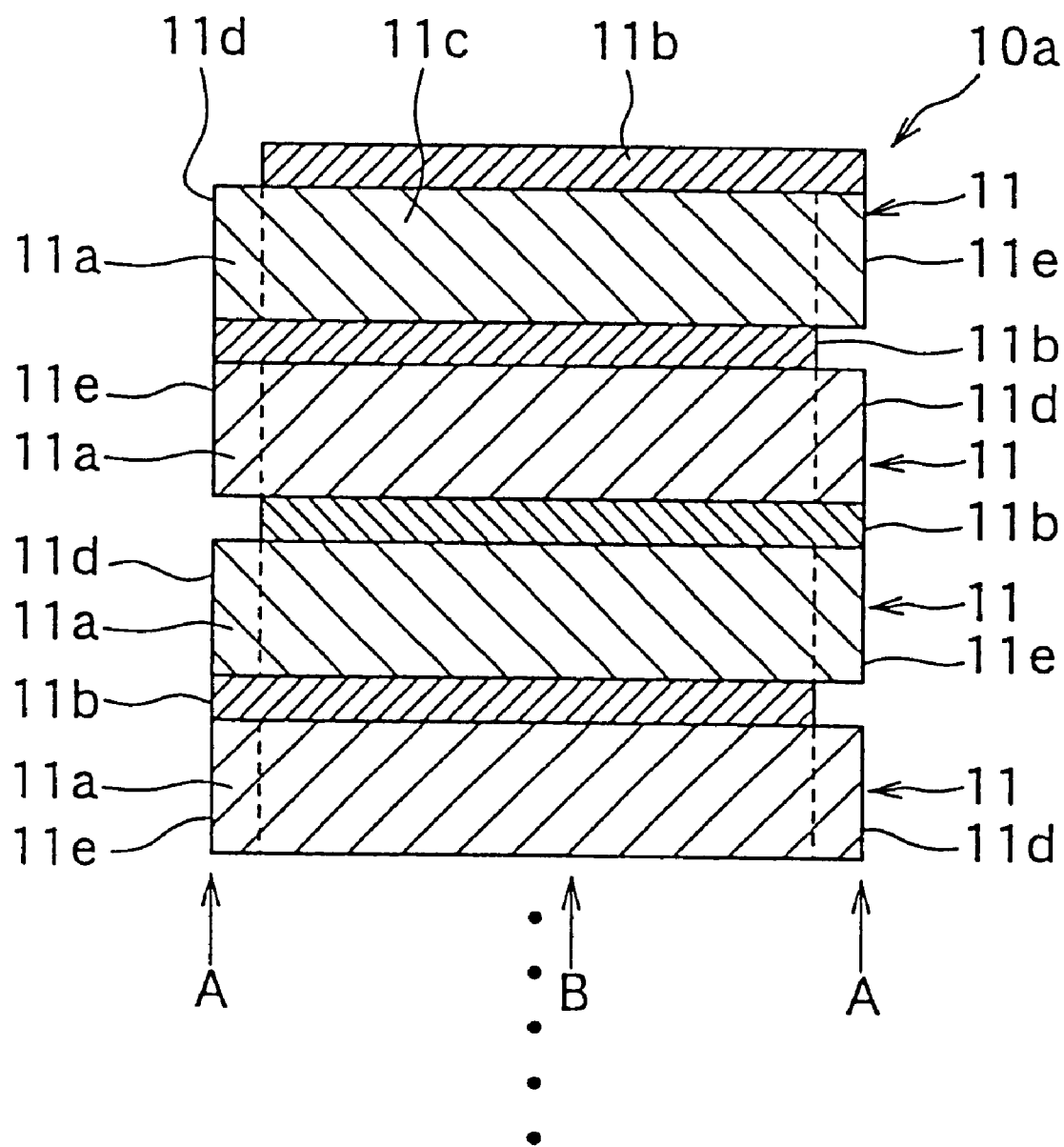
FIG. 6 is a partial sectional view of the unit laminate body.

Between adjacent-laminate sheets 11, the portions that protrude from the device sheet portion 11*c* with the electrode layer 11*b* constitute the alternate electrode portion A of the unit laminate body 10*a*, and the portion that corresponds to the device sheet portion 11*c* constitutes the center electrode portion B of the unit laminate body 10*a* (see FIG. 6).

However, the lug portions 11*e* and 11*d* of both adjacent laminate sheets 11 in the unit laminate body 10*a* are integral with each other (see FIGS. 4 and 5), and the end portions of the electrode layer 11*b* in the direction of the lug portion between both adjacent laminate sheets 11 are in agreement with the boundary between both lug portions 11*e* and 11*d*, that are integral with each other, and the device sheet portion 11*c*. The rest of the unit laminate bodies 10*b* to 10*g* have the same construction as the unit laminate body 10*a*.

As shown in FIG. 3, the unit laminate bodies 10*a* to 10*g* of the piezoelectric laminate body are serially laminated in such a fashion that their angular positions are deviated counter-clockwise by 90 degress in the direction orthogonal to the laminating direction from the uppermost unit laminate body 10a to the lowermost unit laminate body.

Figure 7:
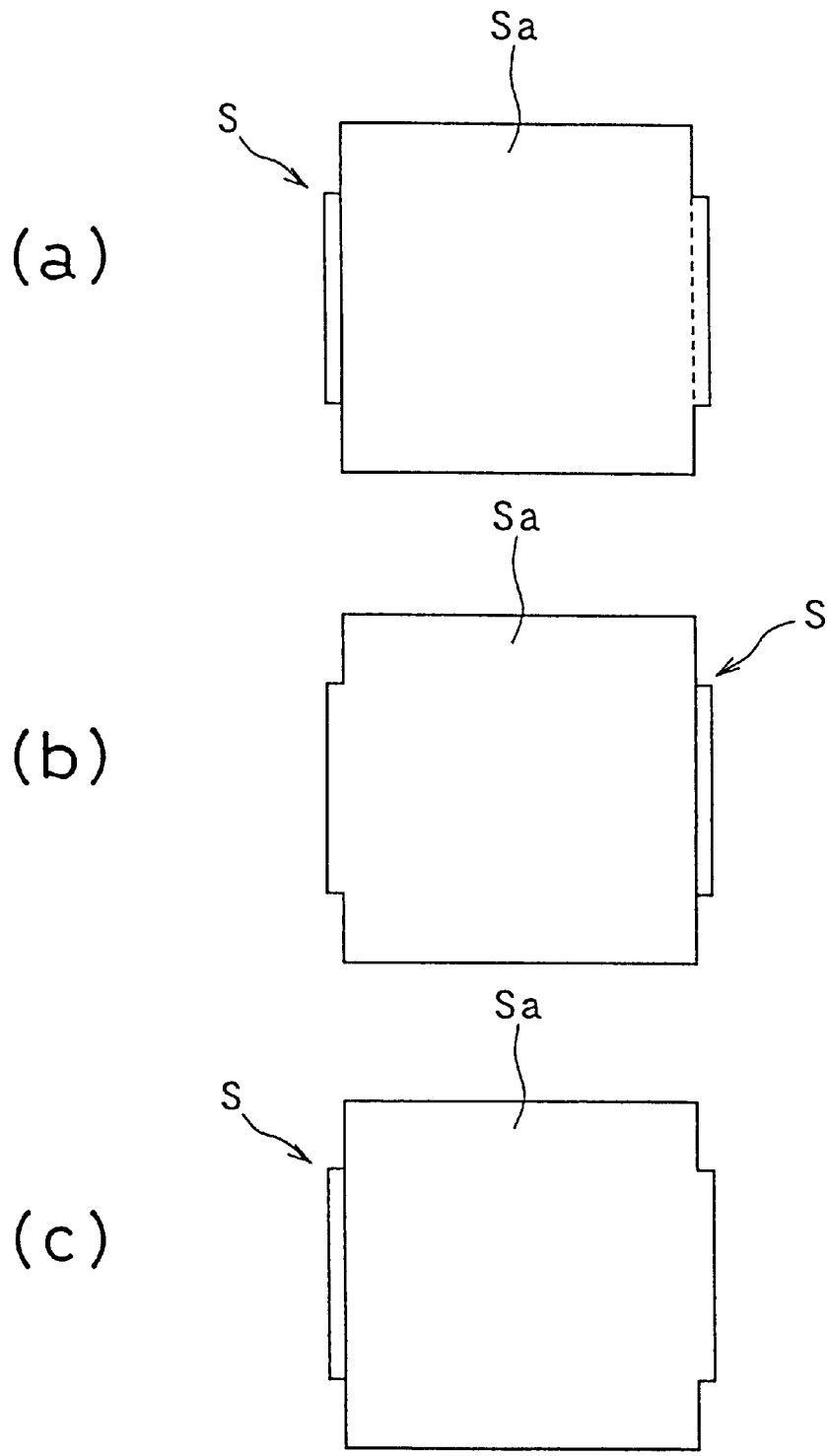
FIGS. 7(a), 7(b) and 7(c) show the formation state of an electrode layer with respect to each green sheet to be laminated mutually.

Next, the production method of the piezoelectric laminate body will be explained with reference to FIGS. 6 and 7. First, the formation method of the unit laminate body 10a, for example, will be explained.

A plurality of green sheets S (see FIG. 7) made of a piezoelectric ceramic material and having a shape corresponding to that of the laminate sheet 11 is prepared. Incidentally, each green sheet S has a thickness of about 20 µm to about 150 µm. FIG. 7 shows only three green sheets for convenience.

After a plurality of green sheets S is thus prepared, a silver palladium paste is printed in a layer form, by screen printing, onto the surface portions of the first green sheet S corresponding to the device sheet potion 11c and the lug portions 11e in such a manner as to form an electrode layer Sa corresponding to the electrode layer 11b. The electrode layer Sa is similarly printed to the surface of each of the remaining green sheets S.

Each green sheet S, after printing, is dried. A plurality of green sheets is then laminated serially. In this instance, the green sheets S are arranged in such a manner that the portion of the electrode layer Sa of the first green sheet S corresponding to the lug portion 11e is positioned on the right side in FIG. 7(a), the portion of the electrode layer Sa of the second green sheet S is positioned on the left side in FIG. 7(b), the portion of the electrode layer Sa of the third green sheet corresponding to the lug portion 11e is positioned on the right side in FIG. 7(c), and similarly, the portion of the electrode layer Sa of each green sheet S corresponding to the lug portion 11e is positioned alternately to the right and left. In this way, the formation of the unit laminate bodies 10a before baking is completed (see FIG. 6). This also holds true of the rest of the unit laminate bodies.

Next, each unit laminate body 10a to 10g before baking is serially laminated from the lowermost unit laminate body to the uppermost laminate body. At this time, the unit laminate bodies are laminated serially in such a manner that the electrode portions A of both upper and lower adjacent laminate bodies are serially deviated by 90 degrees in the direction orthogonal to the laminating direction as described above.

Thereafter, the unit laminate bodies so laminated are heat-pressed at 80° C. in the laminating direction. Degreasing of each green sheet S is then carried out. More concretely, a binder that constitutes each green sheet S is heat-treated up to 500° C. at a rate of 1° C./hour so as to extinguish the binder with the lapse of time. After this heat-treatment, each unit laminate body is baked at 1,000° C. for 2 hours. In consequence, the portions that swell out from the superposition portion with the electrode layer Sa in both adjacent green sheets S (see FIG. 6) are integrated in each unit laminate body (see FIG. 4). In this way, the piezoelectric laminate body shown in FIG. 1 is completed.

After the piezoelectric laminate body is thus produced, the electrode material is applied to the alternate electrode portions (both lug portions 11d and 11e and the portions of the electrode layers 11b between both lug portions) of all the unit laminate bodies in the laminating direction, and is baked to establish electric conduction. Four electrode wires having sufficient slack are electrically connected to the alternate electrode portions that are positioned in the laminating direction of all the unit laminate bodies among the alternate electrode portions for which electric conduction is established as described above.

Here, two electrode wires corresponding to the same polarity among the electrode wires are gathered together and are used as the positive or negative electrodes. Thereafter, the electrode wires and the piezoelectric laminate bodies are covered with an insulating resin so that the positive and negative electrodes can be exposed to the outside under the mutually insulated state.

According to the first embodiment described above, the unit laminate bodies 10a to 10g are laminated in such a manner that their alternate electrode portions are deviated mutually by 90 degrees from the uppermost unit laminate body 10a to the lowermost unit laminate body.

Consequently, both alternate electrode portions of each unit laminate body are not positioned continuously in the laminating direction from the uppermost unit laminate body 10a to the lowermost unit laminate body among a plurality of unit laminate bodies 10a to 10g.

Here, when the electric field is applied to the piezoelectric laminate body from the uppermost unit laminate body 10a to the lowermost unit laminate body, the electric field acts on only the alternate electrode portion on one side of each unit laminate body and on its center electrode portion. In consequence, the difference of the quantity of displacement develops in the boundary between the one-side alternate electrode portion and the center electrode portion and the remaining portions in each unit laminate body. However, each alternate electrode portion is not positioned continuously in the laminating direction from the uppermost unit laminate body 10a to the lowermost unit laminate body.

Consequently, the difference of the quantity of displacement remains at a sufficiently small value that is the value for each unit laminate body. As a result, cracks do not occur in the boundary of the one-side alternate electrode portion and the center electrode portion with the remaining portions in each unit laminate body.

Figure 8:
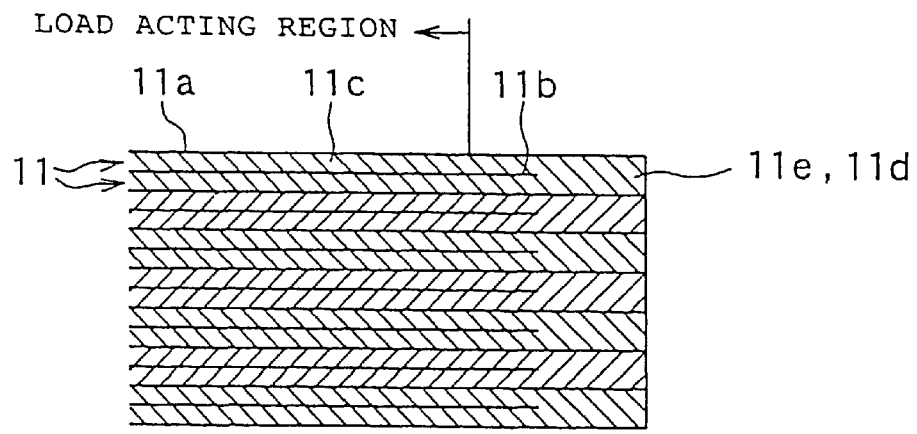
FIG. 8 is a partial enlarged side view showing a modified embodiment of the first embodiment described above.

FIG. 8 shows a modified embodiment of the first embodiment. In this modified embodiment, the electrode layer 11b of the laminate sheet 11 of each unit laminate body described in the first embodiment is so formed as to extend deeper into each lug portion 11e, 11d than in the embodiment shown in FIG. 5.

According to this construction, the stress difference between the portion on which the load acts and the portion on which the load does not act upon the application of the electric field to the unit laminate body, and the stress difference between the stretching portion and the non-stretching portion of the unit laminate body resulting from the existence/absence of the electrode layer do not act on the same portion. As a result, prevention of the cracks in the unit laminate body described above can be further improved.

(Second Embodiment)

Figure 9:
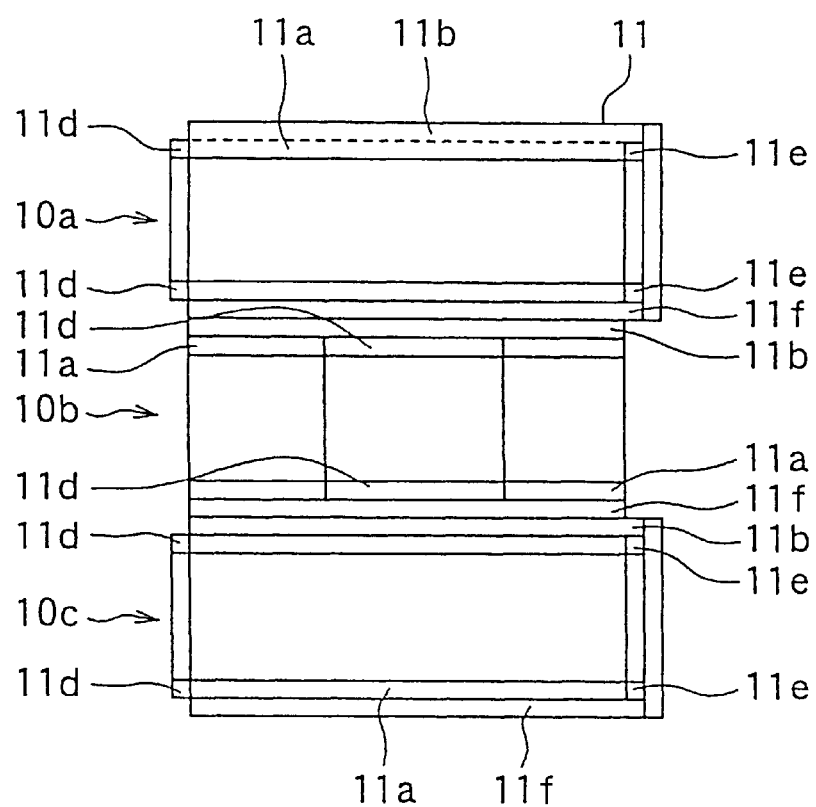
FIG. 9 is a partial enlarged side view showing the second embodiment of the present invention.

FIGS. 9 and 10 show the second embodiment of the present invention. In the piezoelectric laminate body described in the first embodiment, the second embodiment prints and forms an electrode layer 11f to the portions of the back of the lowermost laminate sheet 11 that constitutes each unit laminate body among a plurality of unit laminate bodies 10a to 10g, corresponding to the device sheet portion 11c and the lug portions 11e, by the same formation method as the electrode layer 11b among a plurality of unit laminate bodies 10a to 10g (see FIG. 10(a)).

The electrode layer 11f formed on the back of the lowermost laminate sheet 11 of each upper unit laminate body is superposed with, and bonded to, the electrode layer 11b (see FIG. 10(b)) formed on the surface of the uppermost laminate sheet 11 of an unit laminate body just below this upper unit laminate body, thereby establishing the electric connection between both unit laminate bodies.

Accordingly, one alternate electrode portion of the upper unit laminate body is electrically connected to one alternate electrode portion of the unit laminate body just below the former by one common electric wire. Therefore, one alternate electrode portion of the upper unit laminate body and that of the lower unit laminate body just below the former can be taken out by a common wire, and one of the four electrode wires described in the first embodiment can be abolished. The rest of the construction and the function and effect are the same as those of the first embodiment.

(Third Embodiment)

Figure 11:
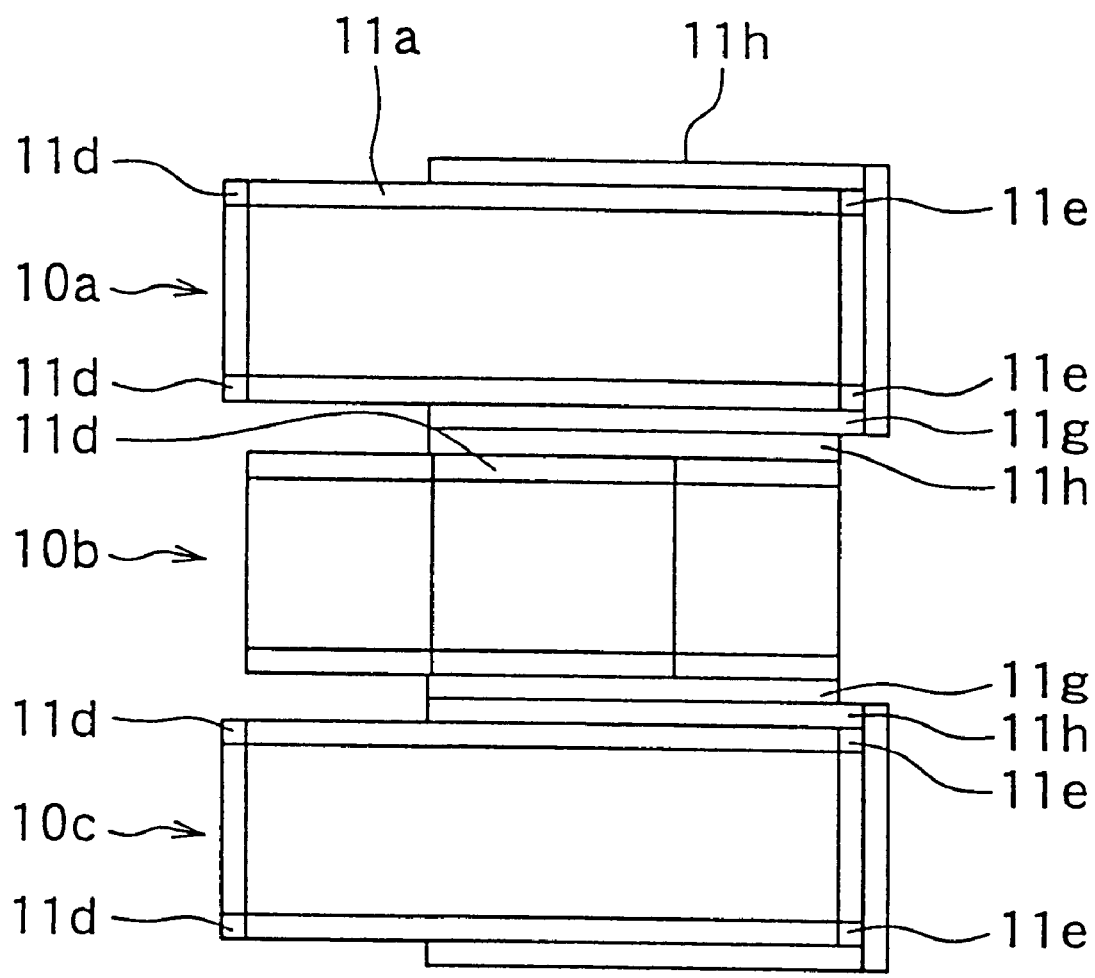
FIG. 11 is a partial enlarged side view showing the third embodiment of the present invention from an electrode layer side on each side.
Figure 12:
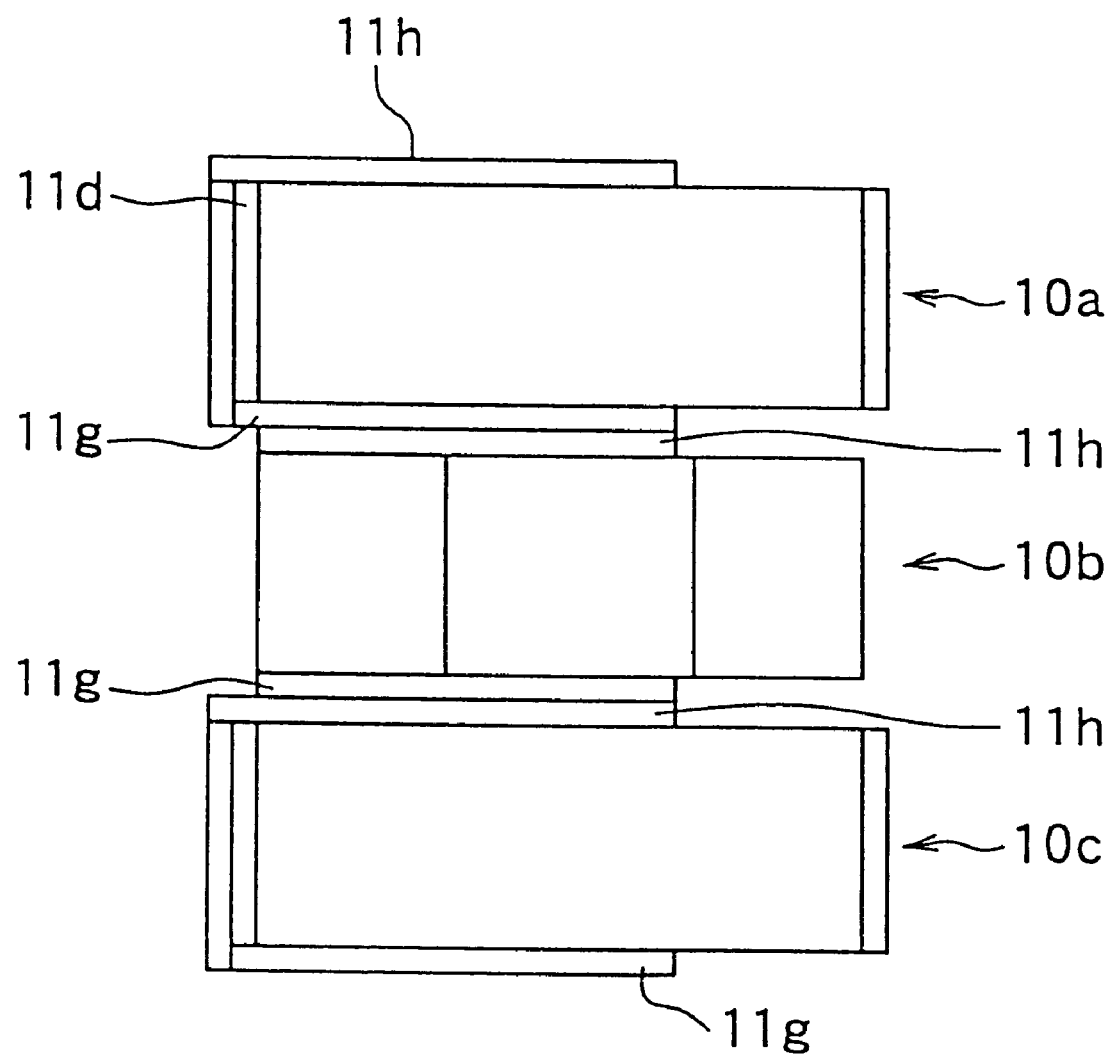
FIG. 12 is a partial enlarged side view showing the third embodiment from the electrode layer on the other side.

FIGS. 11 to 13 show the third embodiment of the present invention. In the piezoelectric laminate body described in the first embodiment, the third embodiment forms both electrode layers 11g in the mutually spaced-apart relation in a triangular region in the proximity of the lug portion 11e of the device sheet portion 11c and in the lug portion 11e and in a triangular region in the proximity of the lug portion 11d of the device sheet portion 11c and in the lug portion 11d of the device sheet portion 11c by the same formation method as that of the electrode layer 11b on the back of the lowermost laminate sheet 11 of the upper unit laminate body among a plurality of unit laminate bodies 10a to 10g that are laminated with one another(see FIG. 13(a)).

Both electrode layers 11h are formed in the mutually spaced-apart relation, by the same formation method as that of the electrode layer 11b, in a triangular region in the proximity of the lug portion 11e of the device sheet portion 11c and in the lug portion 11e and in a triangular region of the device sheet portion 11c in the proximity of the lug portion 11d and in the lug portion 11d of the uppermost laminate sheet 11 of the unit laminate body positioned just below the upper unit laminate body, in place of the electrode layer 11b (see FIG. 13(b)).

Incidentally, each electrode layer 11g and each electrode layer 11h are formed in such a manner that when the upper unit laminate body is laminated on the lower unit laminate body, each electrode layer 11g of the lowermost laminate sheet 11 of the upper unit laminate body is superposed with each electrode layer 11h of the uppermost laminate sheet 11 of the lower unit laminate body (see FIG. 13). Therefore, both electrode layers 11g and 11h that are superposed with one another are electrically connected to one another (see FIGS. 11 and 12).

In consequence, one alternate electrode portion of the upper unit laminate body is electrically connected to that of the unit laminate body just below the former, and the other alternate electrode portion of the upper unit laminate body is electrically connected to that of the unit laminate body just below the former. Therefore, it becomes possible to take out one alternate electrode portion of each of the upper and lower unit laminate bodies by a common electrode wire and the other alternate electrode portion of each of the upper and lower unit laminate bodies by a common electrode wire. As a result, two of the four electrode wires described in the first embodiment can be abolished. The rest of the construction and the mode of operation are the same as those of the first embodiment.

(Fourth Embodiment)

Figure 14:
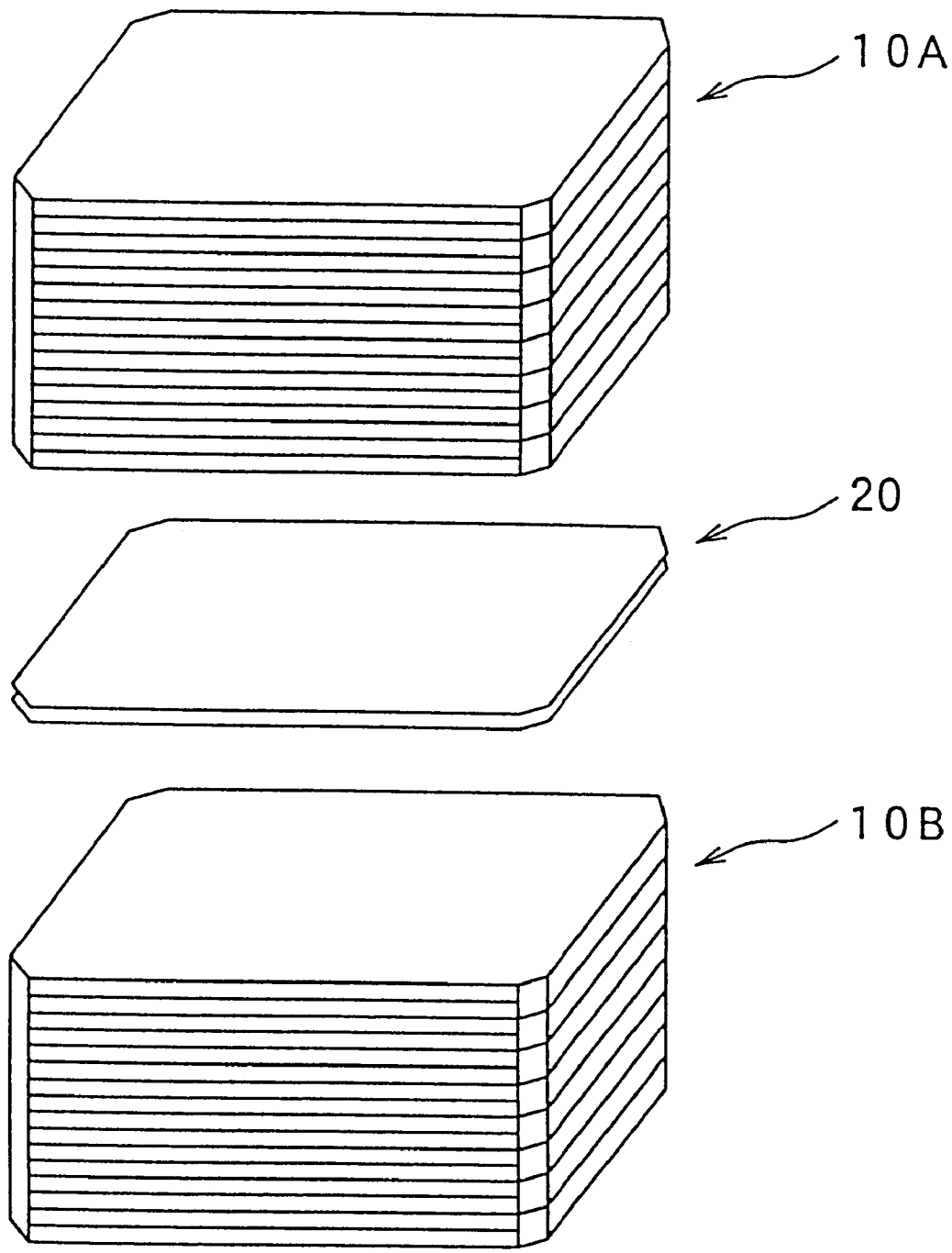
FIG. 14 is a partial exploded view showing the fourth embodiment of the present invention.
Figure 15:
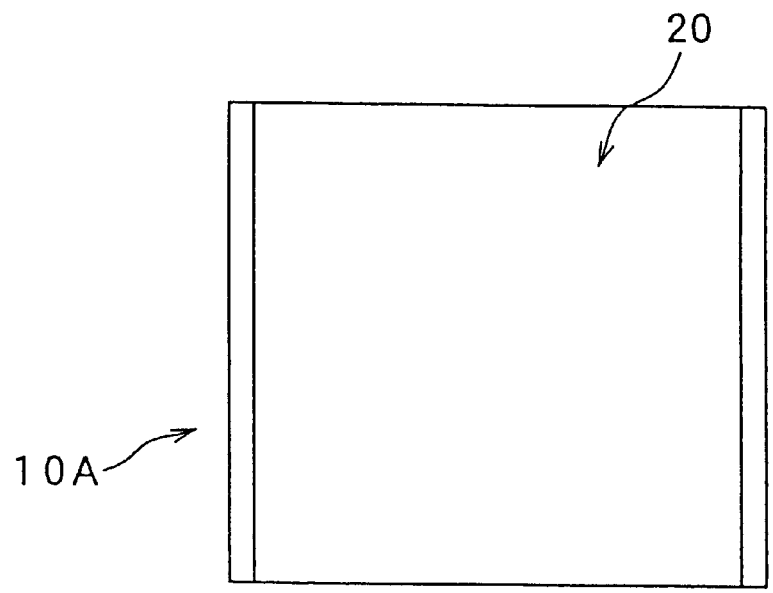
FIG. 15 is a bottom view showing the state where a dummy sheet is formed on the back of the unit laminate body in the fourth embodiment.

FIGS. 14 and 15 show the fourth embodiment of the present invention. This embodiment uses a plurality of unit laminate bodies 10A, 10B, and so forth, not having both lug portions 11d and 11e in place of a plurality of unit laminate bodies 10a to 10g described in the first embodiment.

Each unit laminate body 10A, 10B, . . . is of the alternate electrode structure type having substantially the same structure as that of each unit laminate body described in the first embodiment. The width of the unit laminate body in the direction of both lug portions 11d and 11e is in agreement with the width of the unit laminate body 10a inclusive of both lug portions 11d and 11e. Incidentally, FIG. 14 shows only both unit laminate bodies 10A and 10B.

A dummy sheet 20 is interposed between each adjacent pair of unit laminate bodies among a plurality of unit laminate bodies 10A, 10B, and so forth. The portions of each dummy sheet 20 corresponding to both lug portions 11d and 11e are trimmed away by laser trimming (see FIG. 15).

In the fourth embodiment having the construction described above, the alternate electrode portions of the upper unit laminate body and those of the lower unit laminate body just below the former do not overlap with one another because the dummy sheet disappears. Therefore, the alternate electrode portions of the unit laminate bodies do not continuously overlap with one another in the laminating direction. When the electric field is applied to the piezoelectric laminate body in the same way as in the first embodiment, this embodiment can accomplish substantially the same mode of operation as that of the first embodiment because the alternate electrode portions are separated for each unit laminate body.

Figure 16:
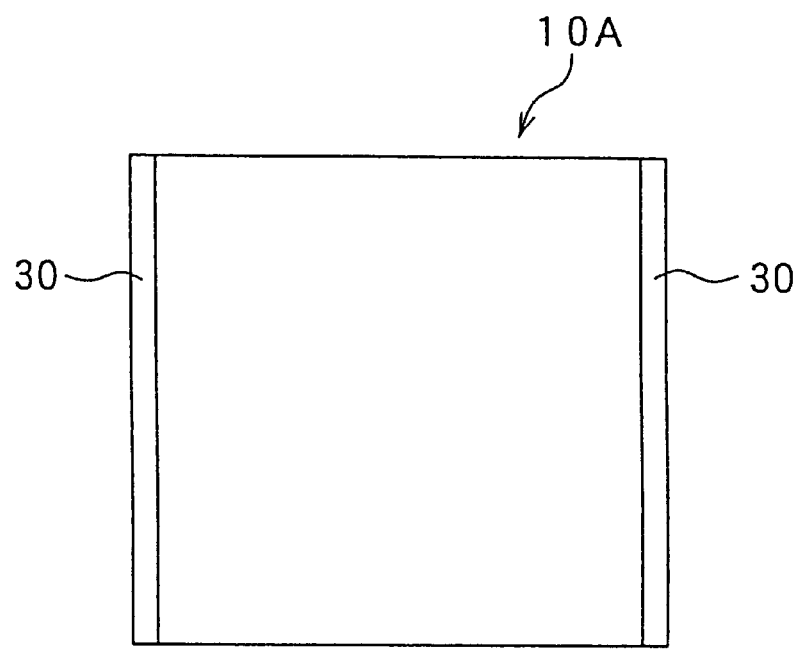
FIG. 16 is a bottom view showing the state where a dummy sheet is formed on the back of the unit laminate body in a modified embodiment of the fourth embodiment.

FIG. 16 shows a modified embodiment of the fourth embodiment. In this modified embodiment, the unit laminate bodies 10A, 10B, and so forth, are laminated in the following way unlike in the fourth embodiment.

First, each dummy sheet 30 of an organic material is printed in a belt form and in a thin film form to each portion corresponding to each lug portion 11d, 11e of the back of each unit laminate body 10A (refer to the first embodiment). Incidentally, the organic material does not disappear during hot-pressing of the unit laminate bodies 10A, 10B and so forth, after they are laminated, but disappears during baking of the unit laminate bodies.

Both dummy sheets 30 are similarly printed to the back of the rest of the remaining unit laminate bodies 10B, and so forth, with the exception of the lowermost unit laminate body.

These unit laminate bodies 10A, 10B, and so forth, are serially laminated from the uppermost unit laminate body 10A to the lowermost unit laminate body. Both dummy sheets 30 are thus sandwiched between each adjacent pair of unit laminate bodies.

The unit laminate bodies 10A, 10B, and so forth, that are thus laminated, are then hot-pressed in the laminating direction. At this time, the portion of the back of each upper unit laminate body other than both dummy sheets 30 come into close contact with the portion of the surface of each lower unit laminate body other than both dummy sheets 30. Since the dummy sheet 30 is made of the organic material as described above, it is not eliminated but remains as it is.

Next, the unit laminate bodies 10A, 10B, etc, thus laminated are baked. Since the dummy sheet 30 is made of the organic material, it is eliminated by baking.

Therefore, among a plurality of unit laminate bodies 10A, 10B, and so forth, the alternate electrode portions of both unit laminate bodies adjacent to each other in the vertical direction are kept as such without overlapping with each other due to the elimination of the dummy sheet 30. In other words, the alternate electrode portion of each unit laminate body does not overlap continuously in the laminating direction in the same way as in the fourth embodiment. Therefore, this embodiment can exhibit the same mode of operation as that of the fourth embodiment.

(Fifth Embodiment)

Figure 17:
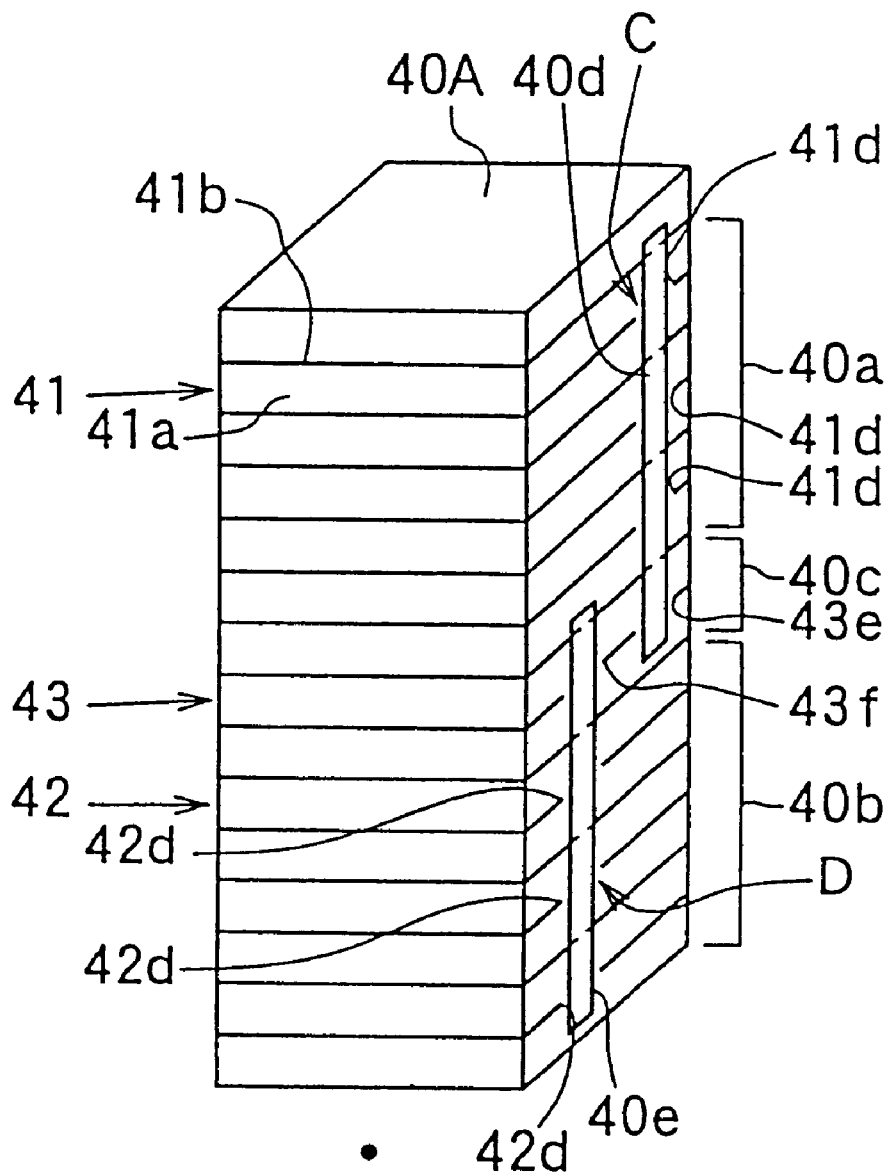
FIG. 17 is a perspective view showing a piezoelectric laminate body according to the fifth embodiment of the present invention.
Figure 18:
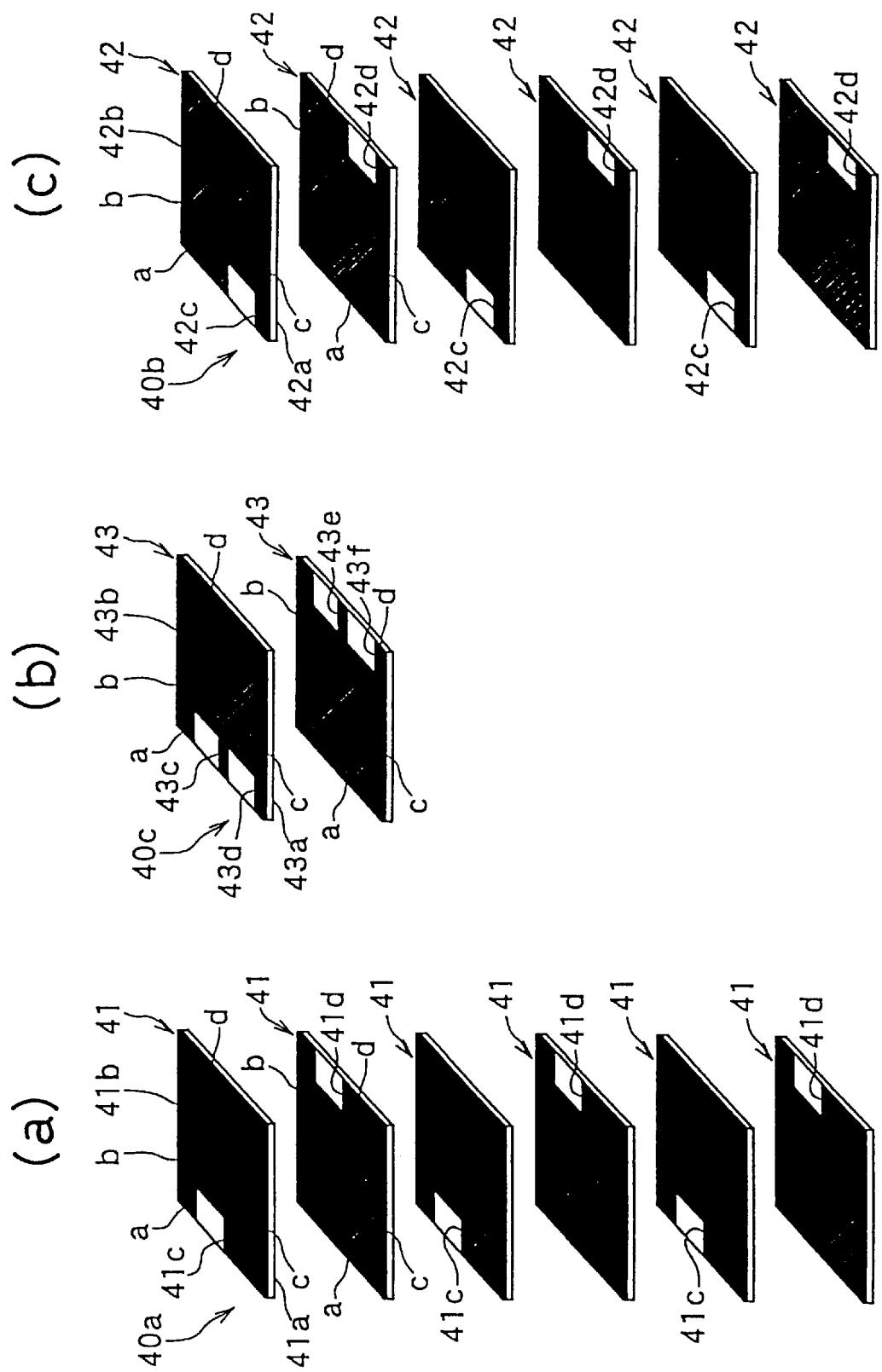
FIGS. 18(*a*), 18(*b*) and 18(*c*) are exploded perspective views of inter-connection laminate body of a unit laminate body, and the unit laminate body, in the fifth embodiment.

FIGS. 17 and 18 show the piezoelectric laminate body according to the fifth embodiment of the present invention.

This piezoelectric laminate body has a rectangular prismatic shape. A plurality of sets of both unit laminate bodies 40a and 40b are laminated from up to down in FIG. 17, and the inter-connection laminate body 40c is inserted between an adjacent pair of unit laminate bodies. Incidentally, FIG. 17 shows one set of unit laminate bodies 40a and 40b and one inter-connection laminate body 40c for illustration.

The unit laminate body 40a is formed when a plurality of laminate sheets 41 are laminated. Each laminate sheet 41 comprises a rectangular sheet-like piezoelectric device plate 41a and an electrode layer 41b. The piezoelectric device sheet 41a is made of a piezoelectric ceramic material in the same way as the piezoelectric device sheet 11a of the first embodiment.

Here, each of the odd-numbered electrode layers 41b from above in FIG. 18(a) has a notch 41c. The notch 41c is formed into a rectangular notch form from one of the ends a of the electrode layer 41b. However, the notch 41c is formed at a portion closer to an opposed edge b of both opposed edges b and c of the electrode layer 41b.

Each of the even-numbered electrode layers 41b from above in FIG. 18(a) has a notch portion 41d. The notch 41d is formed into a rectangular notch form from one of the opposed edges d of both opposed edges of the electrode layer 41b. However, the notch 41d is formed closer to the opposed edge b of both opposed edges b and c of the electrode layer 41b.

The laminate sheet 41 is formed by screen-printing and then drying a silver palladium paste, as the electrode layer 41b, on the surface of a green sheet made of a piezoelectric material that has a shape corresponding to that of the piezoelectric device sheet 41a. Each laminate sheet 41 is laminated serially to give the unit laminate body 41 before baking. In this case, the laminate sheets 41 are laminated in such a manner that their notches 41c and 41d are positioned alternately to the right and left, as shown in FIG. 18(a).

The unit laminate body 40b is produced when a plurality of laminate sheets 42 are laminated. Each of these laminate sheets 42 comprises a rectangular sheetlike piezoelectric device sheet 42a and an electrode layer 42b. The piezoelectric device sheet 42a is made of a piezoelectric ceramic material in the same way as the piezoelectric device sheet 41a.

Referring to FIG. 18(c), each of the odd-numbered electrode layers 42b from above has the notch 42c, that is cut away in the rectangular notch form from one a of the edges of the electrode layer 41b. However, the notch 41c is formed at a portion close to the opposed edge c of both opposed edges b and c of the electrode layer 41b.

In FIG. 18(c), each of the even-numbered electrode layers 42b from above has the notch 42d, that is cut away into the rectangular notch form from the opposed edge d of the electrode layer 42b. However, the notch 42d is formed at a portion close to the opposed edge c of both opposed ends b and c of the electrode layer 42b.

The laminate sheet 42 is formed when a silver palladium paste, functioning as the electrode layer 42b, is screen-printed and then dried on the surface of the green sheet made of the piezoelectric ceramic material and having the shape corresponding to that of the piezoelectric device sheet 42a. Thereafter, these laminate sheets 42 are laminated serially to give the unit laminate body 42 before baking. At this time, the laminate sheets 42 are laminated in such a manner that their notches 42c and 42d are arranged alternately to the right and left from the upper laminate sheets to the lower laminate sheets.

The inter-connection laminate body 40c is used for electrically connecting the unit laminate body just above it to the unit laminate body just below it. Both laminate sheets 43 are laminated to form the inter-connection laminate body 40c. It comprises a rectangular sheet-like piezoelectric device sheet 43a and an electrode layer 43b. The piezoelectric device sheet 43a is made of the piezoelectric ceramic material in the same way as the piezoelectric device sheet 41a described above. As shown in FIG. 18(b), the upper electrode layer 43b has both notches 43c and 43d. These notches 43c and 43d are formed in the rectangular shape from the opposed edge a of the electrode layer 43b. However, the notch 43c is formed at a portion close to the opposed edge b of the electrode layer 43b, and the notch 43d is formed at a portion close to the opposed edge c of the electrode layer 43b.

As also shown in FIG. 18(b), the lower electrode layer 43b has both notches 43e and 43f. The notches 43e and 43f are formed into the rectangular shape from the opposed edge of the electrode layer 43b. However, the notch 43e is formed at a portion close to the opposed edge b of the electrode layer 43b, and the notch 43f is formed at a portion close to the opposed edge c of the electrode layer 43b.

The laminate sheet 43 is formed by screen-printing, and then drying, a silver palladium paste on the surface of a green sheet made of a piezoelectric ceramic material and having a shape corresponding to that of the piezoelectric device sheet 43a. Each laminate layer sheet 43 is then laminated serially to give an inter-connection laminate body 40c before baking. As shown in FIG. 18(b), the laminate sheets 43 are laminated at this time in such a manner that both notches 43c, 43d of the electrode layers 43b and both notches 43e and 43f of the electrode layers are arranged alternately to the right and left from the upper laminate sheets to the lower laminate sheets. The remaining unit laminate bodies and inter-connection laminate bodies before baking are produced in the same way.

In the case of the unit laminate body 40a, inter-connection laminate body 40c and unit laminate body 40b before baking, shown in FIG. 17, for example, the unit laminate bodies 40a, the inter-connection laminate bodies 40c and the unit laminate bodies 40b are serially laminated from above, and then the inter-connection laminate bodies 40c, the unit laminate bodies 40a, the inter-connection laminate bodies 40c, the unit laminate bodies 40b, and so forth, are similarly laminated.

In this case, each notch 41c positioned on the left side in the unit laminate body 40a overlaps with each notch 43c positioned on the left side of the inter-connection laminate body 40c, and each notch 41d positioned on the right side of the unit laminate body 40a overlaps with the notch 43e positioned on the right side of the inter-connection laminate body 40c (see FIGS. 18(a) and (b)).

The notch 43d positioned on the left side of the inter-connection laminate body 40c overlaps with each notch 42c positioned on the left side of the unit laminate body 40b, and the notch 43f positioned on the right side of the inter-connection laminate body 40c overlaps with each notch 42d positioned on the right side of the unit laminate body 40b (see FIGS. 18(b) and (c)). The rest of the unit laminate bodies and inter-connection laminate bodies are similarly laminated. Incidentally, a piezoelectric device sheet 40A similar to the piezoelectric device plate 41a is put on the uppermost unit laminate body 40a. In this way, the piezo-electric laminate body before baking is completed.

Thereafter, the piezoelectric laminate body thus formed is baked in the same way as in the first embodiment. In consequence, the portions of both adjacent piezoelectric device sheets overlapping with one another through the notches are integrated. In this way, the production of the piezoelectric laminate body is finished (see FIG. 17).

As shown typically in FIG. 17, an electrode material is applied to, and baked on, the portions of the right side surface of the unit laminate body 40a and the inter-connection laminate body 40c corresponding to each notch portion 41d, 43e in such a manner as to extend to the electrode layer 41b of each odd-numbered laminate sheet 41 and to the electrode layer 43b of the upper laminate sheet 43, thereby forming an external electrode 40d and establishing electric conduction. The electrode material is also applied to, and baked on, the portions of the right side surface of the inter-connection laminate body 40c and the unit laminate body 40b in such a manner as to extend to the electrode layer 43 of the upper laminate sheet 43 and to the electrode layer 42b of each unit laminate sheet 42, thereby forming an electrode 40e and establishing electric conduction. Thereafter, external electrodes are serially formed in the same way on the right side surface of the reset of the unit laminate bodies and inter-connection laminate bodies.

In this way, both external electrodes 40d and 40e are formed alternately and in parallel with one another on the ridge side surface of the piezoelectric laminate body. Incidentally, both external electrodes are also formed on the left side surface of the piezoelectric laminate body.

In the fifth embodiment having the construction described above, the portions (hereinafter called the "alternate electrode portions C") corresponding to each notch 41d, 43e and each notch portion 41c, 43c of the unit laminate body 40a and the inter-connection laminate body 40c are laminated and deviated position-wise in the planar direction along both right and left surfaces of the piezoelectric laminate body with respect to the portions (hereinafter called the "alternate electrode portion D") corresponding to each notch 43f, 42d and each notch 43d, 42c of the inter-connection laminate body 40c and the unit laminate body 40b (see FIGS. 17 and 18).

Therefore, the alternate electrode portions C and D do not hold continuous positions in the piezoelectric laminate body in its laminating direction. When the electric field is applied to the piezoelectric laminate body from the uppermost unit laminate body to the lowermost unit laminate body in the same way as in the first embodiment, the difference in the quantity of displacement, that occurs in the boundary between the alternate electrode portion of the unit laminate body and the center electrode portion, remains a sufficiently small value that is the value for each unit laminate body. As a result, cracks do not develop in the boundary, in the same way as in the first embodiment. Incidentally, this explanation also holds true of the inter-connection laminate body 40c.

(Sixth Embodiment)

Figure 19:
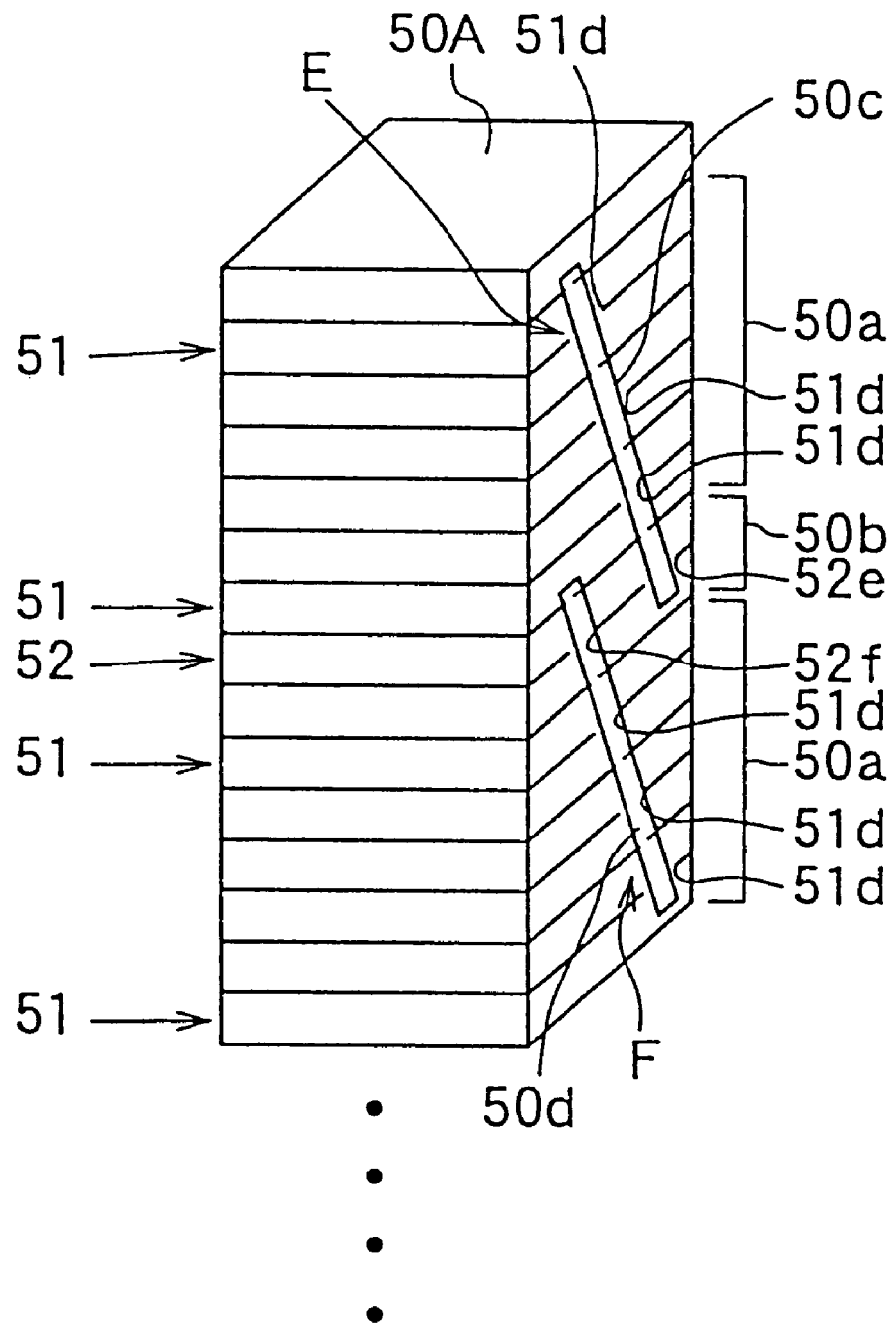
FIG. 19 is a perspective view showing a piezoelectric laminate body according to the sixth embodiment of the present invention.
Figure 20:
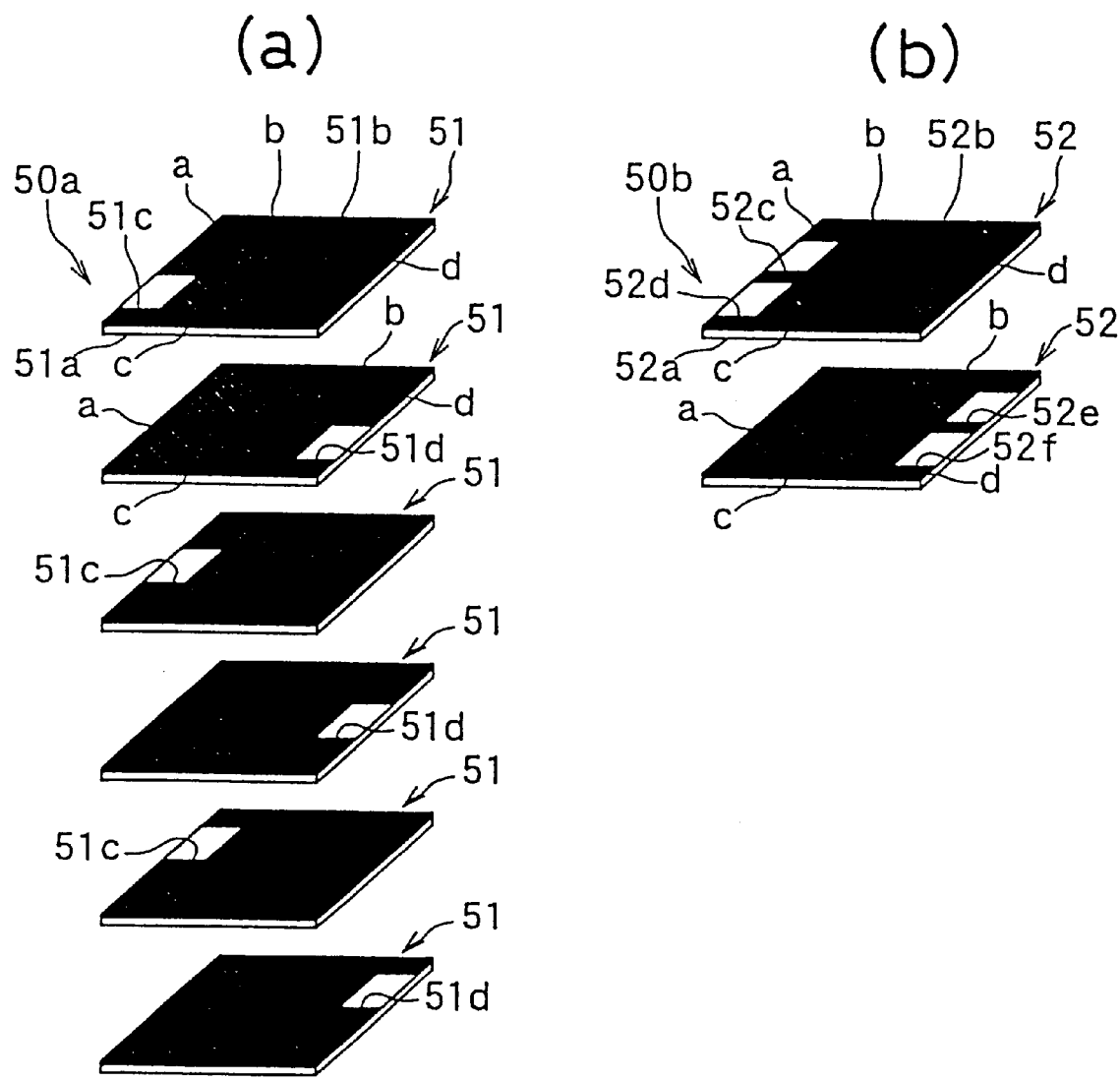
FIGS. 20(*a*) and 20(*b*) are exploded perspective views of a unit laminate body and an inter-connection laminate body in the sixth embodiment.

FIGS. 19 and 20 show the piezoelectric laminate body according to the sixth embodiment of the present invention. This piezoelectric laminate body has a rectangular prismatic shape, and is formed when unit laminate bodies 50a and inter-connection laminate bodies 50b are alternately laminated from above to below in FIG. 19. Incidentally FIG. 19 shows only two unit laminate bodies 50a and one inter-connection laminate body 50b for the sake of illustration.

The unit laminate body 50a is produced when a plurality of laminate sheets 51 are laminated. Each laminate sheet 51 comprises a rectangular piezoelectric device sheet 51a and a rectangular electrode layer 51b. The piezoelectric device sheet 51a is made of a piezoelectric ceramic material in the same way as the piezoelectric device sheet 41a described in the fifth embodiment.

In FIG. 20(a), each of the odd-numbered electrode layers 51b from above has a notch 51c. The notch 51c has a rectangular notch form from an opposed edge a of the electrode layer 41b. However, the notches 51c are formed in such a manner that their positions are sequentially deviated from the opposed edge c of the electrode layer 51b towards the opposed edge b from the upper notches to the lower notches.

Each of the even-numbered electrode layers 51 from above in FIG. 20(a) has a notch 51d. The notch 51d has a rectangular notch shape from an opposed edge d of each electrode layer 51b. However, these notches 51 are formed in such a manner that they are progressively positioned from the opposed edge c to the opposed edge b from the upper electrode layers 51b to the lower electrode layers 51b.

A silver palladium paste as the electrode layer 51b is printed to, and baked on, the surface of a green sheet made of a piezoelectric ceramic material and having a shape corresponding to the shape of a piezoelectric device sheet 51a and is then dried to give the laminate sheet 51. Thereafter, the laminate sheets 51 are serially laminated and superposed to give a unit laminate body 51 before baking. In this case, the laminate sheets 51 are laminated in such a manner that the notches 51c and 51d of the electrode layers 51b are positioned alternately to the right and left from the upper laminate sheets to the lower laminate sheets among these laminate sheets 51, as shown in FIG. 20(a).

The inter-connection laminate body 50b is formed when both laminate sheets 52 are laminated. Each laminate sheet 52 comprises a rectangular sheet-like piezoelectric device sheet 52a and a rectangular electrode layer 52b. The piezoelectric sheet 52a is made of a piezoelectric ceramic material in the same way as the piezoelectric device sheet 51a described above. The upper electrode layer 52b has both notches 52c and 52d as shown in FIG. 20(b). These notches 52c and 52d are shaped into a rectangular shape from the opposed edge a of the electrode layer 52b. However, the notch 52c is formed at a portion close to the opposed edge b, and the notch 52d is formed at a position close to the opposed edge c and isolated from the notch 52b.

As shown in FIG. 20(b), the lower electrode layer 52b has both notches 53e and 52f. The notches 52e and 52f are formed into a rectangular shape from the opposed edge d of the electrode layer 52b. However, the notch 52e is formed at a portion close to the opposed edge b of the electrode layer 52b, and the notch 52f is formed at a position close to the opposed edge c of the electrode layer 52b and separated from the notch 52e.

A silver palladium paste is printed to, and dried on, the surface of a green sheet made of a piezoelectric ceramic material and having a shape corresponding to that of the piezoelectric device sheet 52a to give the laminate sheet 52. Thereafter, the laminate sheets 52 are serially laminated to give the inter-connection laminate body 50b before baking. At this time, the laminate sheets 52 are laminated in such a manner that both notches of the electrode layers 52b and both notches 52e and 52f are alternately positioned to the right and left from the upper laminate sheets to the lower laminate sheets. The rest of the unit laminate bodies and inter-connection laminate bodies before baking are produced in the same way.

In the case of the unit laminate body 50a and the inter-connection laminate body 50b for baking, shown in FIG. 20, for example, they are alternately laminated in the sequence of the unit laminate body 50a, the inter-connection laminate body 50b and the unit laminate body 50a from above, and they are thereafter laminated alternately in the sequence of the inter-connection laminate body 50b, the unit laminate body 50a, and so on.

At this time, each notch 51c and each notch 51d of the unit laminate bodies 50a are in parallel with one another, and their positions are deviated serially from the upper notches to the lower notches. The notch 52c positioned on the left side of the inter-connection laminate body 50b overlaps with the lowermost notch 51c of the upper unit laminate body 50a, and the notch 52e positioned on the right side of the inter-connection laminate body 50b overlaps with the lowermost notch 51d of the upper unit laminate body 50a.

The notch 52d positioned above the inter-connection laminate body 50b and on the left side overlaps with the uppermost notch 51c positioned on the left side of the lower unit laminate body 50a. The notch 52f positioned below the inter-connection laminate body 50b and on the right side overlaps with the uppermost notch positioned on the right side of the lower unit laminate body 50a.

The rest of the unit laminate bodies and inter-connection laminate bodies are thereafter laminated in the same way, giving the piezoelectric laminate body before baking.

This piezoelectric laminate body is baked in the same way as in the fifth embodiment. In consequence, the portions of adjacent piezoelectric device sheets, that overlaps with one another through the notches, are integrated as shown typically in FIG. 19. In this way, the production of the piezoelectric laminate body is finished. Incidentally, reference numeral 50A in FIG. 19 represents the piezoelectric laminate sheet placed on the uppermost unit laminate body 50a.

As shown typically in FIG. 19, an electrode material and applied to, and baked on, the portions of right side surface of the unit laminate bodies 50a and the inter-connection laminate bodies 50b below the former, that correspond to the notches 51d and 52e, in such a manner as to extend from the electrode layers 51b of the odd-numbered laminate sheets 51 to the electrode layer 52b of the upper laminate sheet 52, thereby forming an external electrode 50c and establishing electric conduction.

An electrode material is applied to, and baked on, the portions of the right side surface of the inter-connection laminate body 50b and the unit laminate body 50a below the former, that correspond to the notches 52f and 51d, in such a manner as to extend to the electrode layer 52b of the lower electrode layer 52b and to the electrode layer 51d of each of the first, third and fifth lower laminate sheets, thereby forming an external electrode 50d and establishing electric conduction. External electrodes are serially formed on the right side surface of the rest of the unit laminate bodies and the inter-connection laminate bodies in the same way.

In this way, the external electrodes 50c and 50d are formed alternately and obliquely in parallel with one another on the right side surface of the piezoelectric laminate body. Incidentally, both external electrodes are similarly formed on the left side surface of the piezoelectric laminate body.

In the sixth embodiment having the construction described above, the portions (hereinafter called the "alternate electrode portions E") corresponding to each notch 51d, 52e and each notch portion 51c, 52c of the unit laminate body 50a and the inter-connection laminate body 50b are laminated and deviated obliquely position-wise in the planar direction along both right and left surfaces of the piezoelectric laminate body with respect to the portions (hereinafter called the "alternate electrode portion F") corresponding to each notch 52f, 51d and each notch 52d, 51c of the inter-connection laminate body 50b and the unit laminate body 50a (see FIG. 19).

Therefore, the alternate electrode portions E and E, F do not take the continuous positions in the piezoelectric laminate body in its laminating direction. When the electric field is applied to the piezoelectric laminate body between the uppermost unit laminate body and the lowermost unit laminate body in the same way as in the fifth embodiment, this embodiment can accomplish the same mode of operation as that of the fifth embodiment.

(Seventh Embodiment)

Figure 21:
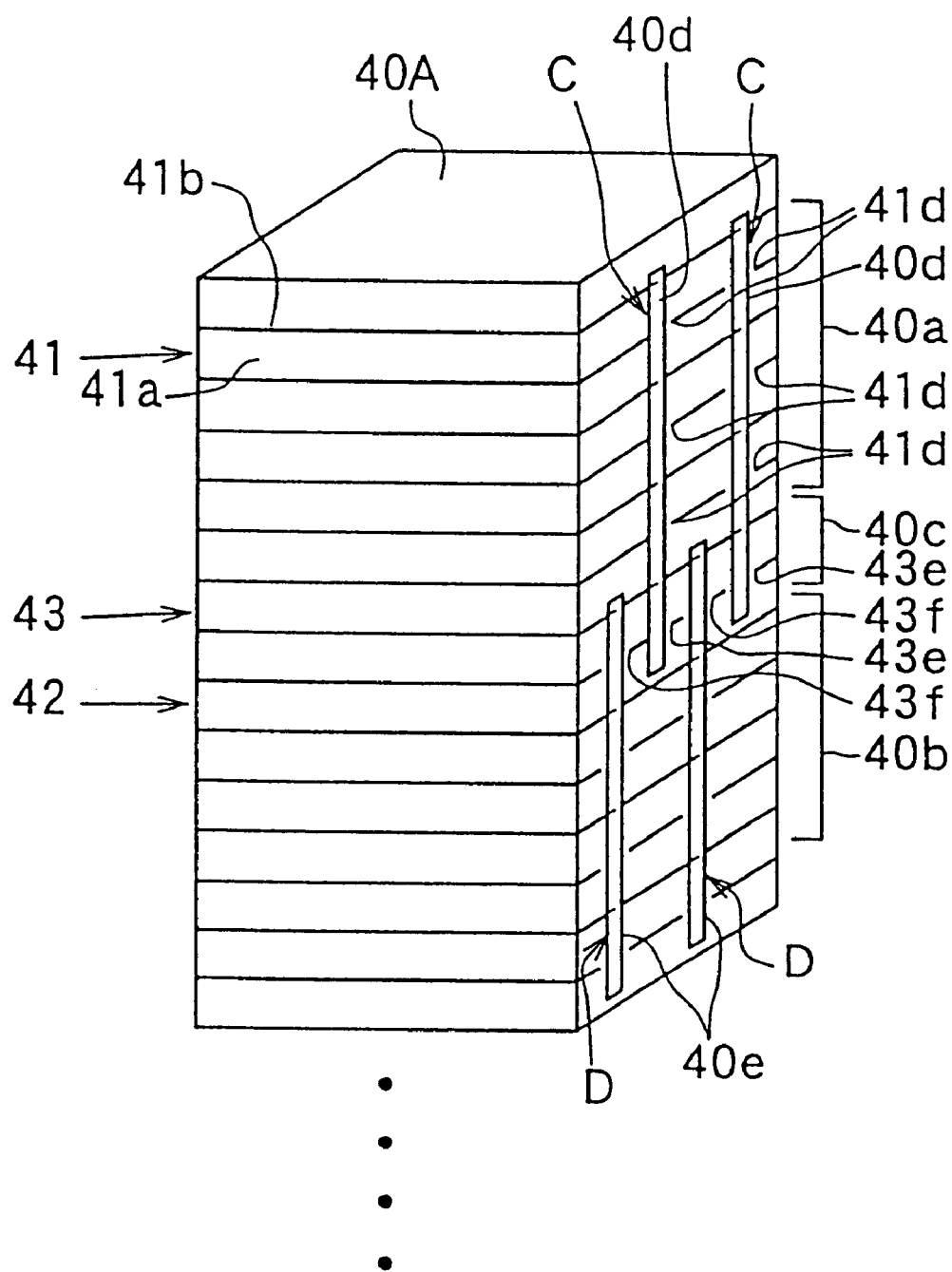
FIG. 21 is a perspective view showing a piezoelectric laminate body according to the seventh embodiment of the present invention.
Figure 22:
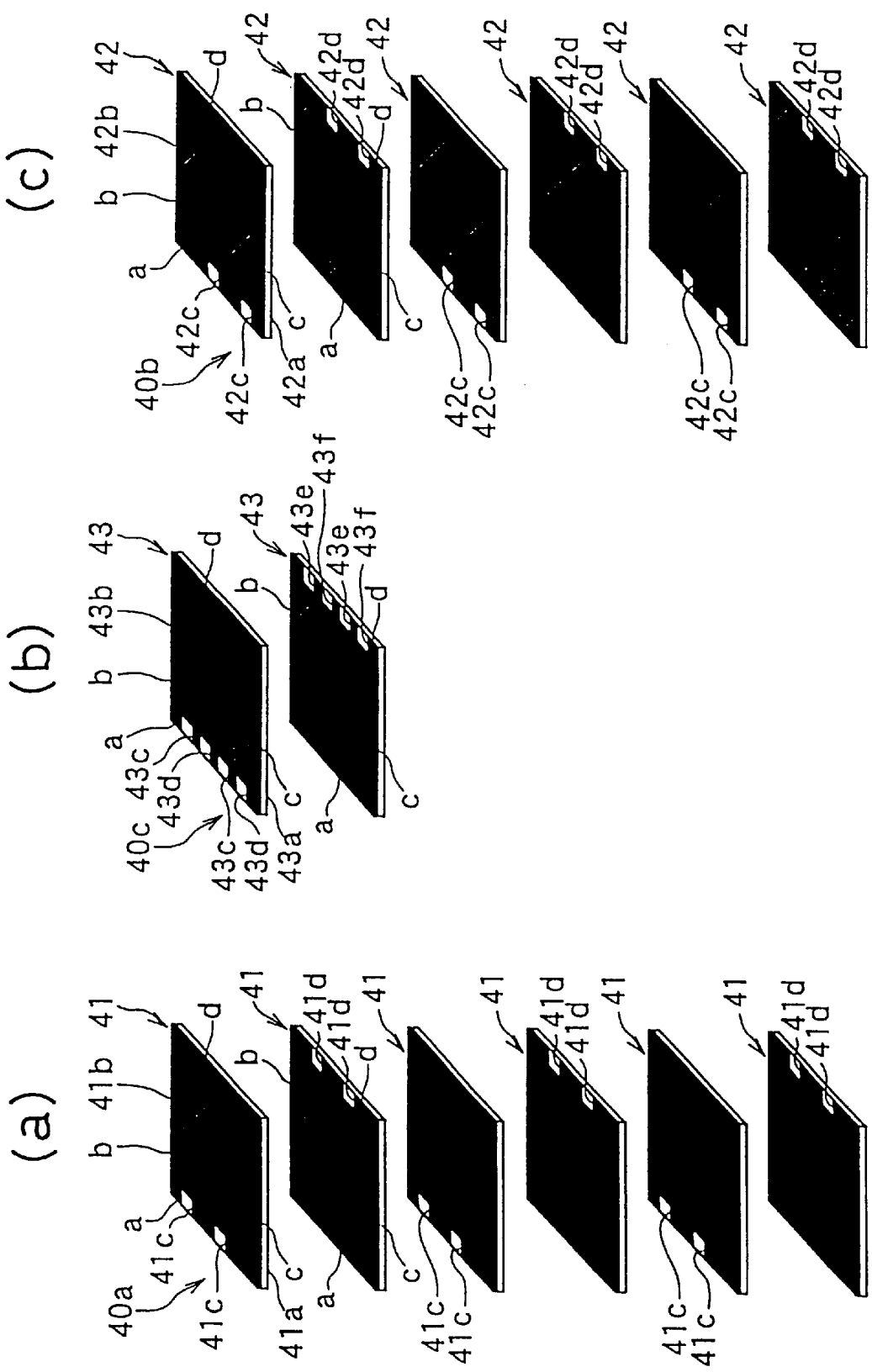
FIGS. 22(*a*), 22(*b*) and 22(*c*) are exploded perspective views showing a unit laminate body, an inter-connection laminate body and the unit laminate body in the seventh embodiment.

FIGS. 21 and 22 show the piezoelectric laminate body according to the seventh embodiment of the present invention. This seventh embodiment employs the construction in which two rows of each of the alternate electrode portions C and D are disposed in parallel with each other on both right- and left-hand side surfaces of the piezoelectric laminate body in the laminating direction in the construction of the fifth embodiment, and two rows of each of the external electrodes 40d and 40e are similarly disposed in parallel with each other in the laminating direction.

As shown in FIG. 22(a), therefore, two notch portions 41c of the electrode layer 41b of each odd-numbered laminate sheet 41 are defined in the spaced-apart relation on the side of the opposed edge a close to the opposed edge b. Two notch portions 41d of the electrode layer 41b of each even-numbered laminate sheet 41 are defined in the spaced-apart relation on the side of the opposed edge d of the electrode layer 41b in such a manner as to correspond to the notch portions 41c, respectively.

In the unit laminate body 40b, two notch portions 42c of the electrode layer 42b of each odd-numbered laminate sheet 42 are defined in the spaced-apart relation on the side of the opposed edge a of the electrode layer 42b close to the opposed edge c, as shown in FIG. 22(c). Two notch portions 42d of the electrode layer 42b of each even-numbered laminate sheet 42 are defined in the spaced-apart relation on the side of the opposed edge d of the electrode layer 42b in such a manner as to correspond to the notch portions 42c, respectively. The rest of the constructions are substantially the same as in the fifth embodiment described above.

In the seventh embodiment having the construction described above, both alternate electrode portions C that are parallel to one another are positioned along the right and left-hand surfaces of the piezoelectric laminate body for each unit laminate body while being deviated position-wise in the planar direction with respect to both alternate electrode portions D that are parallel to one another. Accordingly, this embodiment can accomplish the same mode of operation as that of the fifth embodiment. In this case, since two rows of each the external electrodes 40d and 40e are disposed, the probability of compensation of any breakage can be improved.

(Eighth Embodiment)

Figure 23:
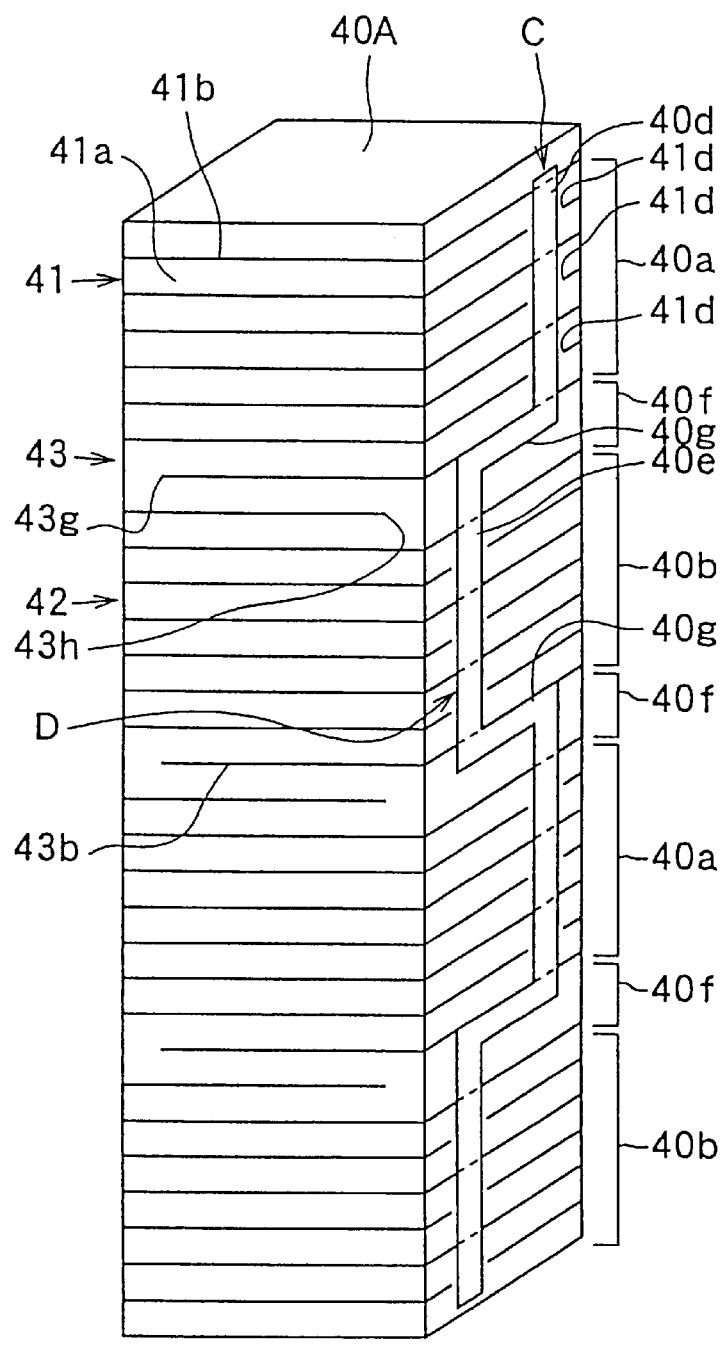
FIG. 23 is a perspective view showing a piezoelectric laminate body according to the eighth embodiment of the present invention.
Figure 24:
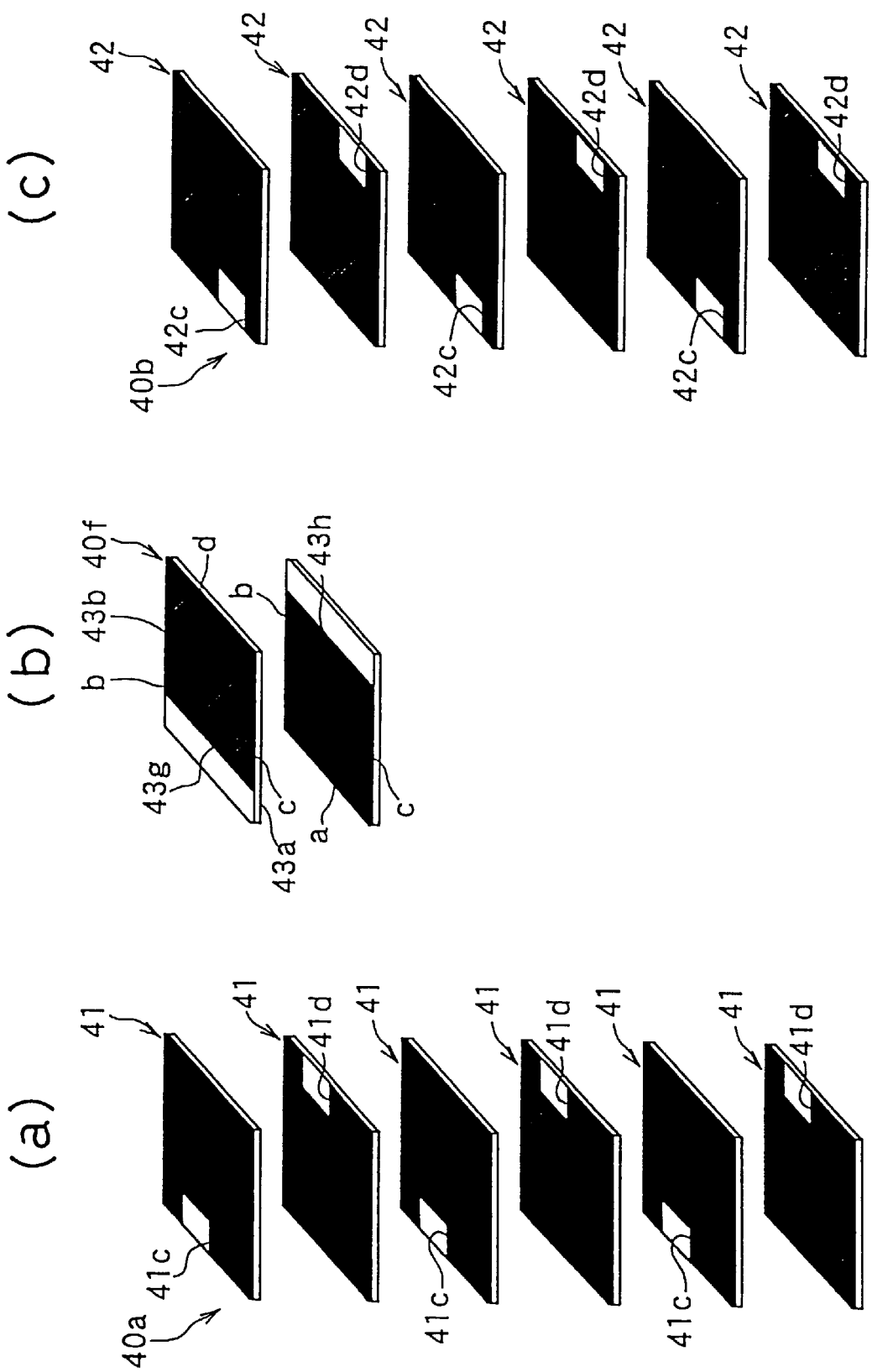
FIGS. 24(*a*), 24(*b*) and 24(*c*) are exploded perspective views of a unit laminate body, an inter-connection laminate body and the unit laminate body in the eighth embodiment.

FIGS. 23 and 24 show the piezoelectric laminate body according to the eighth embodiment of the present invention. In the fifth embodiment described above, this eighth embodiment employs an inter-connection laminate body 40f in place of the inter-connection laminate body 40c.

The structure of the inter-connection laminate body 40c is changed to form the inter-connection laminate body 40f in the following way (shown in FIG. 24(b)). In the upper laminate sheet 43 of the inter-connection laminate body 40c, a notch portion 43g is so formed in the electrode layer 43b as to extend from the opposed edge b to the opposed edge c in place of both notch portions 43c and 43d. In the lower laminate sheet 43 of the inter-connection laminate body 40c, a notch portion 43h is so formed as to extend from the opposed edge b to the opposed edge c in place of both notch portions 43e and 43f.

In the case of the unit laminate body 40a, the inter-connection laminate body 40f and unit laminate body 40b before baking, for example, the unit laminate body 40a, the inter-connection laminate body 40f and the unit laminate body 40b are serially laminated from above in this order, and the inter-connection laminate body 40f, the unit laminate body 40a, the inter-connection laminate body 40f, the unit laminate 40b, and so forth, are serially laminated below the former.

At this time, the notch portion 43g positioned on the left side of the inter-connection laminate body 40f overlaps with each notch portion 41c positioned on the left side of the unit laminate body 40a, and the notch portion 43h positioned on the right side of the inter-connection laminate body 40f overlaps with the notch portion 41d positioned on the right side of the unit laminate body 40a (see FIGS. 24(a) and (b)). The notch portion 43h positioned on the right side of the inter-connection laminate body 40f overlaps with each notch portion 42d positioned on the right side of the unit laminate body 40b (see FIGS. 24 (b) and (c)). Thereafter, the remaining unit laminate bodies and the inter-connection laminate bodies are laminated in the same way.

The piezoelectric laminate body thus laminated is subsequently baked in the same way as in the fifth embodiment. Consequently, the portions of both adjacent piezoelectric device sheets, which overlap with each other through both notch portions, are integrated. In this way, the production of the piezoelectric laminate body is completed (see FIG. 23).

Reference is to be made to FIG. 23 showing typically the fifth embodiment. Of both external electrodes 40d and 40e of the fifth embodiment, the electrode material is applied to, and baked on, the right side surface of the inter-connection laminate body 40f along the electrode layer 43b between the lower end portion of the external electrode 40d and the upper end portion of the external electrode 40e just outside the former, and between the lower end portion of the external electrode 40e and the upper end portion of the external electrode 40d just outside the former, giving the external electrodes 40g of the eighth embodiment, respectively. However, no difference is generated on the mode of operation even when the external electrode 40g and the electrode layer 43 overlap with, or are separated from, each other. Accordingly, the external electrodes 40d, 40g and 40e are formed and connected in the crank shape on both right and left surfaces of the piezoelectric laminate body as shown typically in FIG. 23. Incidentally, the external electrodes are formed similarly on the left side surface of the piezoelectric laminate body. The rest of the constructions are the same as in the fifth embodiment.

Unlike the fifth embodiment, the eighth embodiment having the construction described above employs the external electrodes that are continuous in the crank form. Since both alternate electrode portions C and D are deviated position-wise in the planar direction of the piezoelectric laminate body in the same way as in the fifth embodiment, the eighth embodiment can accomplish substantially the same mode of operation as that of the fifth embodiment.

(Ninth Embodiment)

Figure 25:
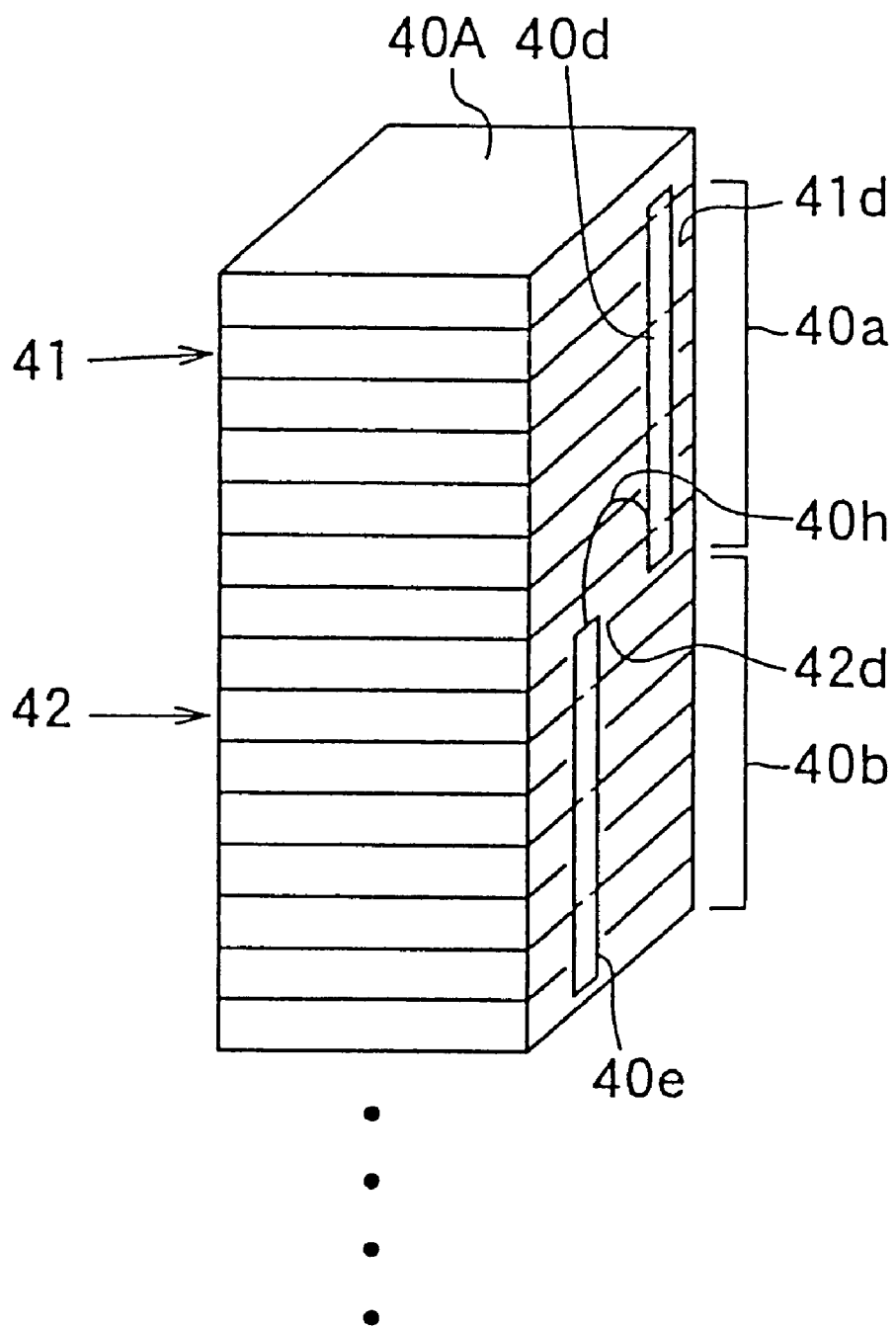
FIG. 25 is a perspective view showing a piezoelectric laminate body according to the ninth embodiment of the present invention.

FIGS. 25 and 26 show the piezoelectric laminate body according to the ninth embodiment of the present invention. In the piezoelectric laminate body of the eighth embodiment described above, the ninth embodiment does not use each inter-connection laminate body 40f but laminates alternately both unit laminate bodies 40a and 40b.

Unlike the eighth embodiment, each unit laminate body 41, 42 has one extra laminate sheet 41, 42 as shown in FIGS. 26(a) and (b). In each external electrode 40d, 40e described in the fifth embodiment, a wire 40h is connected to the right side surface of the piezoelectric laminate body by wire bonding between the lower end portion of the external electrode 40d and the upper end portion of the external electrode 40e just outside the former and between the lower end portion of the external electrode 40e and the upper end portion of the external electrode 40d just outside the former. Similarly, both external electrodes on the left side surface of the piezoelectric laminate body, too, are connected by wire bonding. The rest of the construction is the same as in the eighth embodiment described above.

The ninth embodiment having such a construction employs the wire 40h in place of the external electrode 40g described in the eighth embodiment. Therefore, this embodiment can accomplish substantially the same mode of operation as that of the eighth embodiment without depending on the inter-connection laminate body 40f.

(Tenth Embodiment)

Figure 27:
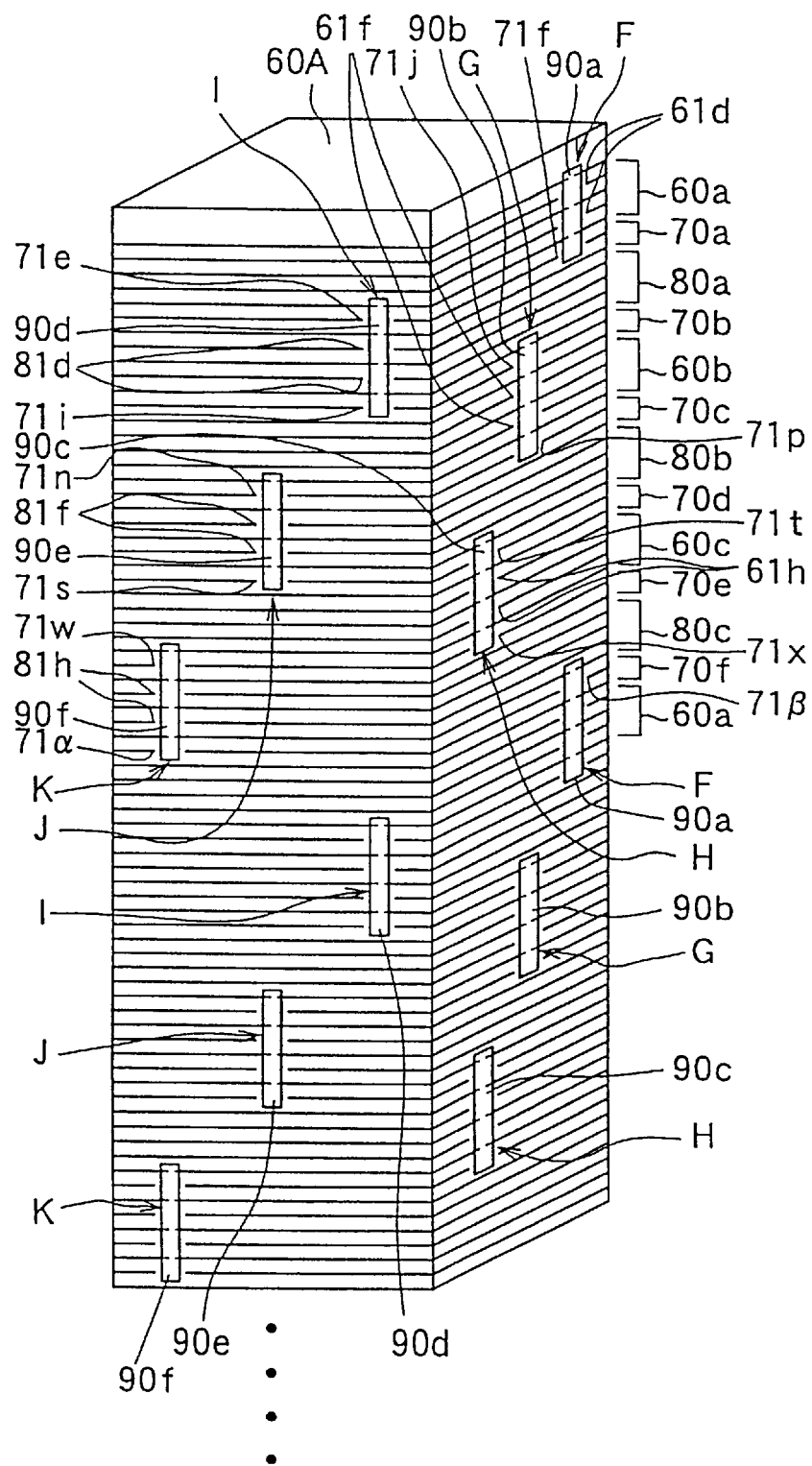
FIG. 27 is a perspective view showing a piezoelectric laminate body according to the tenth embodiment of the present invention.
Figure 28:
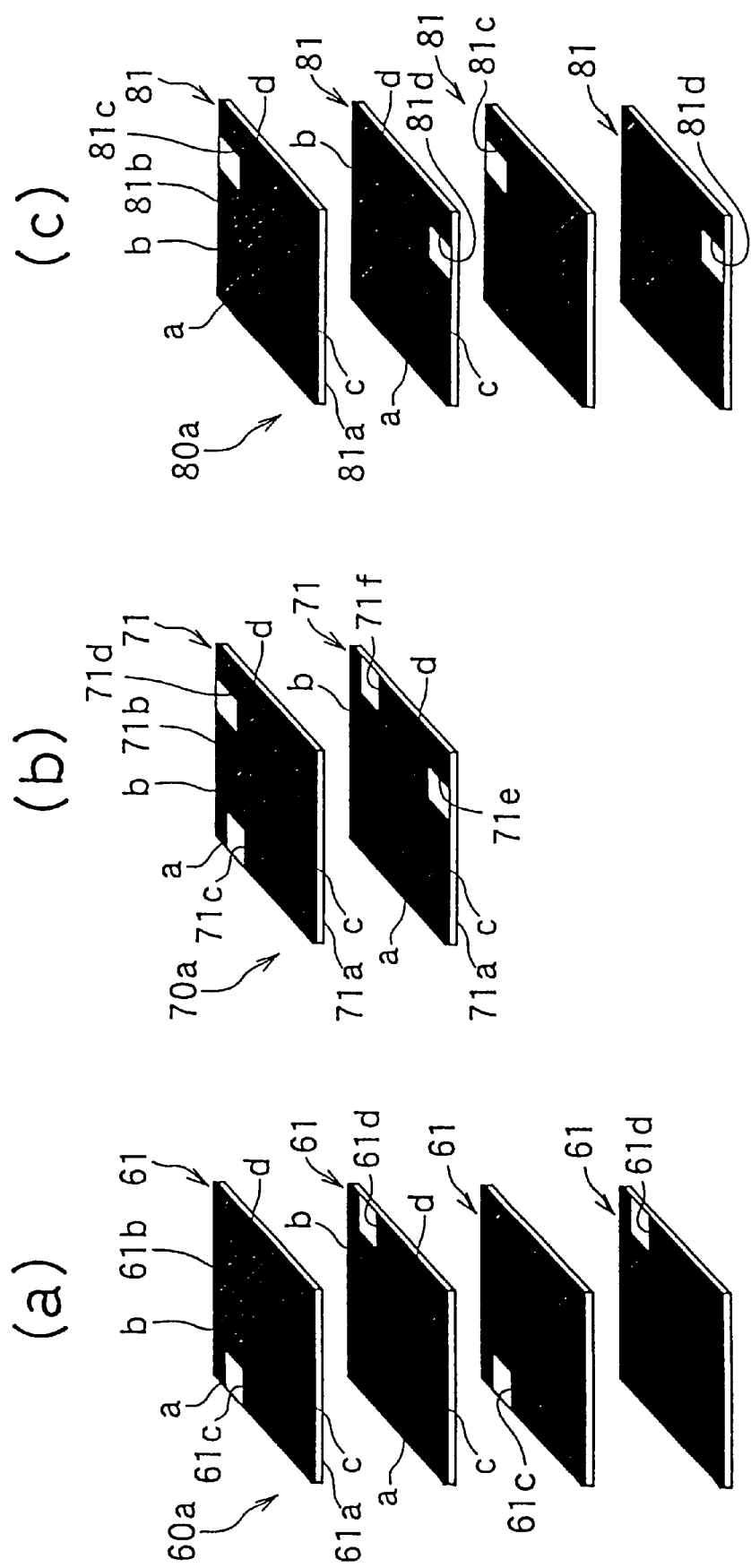
FIGS. 28(*a*), 28(*b*) and 28(*c*) are exploded perspective views of a unit laminate body, an inter-connection laminate body and the unit laminate body in the tenth embodiment.

FIGS. 27 to 31 show the piezoelectric laminate body according to the tenth embodiment of the present invention. The piezoelectric laminate body of the tenth embodiment includes a plurality of unit laminate bodies 60a to 60c and 80a to 80c and a plurality of inter-connection laminate bodies 70a to 70f as shown in FIG. 27.

In this piezoelectric laminate body are laminated serially the upper unit laminate body 60a, the inter-connection laminate body 70a, the unit laminate body 80a, the inter-connection laminate body 70b, the unit laminate body 60b, the inter-connection laminate body 70c, the unit laminate body 80b, the inter-connection laminate body 70d, the unit laminate body 60c, the inter-connection laminate body 70e, the unit laminate body 80c, the inter-connection laminate body 70f, the unit laminate body 60a, and so forth, in this order.

As shown in FIG. 28(a), the unit laminate body 60a includes four laminate sheets 61 that correspond to the four laminate sheets 41 from above in the unit laminate body 40a described in the fifth embodiment shown in FIG. 18(a). Each laminate sheet 61 of the unit laminate body 60a has the same structure as each corresponding laminate sheet 41. It has notch portions 61c and 61d corresponding to the notch portions 41c and 41d of the corresponding laminate sheet 41. Incidentally, the piezoelectric device sheet 61a of the laminate sheet 61 and its electrode layer 61b correspond to the piezoelectric device sheet 41a of the laminate sheet 41 and its electrode layer 41b, respectively.

As shown in FIG. 28(b), the inter-connection laminate body 70a comprises the laminate of both laminate sheets 71. Each laminate sheet 71 has a piezoelectric device sheet 71a and an electrode layer 71b corresponding to the piezoelectric device sheet 43a and the electrode layer 43b of each laminate sheet 43 of the inter-connection laminate body 40c of the fifth embodiment, respectively.

In the electrode layer 71b of the upper laminate sheet 71, a notch portion 71c is formed on the opposed edge a in such a manner as to correspond to the notch portion 61c of the electrode layer 61b of the laminate sheet, and a notch portion 71d is formed on the opposed edge b close to the opposed edge d as shown in FIG. 28(b). In the electrode layer 71b of the lower laminate sheet 71, a notch portion 71e is formed on the opposed edge a close to the opposed edge d, and a notch portion 71f is formed on the opposed edge d close to the opposed edge b as shown in FIG. 28(b).

The unit laminate body 80a includes a plurality of laminate sheets 81 as shown in FIG. 28(c). Each odd-numbered laminate sheet 81 of this unit laminate body 80a has a notch portion 81c on the opposed edge b corresponding to the notch portion 71d of the upper laminate sheet 71 of the inter-connection laminate body 70a. Each even-numbered laminate sheet 81 has a notch portion 81d on the opposed edge c corresponding to the notch portion 71e of the lower laminate sheet 71 of the inter-connection laminate body 70a.

As shown in FIG. 29(*a*), the inter-connection laminate body 70*b* has both laminate sheets 71. These laminate sheets 71 have a different structure from the laminate sheets 71 of the inter-connection laminate body 70*a* in the following point. The electrode layer 71*b* of the upper laminate sheet 71 of the inter-connection laminate body 70*b* includes both notch portions 71*g* and 71*h*. The notch portion 71*g* is formed at a center of the opposed edge a of the electrode layer 71*b* between both opposed edges b and c. The notch portion 71*h* is formed on the opposed edge b in such a manner as to correspond to the notch portion 71*d* of the laminate body 71 of the inter-connection laminate body 70*a*.

In the electrode layer 71*b* of the lower laminate sheet 71 of the inter-connection laminate body 70*b*, a notch portion 71*i* is formed on the opposed edge c in such a manner as to correspond to the notch portion 81*d* of the unit laminate body 80*a*, and a notch portion 71*j* is formed on the opposed edge d of the electrode layer 71*b* at the center between the opposed edges b and c.

The unit laminate body 60*b* has four laminate sheets 61 in the same way as the unit laminate body 60*a* as shown in FIG. 29(*b*). In each odd-numbered laminate sheet 61 of this unit laminate body 60*b*, the electrode layer 61*b* has, on its opposed end a, a notch portion 61*e* corresponding to the notch portion 71*g* of the inter-connection laminate body 70*b*. In each even-numbered laminate sheet 61 of the laminate sheets of the unit laminate body 60*b*, the electrode layer 61*b* has, on its opposed edge d, a notch portion 61*f* corresponding to the notch portion 71*f* of the inter-connection laminate body 70*b*.

As shown in FIG. 29(*c*), the inter-connection laminate body 70*c* has both laminate sheets 71. These laminate sheets 71 are different from the laminate sheets 71 of the inter-connection laminate body 70*b* in the following point. The electrode layer 71*b* of the upper laminate plate 71 of the inter-connection laminate body 70*c* includes both notch portions 71*k* and 71*m*, and the notch portion 71*k* is formed on the opposed edge a of the electrode layer 71*b* at the center between both opposed edges b and c. The notch portion 71*m* is formed on the opposed edge b of the electrode layer 71*b* at the center between both opposed edges a and d.

The electrode layer 71*b* of the lower laminate plate 71 of the inter-connection laminate body 70*c* includes both notch portions 71*n* and 71*p*. The notch portion 71*n* is formed on the opposed end c of the electrode layer 71*b* at the center between both opposed edges a and d. The notch portion 71*p* is formed on the opposed edge d of the electrode layer 71*b* at the center between both opposed edges b and c.

Figure 30:
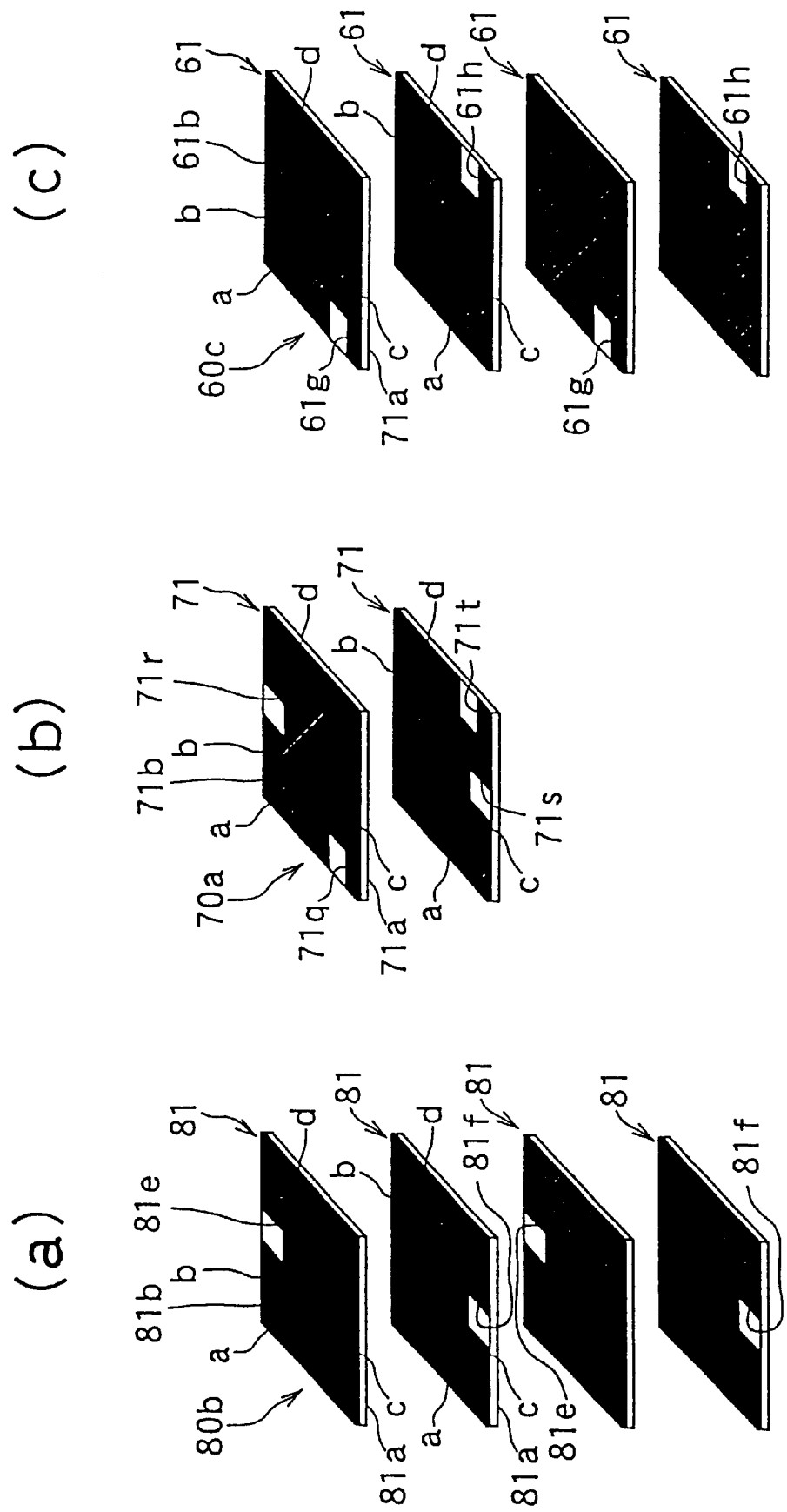
FIGS. 30(*a*), 30(*b*) and 30(*c*) are exploded perspective view of the unit laminate body, the inter-connection laminate body and the unit laminate body in the tenth embodiment.

The unit laminate body 80*b* includes a plurality of laminate sheets 81 as shown in FIG. 30(*a*). In each odd-numbered laminate sheet 81 of the unit laminate body 80*a*, the electrode layer 81*b* has a center notch portion 81*e* on the opposed edge b between the opposed edges a and d. In each even-numbered laminate sheet 81, the electrode layer 81*b* has a center notch portion 81*f* on the opposed edge c between the opposed edges a and d.

The inter-connection laminate body 70*d* has both laminate sheets 71 as shown in FIG. 30(*b*). The structure of both laminate sheets 71 is different from that of the laminate sheet 71 of the inter-connection laminate body 70*c* in the following point. The electrode layer 71*b* of the upper laminate sheet 71 of the inter-connection laminate body 70*d* has both notch portions 71*q* and 71*r*. The notch portion 71*q* is formed on the opposed edge a of the electrode layer 71*b* close to the opposed edge c. The notch portion 71*r* is formed on the opposed edge b at the center between opposed edges a and d.

The electrode layer 71*b* of the lower laminate sheet 71 of the inter-connection laminate body 70*d* has both notch portions 71*s* and 71*t*. The notch portion 71*s* is formed on the opposed edge c of the electrode 71*b* between both opposed edges a and d. The notch portion 71*t* is formed on the opposed edge d of the electrode layer 71*b* close to the opposed edge c.

The unit laminate body 60*c* has four laminate sheets 61 in the same way as the unit laminate body 60*b* as shown in FIG. 30(*c*). In each odd-numbered laminate sheet 61 among the laminate sheets of this unit laminate body 60*c*, the electrode layer 61*b* has a notch portion 61*g* on the opposed edge a close to the opposed edge c. In each even-numbered laminate sheet 61 among the laminate sheets of the unit laminate body 60*b*, the electrode layer 61*b* has a notch portion 61*h* corresponding to the notch portion 71*t* of the inter-connection laminate body 70*d*.

Figure 31:
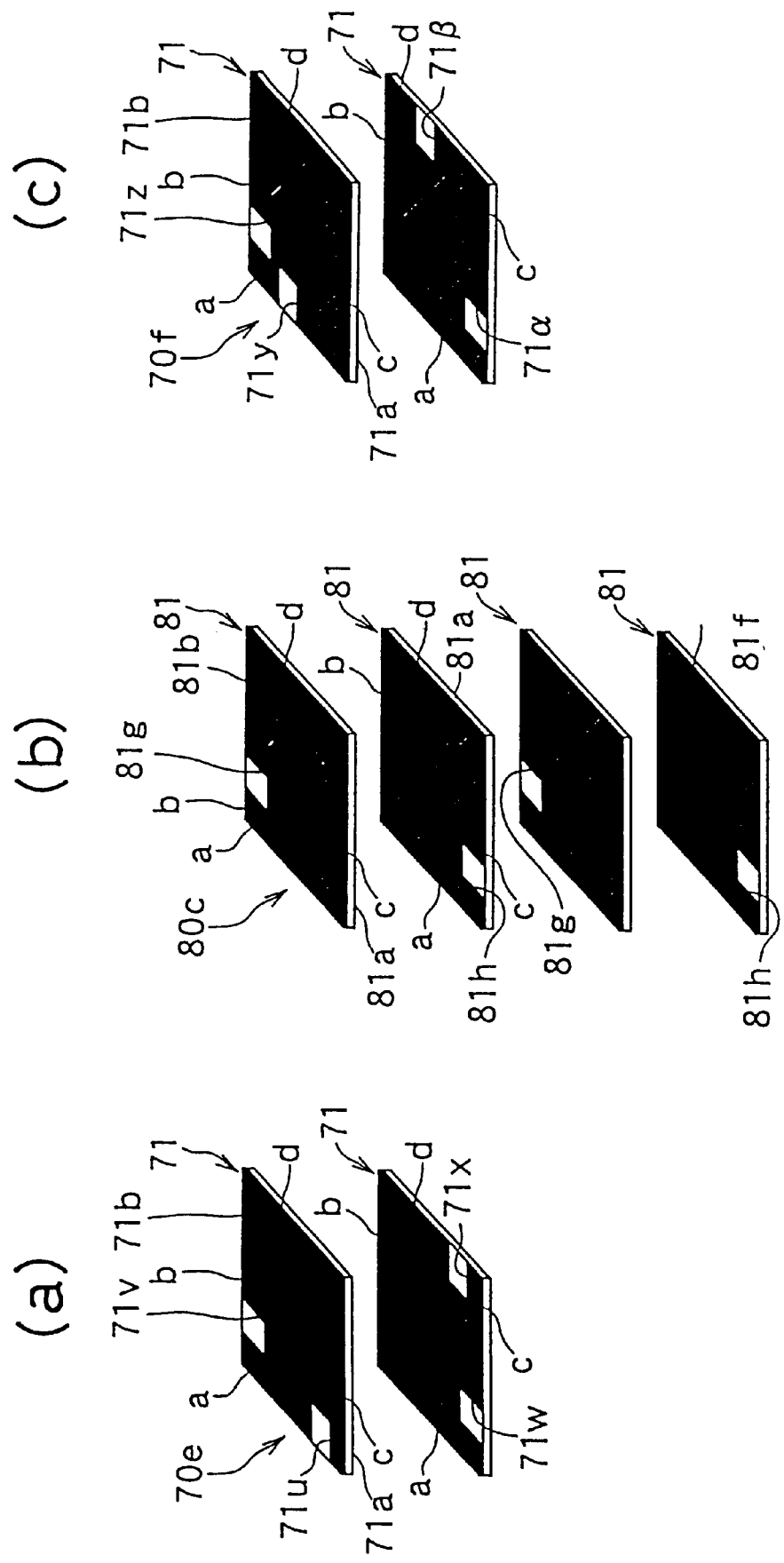
FIGS. 31(*a*), 31(*b*) and 31(*c*) are exploded perspective views of the inter-connection laminate body, the unit laminate body and the inter-connection laminate body in the tenth embodiment.

The inter-connection laminate body 70*e* has both laminate sheets 71 as shown in FIG. 31(*a*). The structure of these laminate sheets 71 is different from that of the laminate sheet 71 of the inter-connection laminate body 70*b* in the following point. The electrode layer 71*b* of the upper laminate sheet 71 of the inter-connection laminate body 70*c* has both notch portions 71*u* and 71*v*, and the notch portion 71*u* is formed on the opposed edge a of the electrode layer 71*b* close to the opposed edge c. The notch portion 71*v* is formed on the opposed edge b close to the opposed edge a.

In the electrode layer 71*b* of the lower laminate sheet 71 of the inter-connection laminate body 70*e*, the notch portion 71*w* is formed on the opposed edge d close to the opposed edge a, and the notch portion 71*x* is formed on the opposed edge d of the electrode layer 71*b* close to the opposed edge c.

The unit laminate body 80*c* has a plurality of laminate sheets 81 as shown in FIG. 31(*b*). In each odd-numbered laminate sheet 81 of this unit laminate body 80*c*, the electrode layer 81*b* has a notch portion 81*g* formed on the opposed edge b close to the opposed edge a. In each even-numbered laminate sheet 81, the electrode layer 81*b* has a notch portion 81*h* formed on the opposed edge c close to the opposed edge a.

The inter-connection laminate body 70*f* has both laminate sheets 71 as shown in FIG. 31(*c*). The structure of these laminate sheets 71 is different from that of the laminate sheets 71 of the inter-connection laminate body 70*e* in the following point. The electrode layer 71*b* of the upper laminate sheet 71 of the inter-connection laminate body 70*f* has both notch portions 71*y* and 71*z*. The notch portion 71*y* is formed on the opposed edge a of the electrode layer 71*b* close to the opposed edge b. The notch portion 71*z* is formed on the opposed edge b close to the opposed edge a.

In the electrode layer 71*b* of the lower laminate sheet 71 of the inter-connection laminate body 70*f*, a notch portion 71α is formed on the opposed edge c close to the opposed edge a, and a notch portion 71β is formed on the opposed edge d close to the opposed edge b.

When the piezoelectric laminate body is constituted as shown in FIG. 27, it has the following construction. The portion of the unit laminate body of this piezoelectric laminate body corresponding to each notch portion 61*d* of the unit laminate body 60*a* and to the notch portion 71*f* of the inter-connection laminate body 70*a* (hereinafter called the "alternate electrode portions F"), the portion corresponding to the notch portion 71*j* of the inter-connection laminate body 70*b* and to each notch portion 61*f* of the unit laminate body 60*b* (hereinafter called the "alternate electrode portion G"), and the portion corresponding to the notch portion 71*t* of the inter-connection laminate body 70d and to each notch portion 61h of the unit laminate body 60c (hereinafter called the "alternate electrode portion H"), are deviated position-wise serially and obliquely downward in the planar direction on the right side surface of the piezoelectric laminate body.

In this piezoelectric laminate body, the portions corresponding to the notch portion 71e of the inter-connection laminate body 70a and to each notch portion 81d of the unit laminate body 80a (hereinafter called the "alternate electrode I"), the portion corresponding to the notch portion 71n of the inter-connection laminate body 70c and to each notch portion 81f of the unit laminate body 80b (hereinafter called the "alternate electrode portion J"), the portion corresponding to the notch portion 71w of the inter-connection laminate body 70e and to each notch portion 81h of the unit laminate body 80c, and the portion corresponding to the notch portion 71α of the inter-connection laminate body 70f (hereinafter called the "alternate electrode portion K"), are deviated position-wise serially and obliquely downward in the planar direction of the front side surface of the piezoelectric laminate body. Incidentally, alternate electrode portions analogous to the alternate electrode portions F, G and H and to the alternate electrode portions I, J and K are similarly formed on the left side surface and the rear side surface of the piezoelectric laminate body.

External electrodes 90a, 90b and 90c, that are made of the same material and formed by the same method as those of the fifth embodiment, are formed at positions on the right side surface of the piezoelectric laminate body corresponding to the positions of the alternate electrode portions F, G and H, respectively.

In the tenth embodiment of the present invention having the construction described above, the alternate electrode portions F, G, H, I, J and K are separately positioned for the corresponding unit laminate bodies and inter-connection laminate bodies, respectively. When the electric field is applied to the piezoelectric laminate body from between the uppermost unit laminate body and the lowermost unit laminate body in the same way as in the fifth embodiment, the difference of the quantity of displacement occurring in the boundary between the alternate electrode portion of the unit laminate body and the center electrode portion of the unit laminate body remains a sufficiently small value as the value for each unit laminate body.

Here the alternate electrode portion of an upper unit laminate body and that of a lower unit laminate body just below the former are not positioned on the same surface but on the different surfaces among the surfaces of the unit laminate body in the laminating direction. Therefore, the difference of the quantity of displacement is dispersed towards the different surface sides of each unit laminate body and is mitigated. Consequently, the prevention of cracks in the boundary can be further secured, and the mode of operation described in the fifth embodiment can be further improved.

(Eleventh Embodiment)

Figure 32:
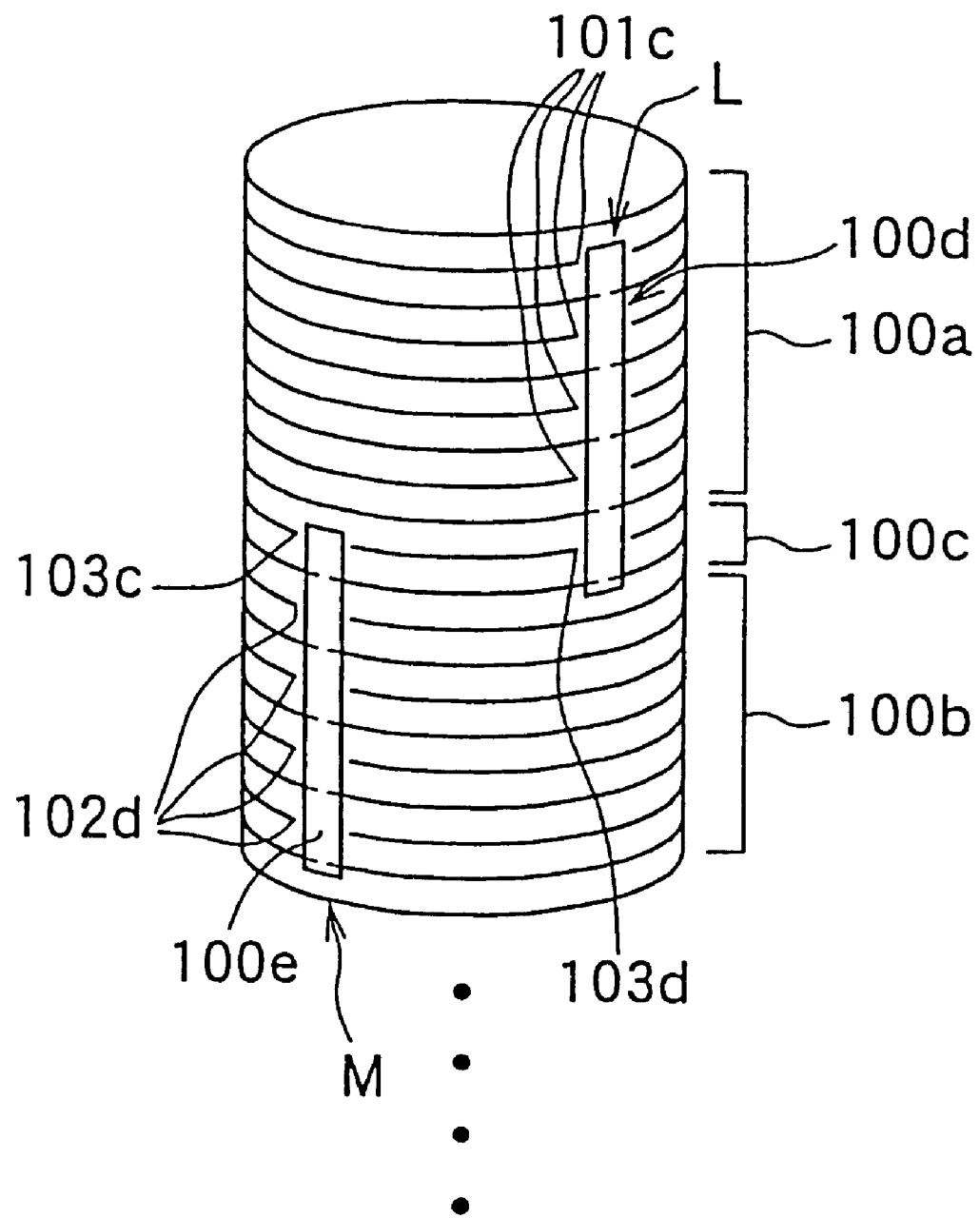
FIG. 32 is a perspective view showing a piezoelectric laminate body according to the eleventh embodiment of the present invention.
Figure 33:
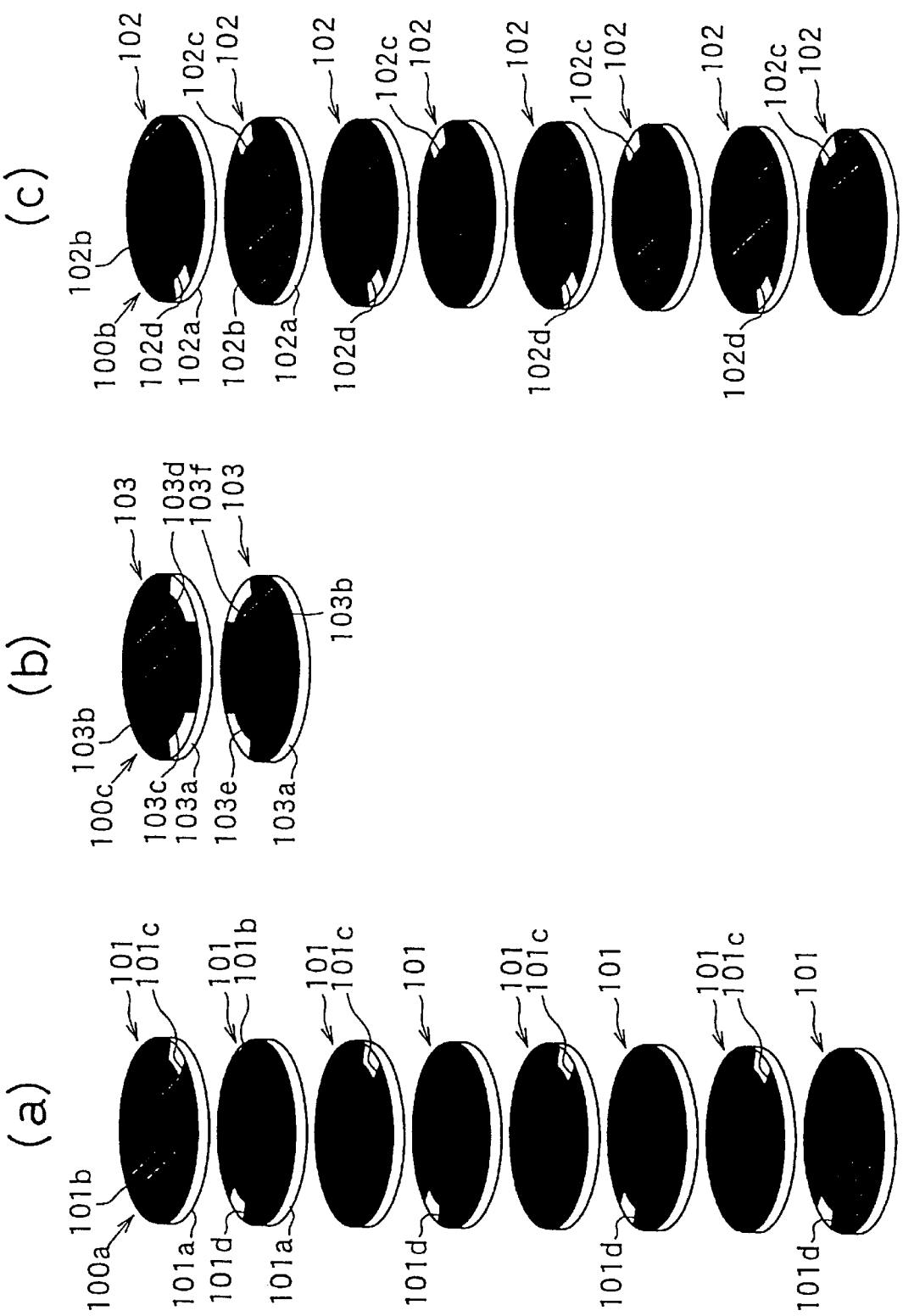
FIGS. 33(*a*), 33(*b*) and 33(*c*) are exploded perspective views of a unit laminate body, an inter-connection laminate body and the unit laminate body in the eleventh embodiment.

FIGS. 32 and 33 show the piezoelectric laminate body according to the eleventh embodiment of the present invention. In the eleventh embodiment, the piezoelectric laminate body has a circular cylindrical shape unlike the piezoelectric laminate body of the fifth embodiment (see FIG. 17). This piezoelectric laminate body comprises unit laminate bodies 100a and 100b and an inter-connection laminate body 100c, that correspond to the unit laminate bodies 40a and 40b and the inter-connection laminate body 40c, respectively, and are laminated in substantially in the same way as in the fifth embodiment.

The unit laminate body 100a comprises a plurality of laminate sheets 101 that are laminated with one another. Each laminate sheet 101 comprises a circular disk-like piezoelectric device sheet 101a and an electrode layer 101b formed on this piezoelectric device sheet 101a. The piezoelectric device sheet 101a is made of a piezoelectric ceramic material in the same way as the piezoelectric device sheet 41a described in the fifth embodiment.

As shown in FIG. 33(a), each odd-numbered electrode layer 101 from above has a notch portion 101c, and this notch portion 101c is formed from the outer peripheral edge of the corresponding electrode layer 101b in the direction shown in FIG. 33(a). Each even-numbered electrode layer 101b from above in FIG. 33(a) has a notch portion 101d, and this notch portion 101d is so formed from the outer peripheral edge of the corresponding electrode layer 101b as to oppose the notch portion 101c.

Each unit laminate body 100b comprises the laminate of a plurality of laminate sheets 102. Each laminate sheet 102 comprises a circular disk-like piezoelectric device sheet 102a and an electrode layer 102b formed on this piezoelectric device sheet 102a. The piezoelectric device sheet 102a is made of a piezoelectric material in the same way as the piezoelectric device sheet 41a described in the fifth embodiment.

Each odd-numbered electrode layer 102b from above in FIG. 33(c) has a notch portion 102d, and this notch portion 102d is formed from the outer peripheral edge of the corresponding electrode layer 102b in the direction shown in FIG. 33(c). Each even-numbered electrode layer 102b from above in FIG. 33(c) has a notch portion 102c, and this notch portion 102c is formed from the outer peripheral edge of the corresponding electrode layer 102b in such a manner as to oppose the notch portion 102d. Incidentally, the plane passing through the center of each notch portion 101c, 101d in the laminating direction crosses, at right angles, the plane passing through the center of each not portion 102c, 102d in the laminating direction.

The inter-connection laminate body 100c comprises the laminate of both laminate sheets 103. Each laminate sheet 103 comprises a circular disk-like piezoelectric device sheet 103a and an electrode layer 103b formed on this piezoelectric device sheet 103a. The piezoelectric device sheet 103a is made of a piezoelectric ceramic material in the same way as the piezoelectric device sheet 41a. The upper electrode layer 103b has both notch portions 103c and 103d as shown in FIG. 33(b), and these notch portions 103c and 103d are formed from the outer peripheral edge of the electrode layer 103b at positions corresponding to the notch portion 102d of the unit laminate body 100b and the notch portion 101c of the unit laminate body 100a, respectively.

As shown in FIG. 33(b), the lower electrode layer 103b has both notch portions 103e and 103f. These notch portions 103e and 103f are formed from the outer peripheral edge of the electrode layer 103b at positions corresponding to the notch portion 101d of the unit laminate body 100a and the notch portion 102c of the unit laminate body 100b, respectively. The remaining unit laminate bodies and inter-connection laminate bodies are formed in the same way.

When these members are laminated to form the piezoelectric laminate body, the portion of this piezoelectric laminate body corresponding to each notch portion 101c of the unit laminate body 100a and the notch portion 103d of the inter-connection laminate body 100c (hereinafter called the "alternate electrode portion L") and the portion corresponding to the notch portion 103c of the inter-connection laminate body 100c and to each notch portion 102d of the unit laminate body 100b (hereinafter called the "alternate electrode portion M") are deviated from each other positionwise obliquely downward along the outer peripheral surface of the piezoelectric laminate body. Similar alternate electrode portions L and M of the piezoelectric laminate body are positioned on the back of the sheet of the drawing. Incidentally, reference numerals 100d and 100e in FIG. 32 denote external electrodes.

In the eleventh embodiment of the present invention having the construction described above, the alternate electrode portions L and M are separately positioned for the corresponding unit laminate bodies and interconnection laminate bodies. When the electric field is applied to this piezoelectric laminate body from between the uppermost unit laminate body and the lowermost unit laminate body in the same way as in the fifth embodiment, the difference of the quantity of displacement occurring in the boundary between the alternate electrode portion of the unit laminate body and the center electrode portion of the unit laminate body remains a sufficiently small value as the value for each unit laminate body. As a result, the cracks do not occur in the boundary in the same way as in the fifth embodiment.

(Twelfth Embodiment)

Figure 34:
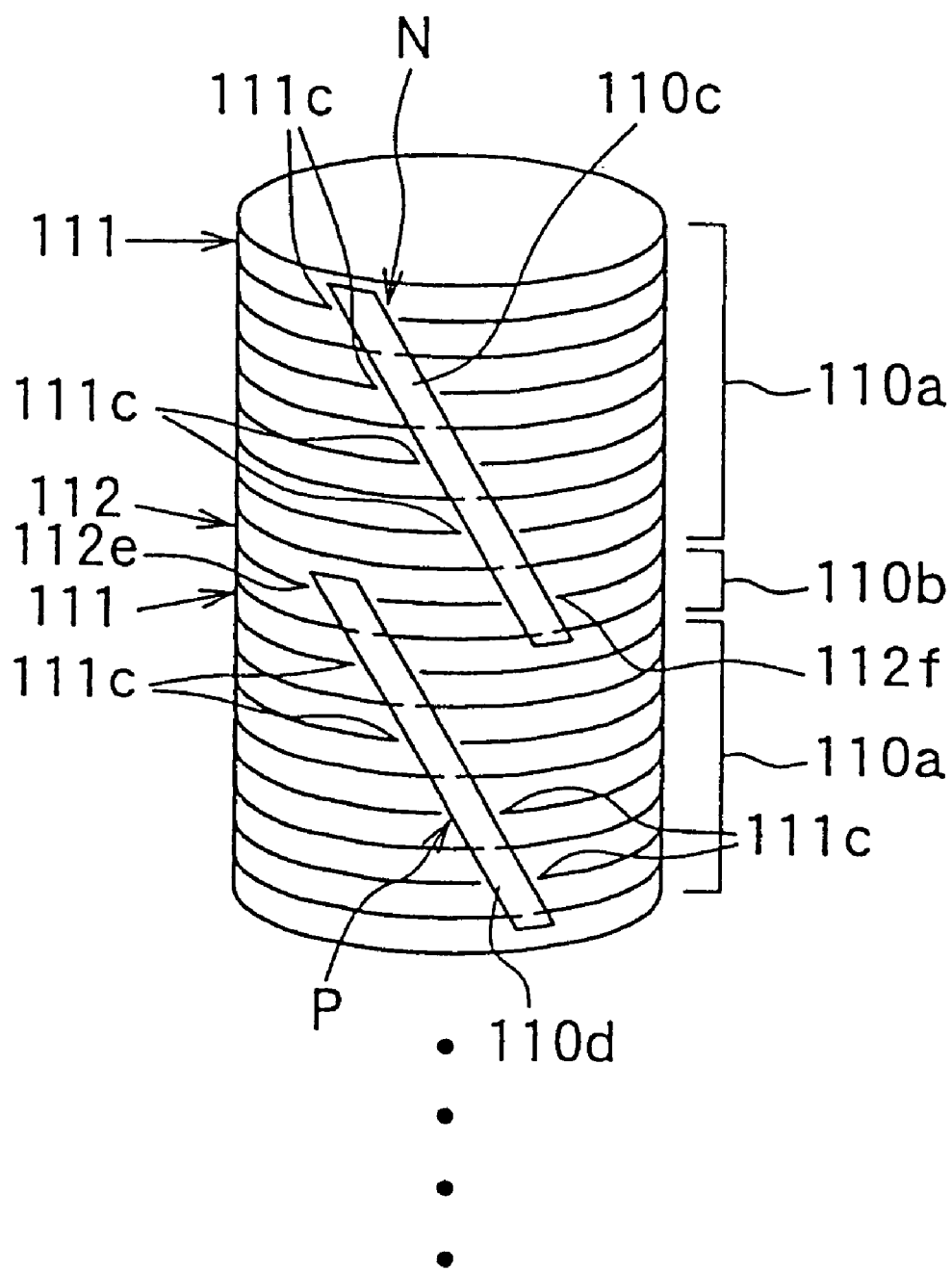
FIG. 34 is a perspective view showing a piezoelectric laminate body according to the twelfth embodiment of the present invention.
Figure 35:
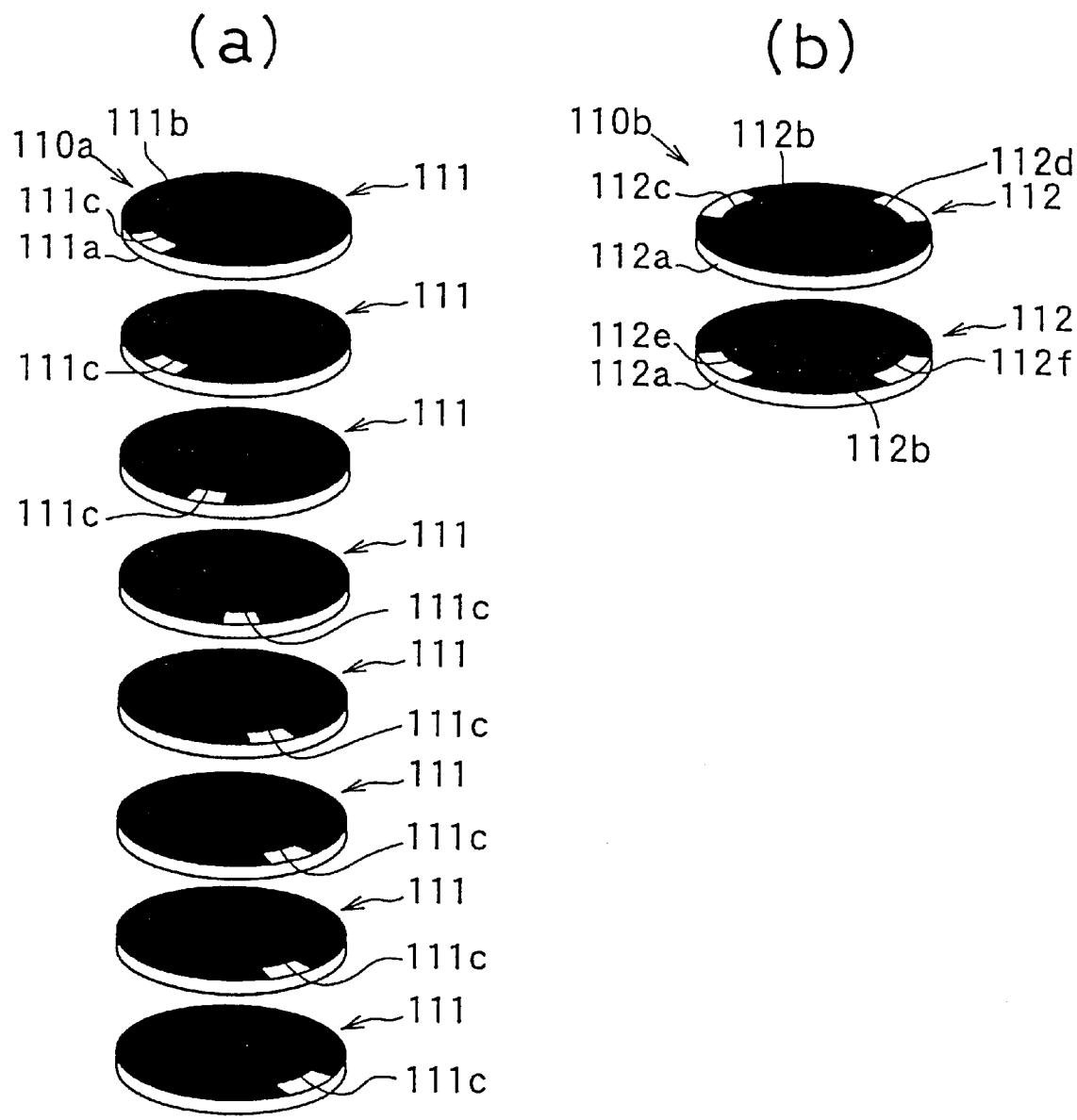
FIGS. 35(*a*) and 35(*b*) are exploded perspective views showing a unit laminate body and an inter-connection laminate body in the twelfth embodiment.

FIGS. 34 and 35 show the piezoelectric laminate body according to the twelfth embodiment of the present invention. In this twelfth embodiment, the piezoelectric laminate body has a circular cylindrical shape. The piezoelectric laminate body is formed when the unit laminate bodies 110a and the inter-connection laminate bodies 110b are alternately laminated from above to below as shown in FIG. 34. Incidentally, FIG. 34 shows only one unit laminate body 110a and one inter-connection laminate body 110b for convenience.

The unit laminate body 110a comprises a laminate of a plurality of laminate sheets 111 that are laminated with one another. Each laminate sheet 111 comprises a circular disk-like piezoelectric device sheet 111a and an electrode layer 111b formed on this piezoelectric device sheet. The piezoelectric device sheet 111a is made of a piezoelectric ceramic material in the same way as the piezoelectric device sheet 41a described in the fifth embodiment. Each electrode layer 111b has a notch portion 111c, and this notch portion 111c is formed from the outer peripheral edge of the corresponding layer 111b as shown in FIG. 35(a). However, the angular positions of the notch portions 111c of the electrode layers 111b are serially deviated counter-clockwise from above to below as shown in FIG. 35(a).

The inter-connection laminate body 110b comprises a laminate of both laminate sheets 112 as shown in FIG. 35(b). Each laminate sheet 112 comprises a circular disk-like piezoelectric device sheet 112a and an electrode layer 112b formed on this piezoelectric device sheet. The piezoelectric device sheet 112a is made of a piezoelectric ceramic material in the same way as the piezoelectric device sheet 111a. The upper electrode layer 112b has both notch portions 112c and 112d as shown in FIG. 35(b). These notch portions 112c and 112d are formed from the back of the sheet of the drawing of the outer peripheral edge of the electrode layer 112b. Incidentally, both notch portions 112c and 112d are formed at mutually separate positions with a predetermined angle between them.

The lower electrode layer 112b has both notch portions 112e and 112f as shown in FIG. 35(b), and these notch portions 112e and 112f are formed from the surface portion of the sheet of the drawing along the outer peripheral edge of the electrode layer 112b. Incidentally, these notch portions 112e and 112f are formed at positions opposing both notch portions 112c and 112d, respectively. Reference numerals 110c and 110d in FIG. 34 denote external electrodes.

When these members are laminated to form the piezoelectric laminate body as shown in FIG. 34, the portion of the piezoelectric laminate body corresponding to the notch portion 111c of the unit laminate body 110a and the notch 112f of the inter-connection laminate body 110b just below the former (hereinafter called the "alternate electrode portion N") and the portion corresponding to the notch portion 112e of the inter-connection laminate body 110b and each notch portion 111c of the unit laminate body 110a immediate below the former (hereinafter called the "alternate electrode portion P") from the uppermost unit laminate body 110a to the lowermost unit laminate body 110a in each unit laminate body are laminated while their positions are deviated from each other obliquely in the planar direction along the outer peripheral surface of the piezoelectric laminate body (see FIG. 34). Incidentally, both alternate electrode portions N and P are formed similarly on the outer peripheral portion of the piezoelectric laminate body on the back of the drawing.

Therefore, the alternate electrode portions N and P are separated from each other and are not positioned continuously in the laminating direction inside the piezoelectric laminate body. When the electric field is applied to the piezoelectric laminate body from between the uppermost unit laminate body 110a and the lowermost unit laminate body in the same way as in the fifth embodiment, the mode of operation can be accomplished in substantially the same way as in the sixth embodiment.

In this embodiment, the inter-connection laminate body sandwiched between both unit laminate bodies establishes electric conduction between them. Therefore, the mode of operation described above can be accomplished without using the construction in which both unit laminate bodies are electrically connected by lead wires such as wires.

(Thirteenth Embodiment)

Figure 36:
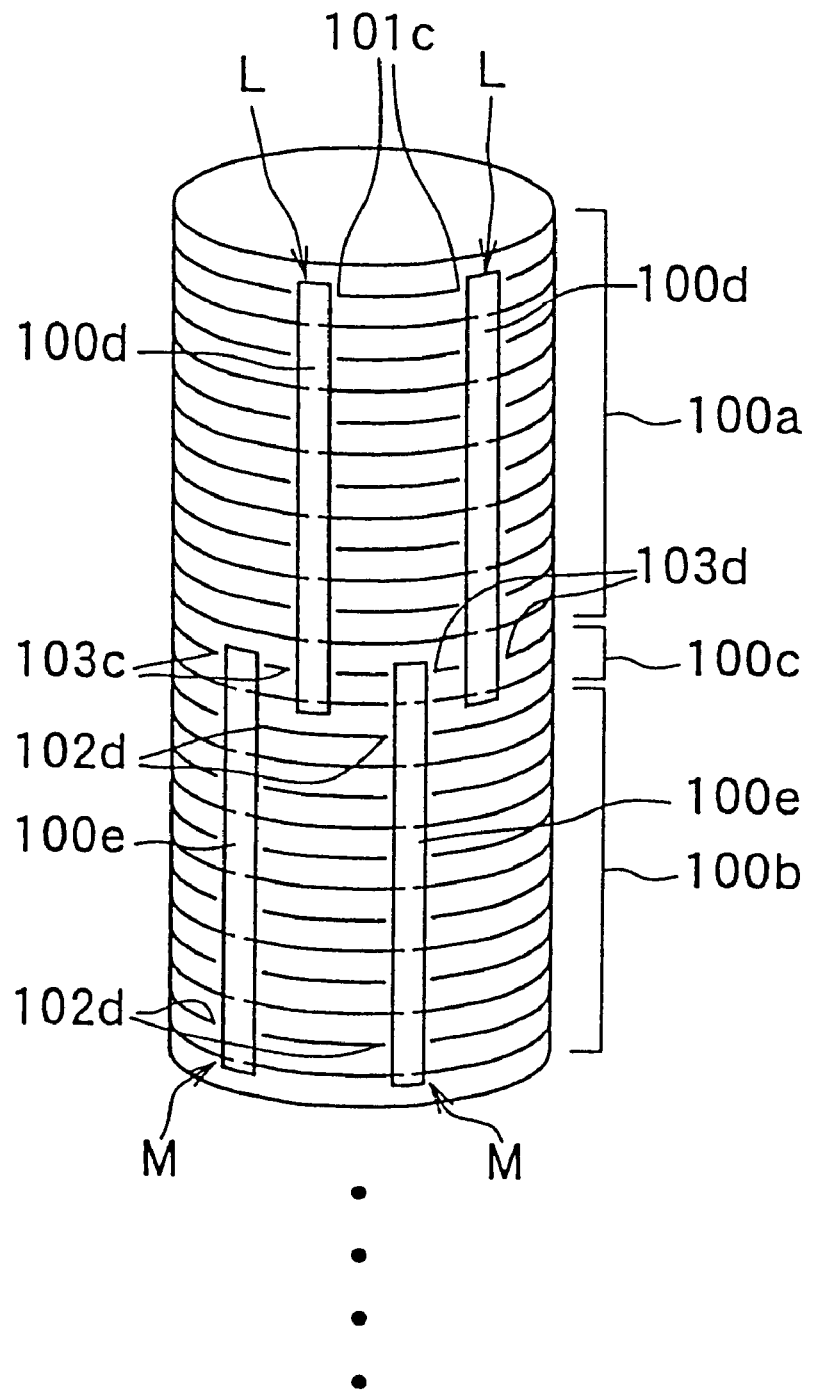
FIG. 36 is a perspective view showing a piezoelectric laminate body according to the thirteenth embodiment of the present invention.
Figure 37:
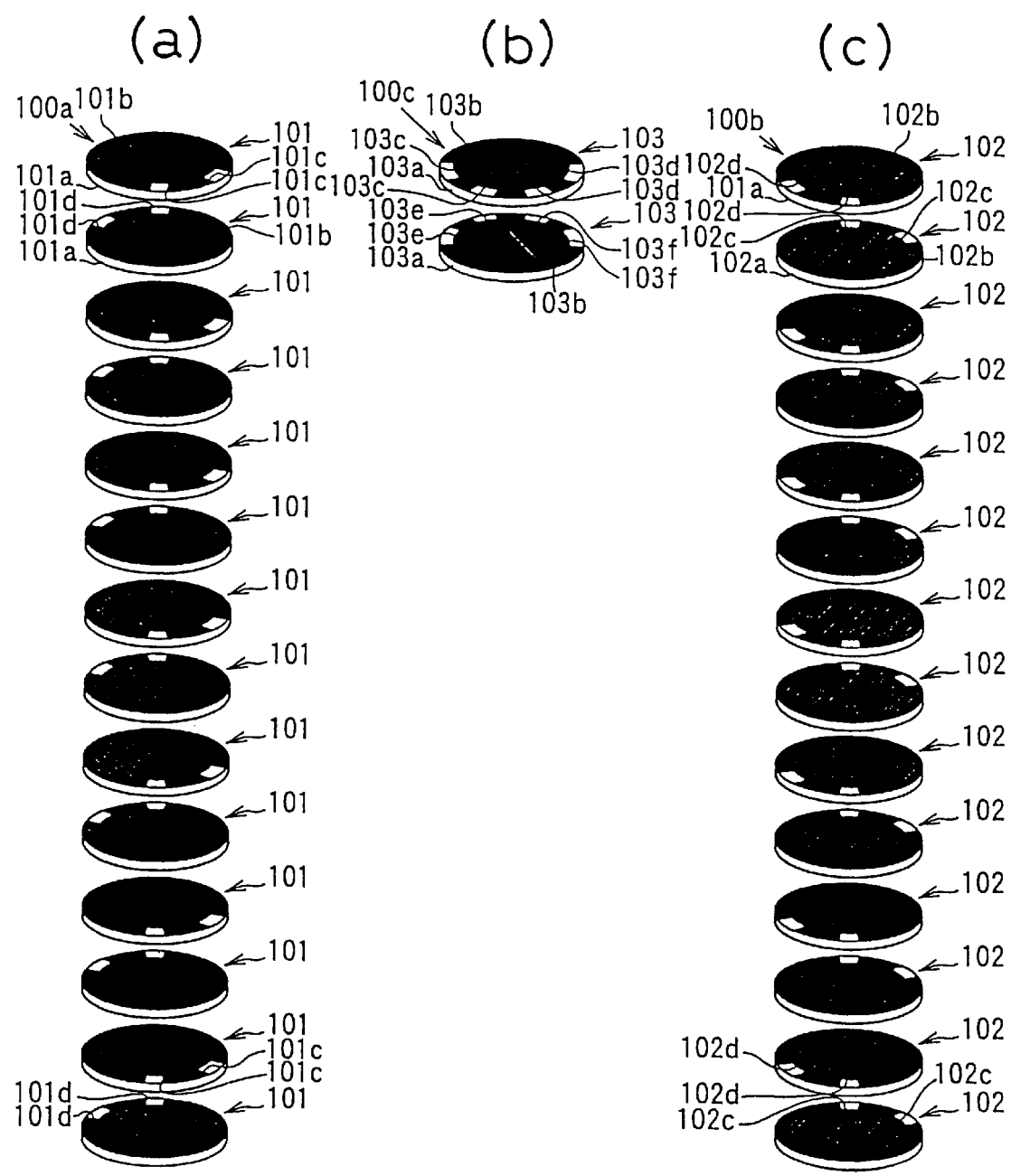
FIGS. 37(*a*), 37(*b*) and 37(*c*) are exploded perspective view of a unit laminate body, an inter-connection laminate body and the unit laminate body in the thirteenth embodiment.

FIGS. 36 and 37 show the piezoelectric laminate body according to the thirteenth embodiment of the present invention. In the eleventh embodiment described above, this thirteenth embodiment disposes two lines of alternate electrode portions L and M in parallel with one another, respectively, on the outer peripheral surface of the piezoelectric laminate body, and two lines of external electrodes 100d and 100e are similarly disposed in parallel with one another, respectively.

In the unit laminate body 100a, therefore, two notch portions 101c are formed in the spaced-apart relation in the electrode layer 101b of each odd-numbered laminate sheet 101 from the surface portion of the drawing in the outer peripheral edge of the electrode layer 101b as shown in FIG. 37(a). Similarly, two notch portions 101d are formed in the spaced-apart relation from the back of the sheet of the drawing in the outer peripheral edge of the electrode layer 101b of each even-numbered laminate sheet 101 in such a manner as to correspond to the notch portions 101c, respectively.

As shown in FIG. 37(C), two notch portions 102d are formed in the spaced-apart relation from the surface of the sheet of the drawing in the outer peripheral edge of the electrode layer 102b of each odd-numbered laminate sheet 102 of the unit laminate body 100b. Similarly, two notch portions 102c are formed in the spaced-apart relation from the back of the sheet of the drawing in the outer peripheral edge of the electrode layer 42b of each even-numbered laminate sheet 102 in such a manner as to correspond to the notch portions 102d, respectively. The rest of the constructions are substantially the same as the construction of the eleventh embodiment.

In the thirteenth embodiment having the construction described above, the mutually parallel alternate electrode portions L are positioned in such a fashion that they deviate from the mutually parallel alternate electrode portions M for each unit laminate body in the planar direction along the outer peripheral surface of the piezoelectric body. This embodiment, too, can accomplish the same mode of operation as that of the eleventh embodiment.

(Fourteenth Embodiment)

Figure 38:
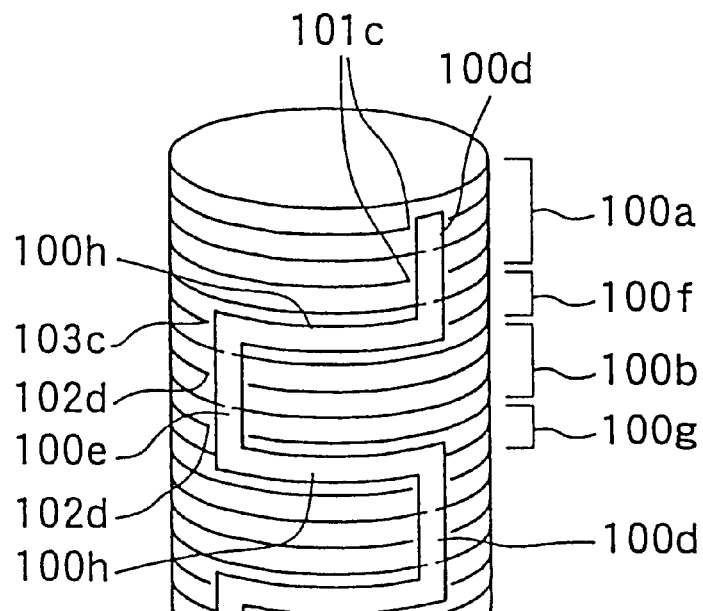
FIG. 38 is a perspective view showing a piezoelectric laminate body according to the fourteenth embodiment of the present invention.
Figure 39:
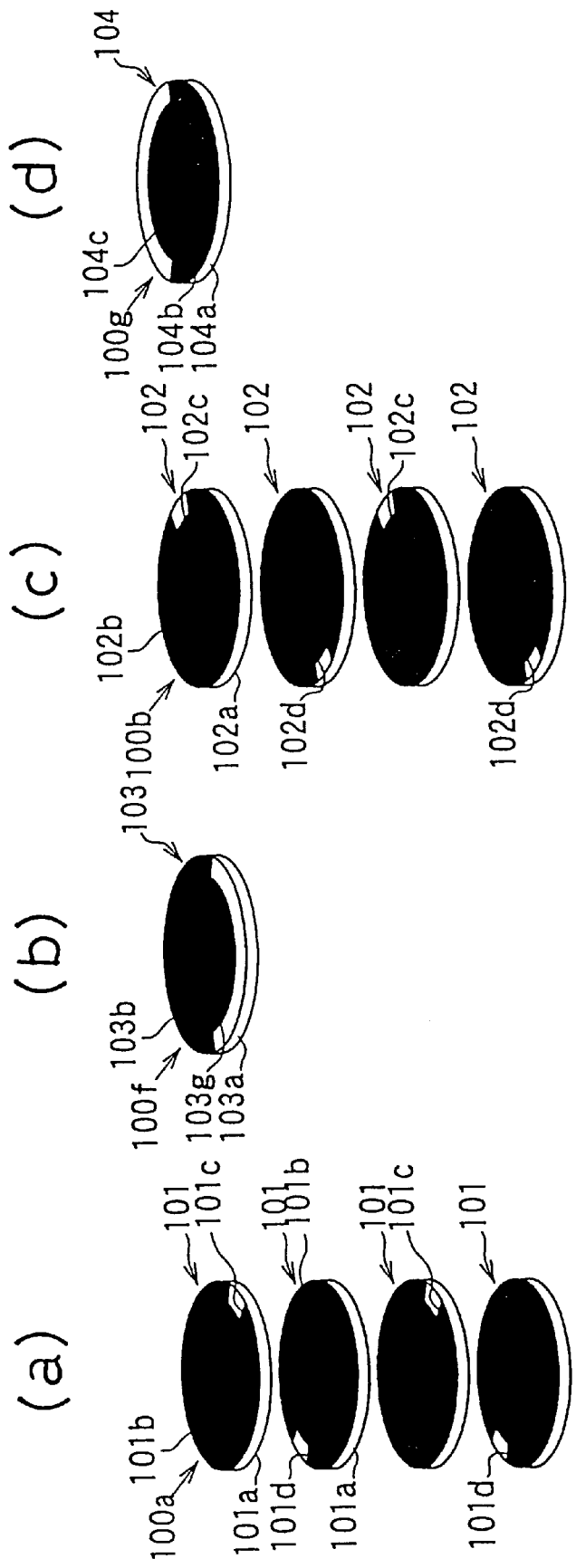
FIGS. 39(*a*), 39(*b*), 39(*c*) and 39(*d*) are exploded perspective views of a unit laminate body, an inter-connection laminate body, the unit laminate body and the inter-connection laminate body in the fourteenth embodiment.

FIGS. 38 and 39 show the piezoelectric laminate body according to the fourteenth embodiment of the present invention. In the eleventh embodiment described above, the fourteenth embodiment uses both inter-connection laminate bodies 100f and 100g in place of the inter-connection laminate body 100c.

The inter-connection laminate body 100f comprises a laminate sheet 103 corresponding to the upper laminate sheet 103 of the inter-connection laminate body 100c described above. This laminate sheet 103 has a notch portion 103g in place of both notch portions 103c and 103d. This notch portion 103g is formed into an arcuate shape from the surface portion of the sheet of the drawing in the outer peripheral edge of the electrode layer 103 as shown in FIG. 39(b).

The inter-connection laminate body 100g comprises a laminate sheet 104 corresponding to the lower laminate sheet 103 of the inter-connection laminate body 100c described above. In this laminate sheet 104, the electrode layer 104b has a notch portion 104c in place of both notch portions 103e and 103f. The notch portion 104c is formed into an arcuate shape from the back of the sheet of the drawing in the outer peripheral edge of the electrode layer 104 in such a manner as to correspond to the notch portion 103g as shown in FIG. 39(c). Incidentally, the unit laminate body 100b has the construction in which the uppermost laminate sheet 102 of the unit laminate body 100b of the eleventh embodiment is omitted.

As to the unit laminate body 100a, the inter-connection laminate body 100f, the unit laminate body 100b and the inter-connection laminate body 100g before baking shown in FIG. 39, such as the unit laminate body 100a, the inter-connection laminate body 100f, the unit laminate body 100b and the inter-connection laminate body 100g are laminated serially from above in this order, and lamination is thereafter conducted in the same sequence.

At this time, the right end of the notch portion 103g of the inter-connection laminate body 100f overlaps with each notch portion 101c of the unit laminate body 100a, and the left end of the notch portion 103g of the inter-connection laminate body 100f overlaps with each notch portion 102d of the unit laminate body 100b (see FIGS. 39(a), (b) and (c)).

The left end of the notch portion 104C of the inter-connection laminate body 100g overlaps with each notch portion 102d of the unit laminate body 100b, and the right end of this notch portion 104c overlaps with each notch portion 102c of the unit laminate body 100b (see FIGS. 39(a), (b), (c) and (d)). Thereafter, the remaining unit laminate bodies and inter-connection laminate bodies are similarly laminated.

The piezoelectric laminate body thus laminated is then baked in the same way as in the eleventh embodiment. In consequence, the portions of both piezoelectric device sheets that overlap with each other through both notch portions are integrated. The production of the piezoelectric laminate body is completed (see FIG. 38).

As typically shown in FIG. 38, an electrode material is applied and baked in the same way as in the eleventh embodiment between the lower end portion of the external electrode 100d and the upper end portion of the external electrode 100e just below the former among both electrodes 100d and 100e described in the eleventh embodiment and between the lower end portion of the external electrode 100e and the upper end portion of the external electrode 100d just below the former, on the outer peripheral surface of each inter-connection laminate body 100f, 100g along the electrode layers 103b and 104b, thereby forming the external electrode 100h.

In consequence, the external electrodes 100d, 100h and 100e are formed and connected in the crank shape as shown in FIG. 38 on the outer peripheral surface of the piezoelectric laminate body. Incidentally, the external electrodes are similarly formed on the back portion of the sheet of the drawing in FIG. 38. The rest of the constructions are the same as the construction of the eleventh embodiment.

The fourteenth embodiment having the construction described above employs the external electrode that continues in the crank shape, unlike the eleventh embodiment. However, it provides substantially the same mode of operation as that of the eleventh embodiment.

(Fifteenth Embodiment)

Figure 40:
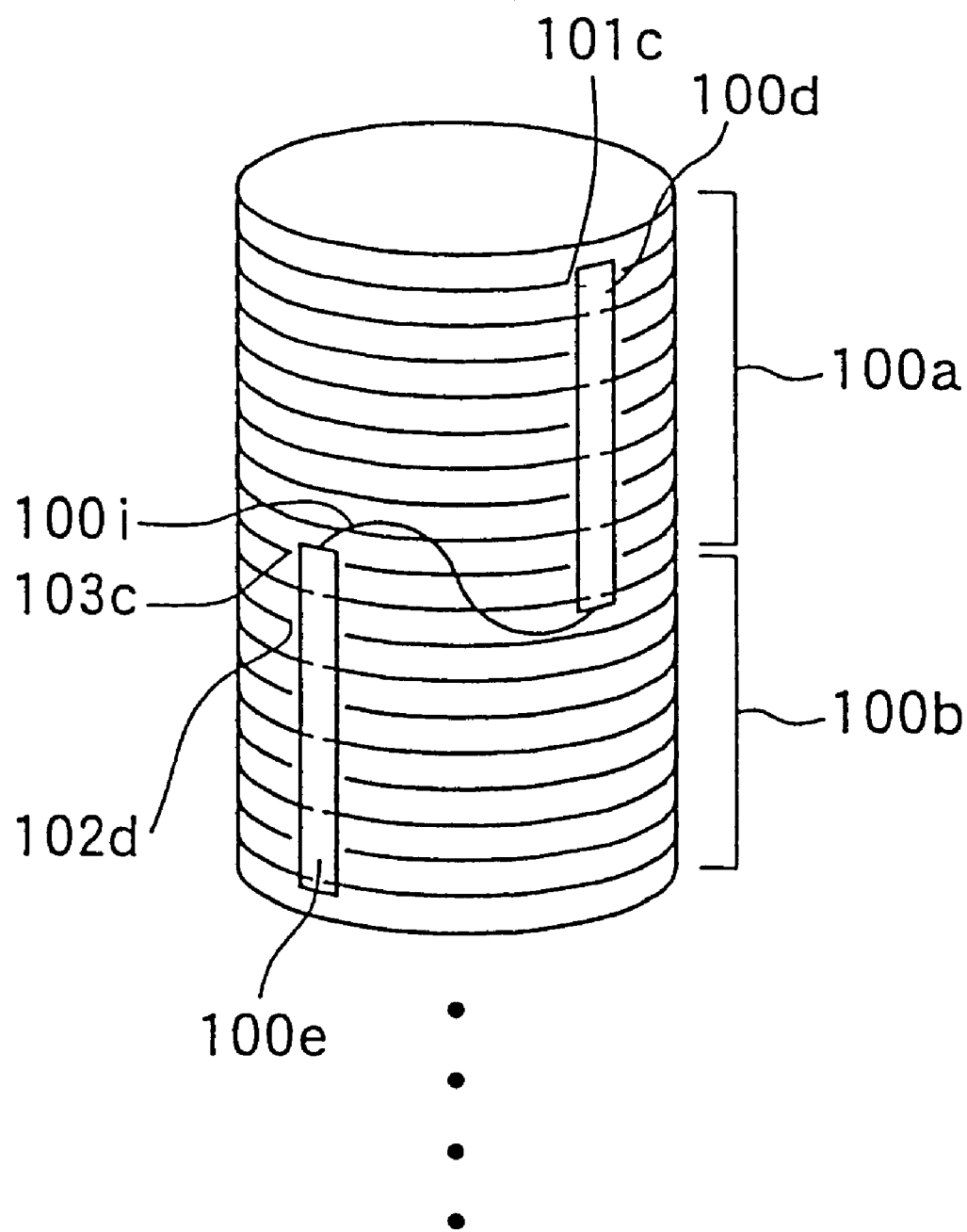
FIG. 40 is a perspective view showing a piezoelectric laminate body according to the fifteenth embodiment of the present invention.
Figure 41:
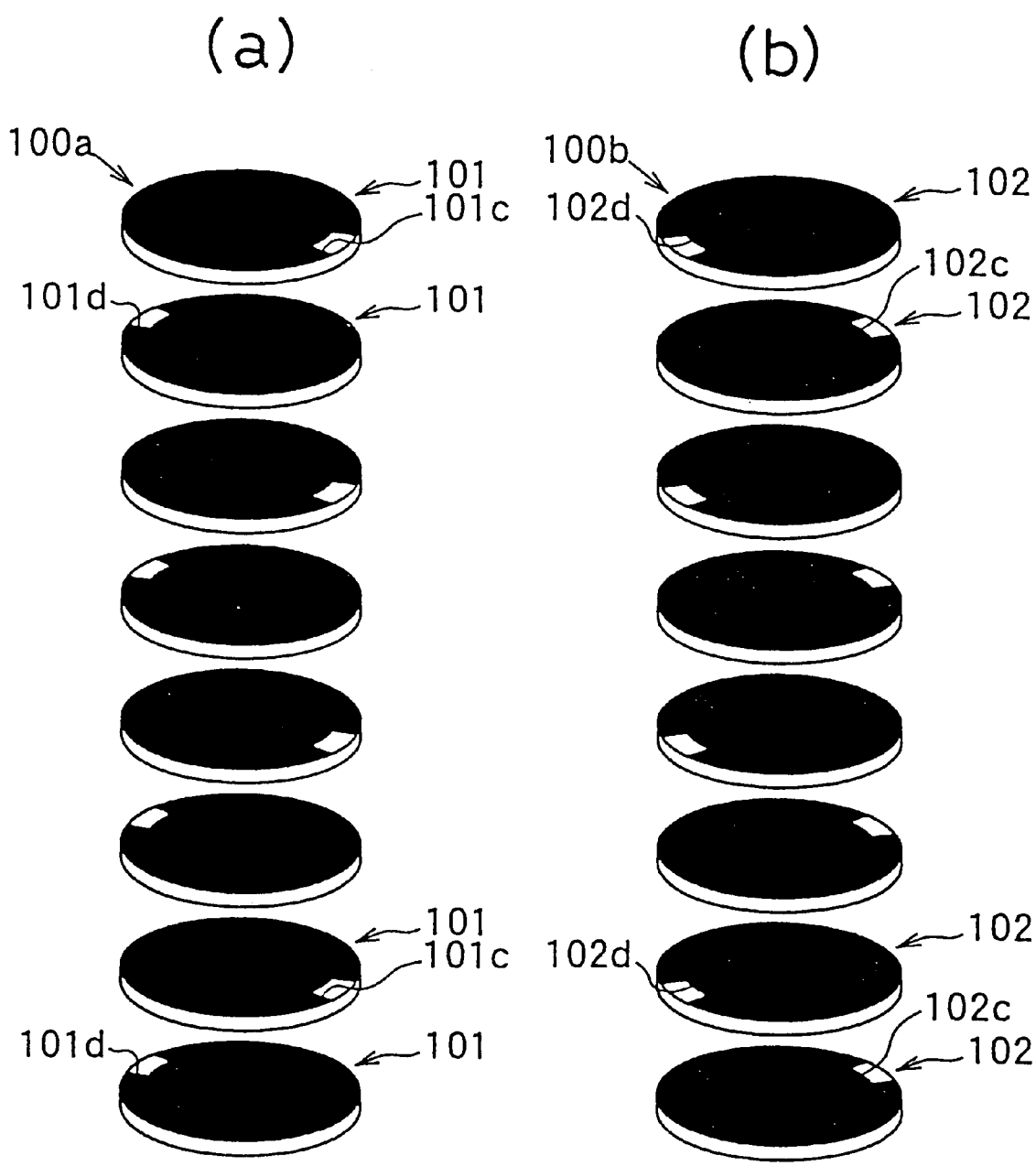
FIGS. 41(*a*) and 41(*b*) are exploded perspective views of both unit laminate bodies in the eleventh embodiment.

FIGS. 40 and 41 show the piezoelectric laminate body according to the fifteenth embodiment of the present invention. In the piezoelectric laminate body described in the fourteenth embodiment, the fifteenth embodiment does not use the inter-connection laminate bodies 100f and 100g but laminates alternately both unit laminate bodies 100a and 100b. Here, both unit laminate bodies 100a and 100b have substantially the same structure as that of both unit laminate bodies 100a and 100b described in the eleventh embodiment.

Since the inter-connection laminate bodies 100f and 100g are not used, wires 100i are connected by wire bonding between the lower end portion of the external electrode 100d of the external electrodes 100d and 100e and the upper end of the external electrode 100e just below the former and between the lower end of the external electrode 100e and the upper end of the external electrode 100d just below the former, respectively. The external electrodes on the back of the sheet of the drawing in FIG. 40 are similarly connected by wire bonding on the outer peripheral surface of the piezoelectric laminate body. The rest of the constructions are the same as the construction of the fourteenth embodiment.

The fifteenth embodiment having the construction described above employs the wires 100i in place of the external electrodes 100h of the fourteenth embodiment. Therefore, it can accomplish the same mode of operation as that of the fourteenth embodiment without relying on the inter-connection laminate bodies.

(Sixteenth Embodiment)

Figure 42:
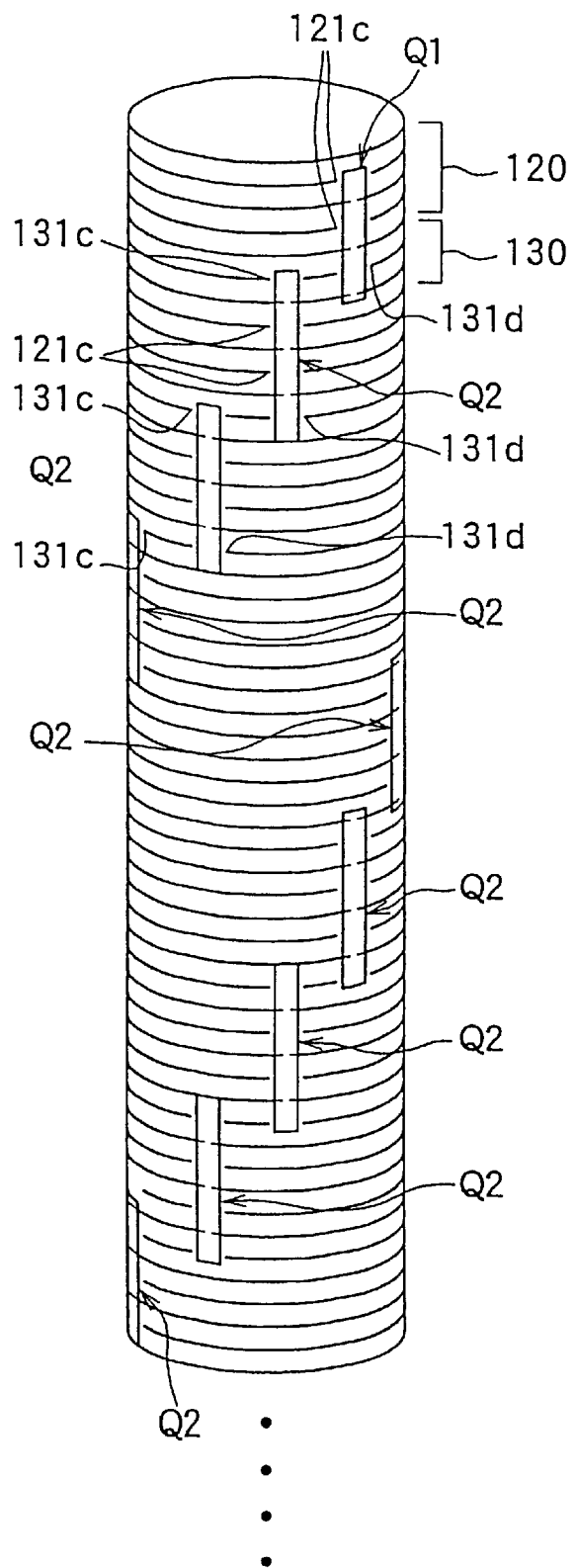
FIG. 42 is a perspective view showing a piezoelectric laminate body according to the sixteenth embodiment of the present invention.
Figure 43:
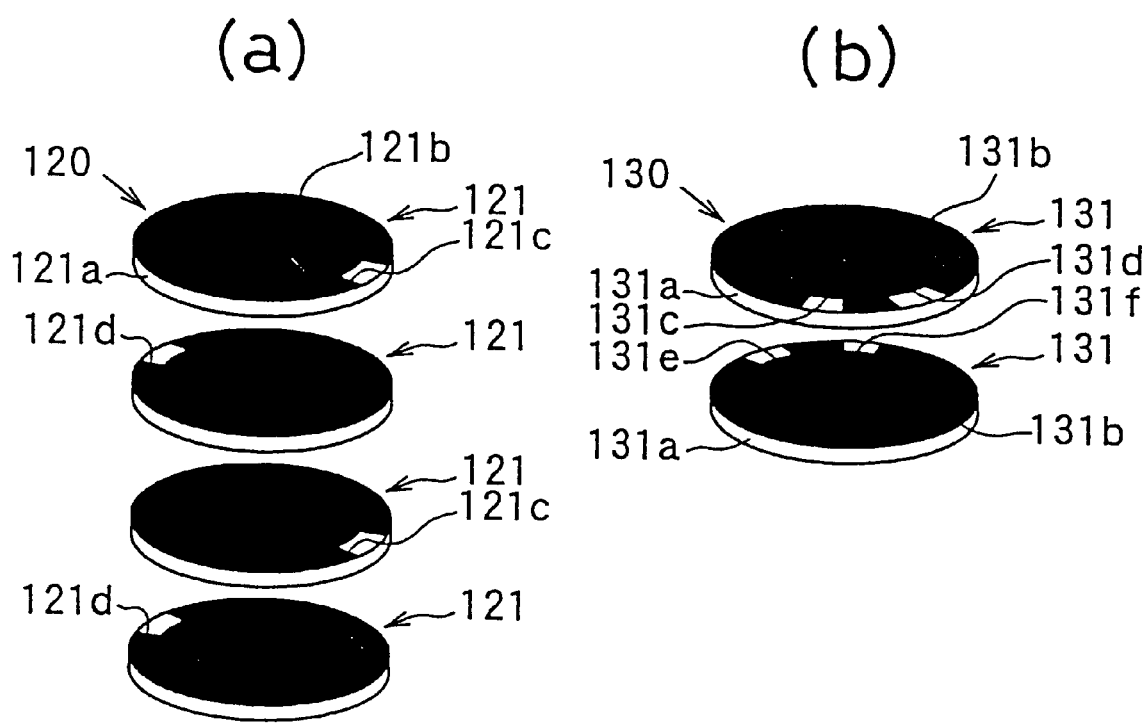
FIGS. 43(*a*) and 43(*b*) are exploded perspective views showing a unit laminate body and an inter-connection laminate body in the sixteenth embodiment.

FIGS. 42 and 43 shows the piezoelectric laminate body according to the sixteenth embodiment of the present invention. In this sixteenth embodiment, the piezoelectric laminate body has a circular cylindrical shape as shown in FIG. 42. The piezoelectric body comprises the laminate of unit laminate bodies 120 and inter-connection laminate bodies that are laminated serially and alternately.

The unit laminate body 120 has a plurality of laminate sheets 121, and each laminate sheet 121 has the same structure as the laminate sheet 101 described in the eleventh embodiment (see FIG. 33(a)). The laminate sheet 121 includes a piezoelectric device sheet 121a and an electrode layer 121b that correspond to the piezoelectric device sheet 101a and the electrode layer 101b of the laminate sheet 101, respectively. The electrode layer 121b of each odd-numbered laminate sheet 121 has a notch portion 121c corresponding to the notch portion formed in the electrode layer 101b of each odd-numbered laminate sheet 101. The electrode layer 121b of each even-numbered laminate sheet 121 has a notch portion 121d corresponding to the notch portion 101d formed in the electrode layer 101b of each even-numbered laminate sheet 101.

As shown in FIG. 43(b), the inter-connection laminate body 130 comprises the laminate of both laminate sheets 131. Each laminate sheet 131 has a piezoelectric device sheet 131a and an electrode layer 131b in substantially the same way as the inter-connection laminate body 100c described in the eleventh embodiment.

In the electrode layer 131b of the upper laminate sheet 131, both notch portions 131c and 131d are formed in the spaced-apart relation from the surface portion of the sheet of the drawing in the outer peripheral edge of the electrode layer 131b as shown in FIG. 43(b). In the electrode layer 131b in the lower laminate sheet 131, both notch portions 131e and 131f are formed in the spaced apart relation from the back side of the sheet of the drawing in the outer peripheral edge of the electrode layer 131b in such a manner as to oppose both notch portions 131c and 131d, respectively, as shown in FIG. 43(b).

When the piezoelectric laminate body is produced by lamination as shown in FIG. 42, the unit laminate bodies 120 and the inter-connection laminate bodies 130a are laminated serially and alternately. These unit laminate bodies 120 and inter-connection laminate bodies 130 are laminated so that their angular positions are deviated serially and counter-clockwise from above to below as shown in FIG. 42. The notch portion 121c of the unit laminate body 120 overlaps with the notch portion 31d of the inter-connection laminate body 130 just below the former, and the notch portion 131c of the inter-connection laminate body 130 overlaps with the notch portion of the unit laminate body 120 just below the former (see FIG. 42).

In this piezoelectric unit body, the portion corresponding to each notch portion 121c of the unit laminate body 120 and the notch portion 131d of the inter-connection laminate body 130 (hereinafter called the "alternate electrode portion Q1"), and the portion corresponding to the notch portion 131c of the inter-connection laminate body 130, each notch portion 121c of the unit laminate body 120 and the notch portion 131d of the inter-connection laminate body 130 below the former (hereinafter called the "alternate electrode portion Q2") are separated from each other position-wise serially and obliquely downward in the planar direction of the outer peripheral surface of the piezoelectric laminate body.

In the sixteenth embodiment having the construction described above, each alternate electrode portion Q1 and each alternate electrode portion Q2 are positioned separately from each other for the corresponding unit laminate body and inter-connection laminate body, respectively. When the electric field is applied to the piezoelectric laminate body from the uppermost unit laminate body to the lowermost unit laminate body in the same way as in the eleventh embodiment, the difference of the quantity of displacement occurring in the boundary between the alternate electrode portion of the unit laminate body and the center electrode portion of the unit laminate body remains a sufficiently small value that is the value for each unit laminate body. As a result, cracks do not occur, in the boundary, in the same way as in the eleventh embodiment.

In all of the foregoing embodiments of the present invention, the piezoelectric laminate body may have various shapes such as a circular cylindrical shape and a polygonal sheet shape. Therefore, the shape of the laminate sheet of each unit laminate body is not particularly limited to the rectangular flat sheet shape, but may have various shapes such as a circular sheet shape, a polygonal sheet shape, and so forth.

In the foregoing embodiments of the present invention, the positional deviation angle of the alternate electrode portion of the upper unit laminate body of the piezoelectric laminate body from the alternate electrode portion of the unit laminate body just below the former in the direction orthogonal to the laminating direction of the unit laminate bodies need not be limited to 90 degrees but may be an angle so long as both alternate electrode portions are separated from one another.

In the foregoing embodiments of the present invention, the positional deviation angle of the alternate electrode portion of the upper unit laminate body of the piezoelectric laminate body from the alternate electrode portion of the unit laminate body just below the former in the direction orthogonal to the laminating direction of the unit laminate bodies need not be limited to the angles described in each embodiment but may be 0 degree. In this case, a space is defined between the lowermost surface portion of the alternate electrode portion of the upper unit laminate body and the uppermost surface portion of the alternate electrode portion of the unit laminate body just below the former so as to separate them from one another. In this way, too, the mode of operation can be accomplished in substantially the same way as in each embodiment.

Industrial Applicability

As described above, the present invention improves the laminate structure of the piezoelectric laminate body in such a manner as to minimize the difference of the quantity of displacement that develops in the boundary between the center electrode portion of the unit laminate body and the alternate electrode portion upon the application of the electric field. Therefore, the present invention can be applied suitably to a piezoelectric actuator for driving a fuel injection valve of an engine, for example, and provides large industrial applicability.

What is claimed is:

1. A piezoelectric laminate body comprising a plurality of unit laminate bodies, each of said unit laminate bodies is an alternate electrode structure type including a center electrode portion and alternate electrode portions; said center electrode portion is a driving unit and said alternate electrode portions are a non-driving unit disposed on both sides of said center electrode portion;

wherein one said unit laminate body on the upper side among a plurality of said unit laminate bodies is laminated serially at said center electrode portion thereof in such a fashion that it is deviated, at said both-side alternate electrode portions thereof, by a predetermined angle with respect to said both-side alternate electrode portions of another said unit laminate body just below said one unit laminate body in a laminating direction while it is separated from both said alternate electrode portions of said another unit laminate body just below said one unit laminate body.

2. A piezoelectric laminate body according to claim 1, wherein predetermined angle is 90 degrees.

3. A piezoelectric laminate body according to claim 1, wherein an electrode layer is interposed between the lowermost surface of each of said center electrode portion and a one-side alternate electrode portion of said unit laminate body on the upper side and the uppermost surface of each of said center electrode portion and an other-side alternate electrode portion of said unit laminate body just below said upper unit laminate body in such a fashion as to electrically connect said one-side alternate electrode portion and said other-side alternate electrode portion through both of said center electrode portions.

4. A piezoelectric laminate body according to claim 1, wherein a one-side electrode layer is interposed between the lowermost surface portion of both of a portion of said center electrode portion in the proximity of a one-side alternate electrode portion and said one-side alternate electrode portion of said upper unit laminate body and the uppermost surface portion of both of a portion of said center electrode portion in the proximity of an other-side alternate electrode portion and said other-side alternate electrode portion of said lower unit laminate body just below said upper unit laminate body; and an other-side alternate electrode layer is interposed between the lowermost surface portion of both of a portion of said center electrode portion in the proximity of an other-side alternate electrode portion and said other-side alternate electrode portion of said upper unit laminate body and the uppermost surface portion of both of a portion of said center electrode portion in the proximity of an one-side alternate electrode portion and said one-side alternate electrode portion of said unit laminate body just below said upper unit laminate body.

* * * * *